United States Patent
Lee et al.

(10) Patent No.: US 9,401,371 B1
(45) Date of Patent: Jul. 26, 2016

(54) SACRIFICIAL SPIN-ON GLASS FOR AIR GAP FORMATION AFTER BL ISOLATION PROCESS IN SINGLE GATE VERTICAL CHANNEL 3D NAND FLASH

(71) Applicant: MACRONIX INTERNATIONAL CO., LTD., Hsinchu (TW)

(72) Inventors: Guan-Ru Lee, Kaohsiung (TW); Chiajung Chiu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/863,633

(22) Filed: Sep. 24, 2015

(51) Int. Cl.
| | |
|---|---|
| H01L 21/336 | (2006.01) |
| H01L 29/76 | (2006.01) |
| G11C 16/04 | (2006.01) |
| H01L 27/115 | (2006.01) |
| H01L 21/28 | (2006.01) |
| H01L 21/311 | (2006.01) |
| H01L 21/768 | (2006.01) |
| H01L 21/764 | (2006.01) |
| H01L 29/06 | (2006.01) |

(52) U.S. Cl.
CPC .... *H01L 27/11582* (2013.01); *H01L 21/28282* (2013.01); *H01L 21/31111* (2013.01); *H01L 21/764* (2013.01); *H01L 21/768* (2013.01); *H01L 27/1157* (2013.01); *H01L 29/0649* (2013.01)

(58) Field of Classification Search
CPC .................. H01L 21/28282; H01L 21/31111; H01L 27/11582; H01L 27/1157
USPC ....................... 257/314; 438/257; 365/185.18
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |

(Continued)

FOREIGN PATENT DOCUMENTS

EP      2048709 A2      4/2009

OTHER PUBLICATIONS

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

(Continued)

*Primary Examiner* — David S Blum
(74) *Attorney, Agent, or Firm* — Haynes Beffel & Wolfeld LLP

(57) ABSTRACT

A method for manufacturing a memory device, which can be configured as a 3D NAND flash memory, and includes a plurality of stacks of conductive strips, including even stacks and odd stacks having sidewalls. Some of the conductive strips in the stacks are configured as word lines. Data storage structures are disposed on the sidewalls of the even and odd stacks. Active pillars between corresponding even and odd stacks of conductive strips include even and odd semiconductor films connected at the bottom of the trench between the stacks, and have outside surfaces and inside surfaces. The outside surfaces contact the data storage structures on the sidewalls of the corresponding even and odd stacks forming a 3D array of memory cells; the inside surfaces are separated by an insulating structure that can include a gap. The semiconductor films can be thin-films having a U-shaped current path.

19 Claims, 33 Drawing Sheets

(56) References Cited

U.S. PATENT DOCUMENTS

| | | |
|---|---|---|
| 7,420,242 B2 | 9/2008 | Lung |
| 7,612,403 B2 | 11/2009 | Bhattacharyya |
| 7,696,559 B2 | 4/2010 | Arai et al. |
| 7,851,849 B2 | 12/2010 | Kiyotoshi |
| 8,008,732 B2 | 8/2011 | Kiyotoshi et al. |
| 8,363,476 B2 | 1/2013 | Lue et al. |
| 8,467,219 B2 | 6/2013 | Lue |
| 8,503,213 B2 | 8/2013 | Chen et al. |
| 8,648,438 B2 | 2/2014 | Cai et al. |
| 8,759,899 B1 | 6/2014 | Lue et al. |
| 8,853,818 B2 | 10/2014 | Lue |
| 9,147,468 B1 | 9/2015 | Lue |
| 9,224,473 B1* | 12/2015 | Chen ............... G11C 16/0466 |
| 2005/0280061 A1 | 12/2005 | Lee |
| 2007/0045708 A1 | 3/2007 | Lung |
| 2007/0158736 A1 | 7/2007 | Arai et al. |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2011/0018051 A1 | 1/2011 | Kim et al. |
| 2012/0068241 A1 | 3/2012 | Sakuma et al. |
| 2012/0119283 A1 | 5/2012 | Lee et al. |
| 2012/0182806 A1 | 7/2012 | Chen et al. |
| 2015/0243674 A1* | 8/2015 | Shih ............... H01L 27/11582 438/268 |
| 2015/0357342 A1* | 12/2015 | Lee ............... H01L 27/11582 257/324 |
| 2015/0371998 A1 | 12/2015 | Lue |
| 2016/0056168 A1* | 2/2016 | Lue ............... H01L 27/11582 365/185.18 |

OTHER PUBLICATIONS

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 14/637,187 entitled "Vertical Thin-Channel Memory," by Hang-Ting Lue, filed Mar. 3, 2015, 90 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

SACRIFICIAL SPIN-ON GLASS FOR AIR GAP FORMATION AFTER BL ISOLATION PROCESS IN SINGLE GATE VERTICAL CHANNEL 3D NAND FLASH

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

As critical dimensions of devices in integrated circuits shrink to the limits of common memory cell technologies, designers have been looking to techniques for stacking multiple planes of memory cells to achieve greater storage capacity, and to achieve lower costs per bit. For example, thin-film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around the cell at each layer.

Another example of a memory structure includes a vertical thin-channel memory which can be configured as a 3D NAND flash memory. Vertical thin-channel cells in the memory are arranged along vertical active pillars which comprise U-shaped semiconductor thin-films, providing a structure with semiconductor thin-films on two sides electrically separated along the length of the pillar and electrically connected at the bottom. The active pillars are disposed between stacks of conductive strips operable as word lines with memory elements in between. As a result of this structure, two memory cells are formed per frustum of the active pillar, where each memory cell at the frustum includes a channel in the semiconductor thin-film on one side of the active pillar. A gap in insulation material between opposing vertical channel films may be included to suppress interference between back-to-back channels in U-turn architecture.

Methods of manufacturing memory structures including such active pillars with vertical thin-channels and a gap in the insulation material between opposing vertical channel films may include forming a thin-film semiconductor layer over a plurality of stacks of conductive strips. This is followed by filling trenches between the thin-film semiconductor layer with an insulation material. The insulation material includes a gap which will become gaps between opposing vertical channel films. The partially formed device is then patterned and etched to form thin vertical channel films on opposing sides of the trenches. However, because the insulation material includes a gap, the deep hole etching process through the insulating material may not be uniform. This non-uniformness may cause irregular profiles and deformities of the deep holes and therefore non-uniformness in the resulting structures of the device. These irregularities and deformities are not desirable because they may result negatively on device performance.

It is therefore desirable to provide a method of manufacturing memory structures including active pillars with vertical thin-channels and a gap in the insulation material between opposing vertical channel films where the vertical channel films are formed without irregularities.

SUMMARY

A method of manufacture of a vertical thin-channel memory is described, where the thin-channel memory can be configured as a 3D NAND flash memory. Vertical thin-channel cells in the memory are arranged along vertical active pillars which comprise U-shaped semiconductor thin-films, providing a structure with semiconductor thin-films on two sides electrically separated along the length of the pillar and electrically connected at the bottom. The active pillars are disposed between stacks of conductive strips operable as word lines with memory elements in between. As a result of this structure, two memory cells are formed per frustum of the active pillar, where each memory cell at the frustum includes a channel in the semiconductor thin-film on one side of the active pillar. The array can be configured, in addition, for multiple-bit-per-site operation. A NAND string of series connected memory cells can be provided that includes the memory cells along the U-shaped path of a single active pillar. The method of manufacture includes forming steps which improve the regularity of the profiles and reduce deformities of deep holes created for the formation of the U-shaped semiconductor films.

In an example described herein, the memory device comprises a plurality of stacks of conductive strips, the plurality of stacks including even stacks and odd stacks. A plurality of active pillars comprising U-shaped semiconductor thin-films, arranged between corresponding even and odd stacks of conductive strips in the plurality of stacks, defines a multilayer array of interface regions at cross-points between opposing side surfaces of the active pillars and conductive strips in the corresponding even and odd stacks of conductive strips. The active pillars can include a first vertical channel structure including first and second vertical channel films electrically connected at the bottom. The active pillars can further include a second vertical channel structure including third and fourth vertical channel films electrically connected at the bottom. The vertical channel films including outside surfaces and inside surfaces along the length of the active pillars, the outside surfaces disposed on the data storage structures on the sidewalls of the first and second stacks. An insulating structure can be present between the stacks separating the vertical channel films of the first and second vertical channel structures. The insulating structure can include a first portion separating the first and second vertical channel films, and a second portion separating the third of fourth vertical channel films. The insulating structure can further include a third portion joining the first and second portions. One or more of the portions of the insulating structure can include an air gap. For example, the first, second and third portions of the insulating structure can include a first, second and third air gap, respectively. Further, the first, second and third air gaps can be contiguous. The vertical channel films can be thin-film semiconductor material, where the term thin-film for the purposes of this application means 10 nanometers or less thick. The thickness of the thin-film provides for improved performance by suppressing the short channel effect for the memory cells. Also, the thin-film enables uniform channel thicknesses less dependent on the level of the memory cell than prior approaches. Also, the structure provides for channel length dimensions which are determined by the thickness of the conductive strips rather than on an etched layout pattern. This enables very short and uniform channel lengths for the memory cells. In combination with the short channel, and the improved short channel performance provided by the thin-channel film, high density, high performance memory can be achieved.

A 3D array of U-shaped NAND strings comprising series connected even and odd memory cells is described. Even memory cells are disposed in the interface regions accessible via the active pillars and conductive strips in the even stacks of conductive strips. Odd memory cells are disposed in the interface regions accessible via the active pillars and conductive strips in the odd stacks of conductive strips. A top frustum of the active pillar includes a first switch on the odd side controlled by a signal on a top strip in the odd stack, and a second switch on the even side controlled by a signal on a top strip in the even stack. The first switch (e.g. GSL) can be used to connect the NAND string to a common source line, or other reference line, and the second switch (e.g. SSL) can be used to connect the NAND string to a bit line, or other line coupled to sensing circuitry. Control circuitry is configured to apply different bias voltages to the even and odd conductive strips, and can be configured to execute a program operation by which one, or more than one, bit of data can be stored in both the even memory cell and odd memory cell in a given frustum of a selected active strip.

The conductive strips in intermediate levels in the even and odd stacks can be configured as word lines for respective ones of the first and second parts of the U-shaped NAND string on a given active pillar. The conductive strips in a lower level in the even and odd stacks can be configured as inversion assist gate lines to improve conductivity of the semiconductor thin-films in the bottom of a pillar.

The plurality of stacks of conductive strips are arranged in blocks and, in a given block, conductive strips in a given layer of an odd stack can be configured in a comb-like structure with strips extending from an odd pad, and conductive strips in a given layer of an even stack can be configured in a comb-like structure with strips extending from an even pad, the conductive strips extending from the odd and even pads in the given block being interdigitated.

Methods for manufacturing memory devices as described herein are also provided. In one aspect, a method for manufacturing includes forming a thin-film semiconductor layer over a plurality of stacks of conductive strips, including on the sidewalls of trenches between the stacks. This step is followed by filling the trenches between portions of the thin-film semiconductor layer with a material with good fill in properties and capable of being etched selectively compared to the memory layer oxide layers. This material may be a flowable dielectric material, for example "spin-on glass" (herein after SOG) such as commercially available siloxane polymer based materials, like Allied-Signal product numbers 512, 214 and 314. After depositing and curing the flowable dielectric material, the partially formed device is then patterned and etched to form thin vertical channel films on opposing sides of the trenches. Due to the good fill in properties of the flowable dielectric material, the deep hole etching process through the flowable dielectric material is very uniform. This uniformness is beneficial because of the uniformness of the resulting structures of the device. The flowable dielectric material is then removed with a selective etching process which results in little to no removal or damage to memory oxide layers between the stacks and the vertical channel films, formed from the thin-film semiconductor layer material. The removal of the flowable dielectric material is followed by forming an insulating dielectric structure which includes a gap between opposing vertical channel films. The gap between opposing vertical channel films is beneficial in the finished device to suppress interference between back-to-back channels in U-turn architecture. In one aspect of the technology, a memory device including a plurality of memory cells comprises a plurality of stacks of conductive strips having sidewalls, the first plurality of stacks including a plurality of layers of conductive material separated by layers of insulating material, the plurality of stacks defining a first trench and a second trench, each of the first trench and the second trench positioned between opposite sidewalls of adjacent stacks of the plurality of stacks.

The first trench and the second trench each includes: data storage structures on both of the opposite sidewalls of the conductive strips in the adjacent stacks; a first series of vertical channel films on the data storage structures on a first one of the opposite sidewalls, wherein adjacent ones of the first series of vertical channel films are separated by a first series of air gaps; and a second series of vertical channel films on the data storage structures on a second one of the opposite sidewalls, wherein adjacent first series of the second series of vertical channel films are separated by a second series of air gaps.

A third series of air gaps separate the first series of vertical channel films and the second series of vertical channel films. The first series of air gaps, the second series of air gaps, and the third series of air gaps are contiguous.

The first series and the second series of vertical channel films in the first trench are staggered with respect to the first series and the second series of vertical channel films in the second trench.

In one embodiment of the technology, the first series and the second series of vertical channel films in the first trench are staggered with respect to the first series and the second series of vertical channel films in the second trench, such that the first series and the second series of vertical channel films in the first trench are at least partly aligned with the first series of air gaps and the second series of air gaps in the second trench.

In one embodiment of the technology, the first series and the second series of vertical channel films in the first trench are staggered with respect to the first series and the second series of vertical channel films in the second trench, such that the third series of air gaps in the first trench are at least partly aligned with the first series of air gaps and the second series of air gaps in the second trench.

In one embodiment of the technology, the plurality of stacks define alternating even and odd trenches, the even trenches characterized by the first trench, and the odd trenches characterized by the second trench.

In one embodiment of the technology, the vertical channel films have upper ends with pads, and distal ends connected to an adjacent one of the vertical channel films to form current paths one of the upper ends of a one of the vertical channel films to another of the upper ends of the adjacent one of the vertical channel films.

One embodiment of the technology further includes one or more patterned conductor layers over the plurality of stacks, including a bit line and a source line, and interlayer connectors connecting the bit line to a first pad over a first stack of the plurality of stacks, and connecting the source line to a second pad over a second stack of the plurality of stacks.

One embodiment of the technology further includes an insulating layer below the plurality of stacks, wherein the vertical channel films are connected above the insulating layer at the bottom of the plurality of stacks.

In one embodiment of the technology, the vertical channel films have thicknesses less than 10 nanometers.

In one embodiment of the technology, the vertical channel films are channels of respective NAND strings with NAND device word lines in respective stacks of conductive strips.

In one aspect of the technology, a manufacturing method includes:

forming first and second stacks of conductive strips having sidewalls, the stacks including a plurality of layers of conductive material separated by layers of insulating material, and the first and second stack separated by a trench;

forming a memory layer over the sidewalls of the first and second stacks and having an outside surface disposed on the first and second stacks and an inside surface opposite the outside surface;

forming a layer of semiconductor material over the memory layer, the layer of semiconductor material having an outside surface disposed on the inside surface of the memory layer and an inside surface opposite the outside surface of the layer of semiconductor material;

forming a first dielectric material, the first dielectric material contacting the inside surface of the layer of semiconductor material and filling the trench, lined by the memory layer and the layer of semiconductor material, between the first and second stacks;

after forming the first and the second stacks of conductive strips, the memory layer, the layer of semiconductor material, and the first dielectric material:

etching a first pattern through the first dielectric material, the layer of semiconductor material, and the memory layer, wherein (i) the first pattern defines a first vertical channel film from a first portion of the layer of semiconductor material adjacent to a first portion of the memory layer contacting the first stack by removing parts of the first portion of the layer of semiconductor material on opposite sides of the first vertical channel film, (ii) the first pattern defines a second vertical channel film from a second portion of the layer of semiconductor material adjacent to a second portion of the memory layer contacting the second stack by removing parts of the second portion of the layer of semiconductor material on opposite sides of the second vertical channel film, and (iii) the first pattern leaves the first dielectric material in between the first vertical channel film and the second vertical channel film; and after etching the first pattern, removing the first dielectric material in between the first vertical channel film and the second vertical channel film.

One embodiment of the technology further comprises removing the first dielectric material after said etching the pattern, wherein the first dielectric material is a flowable dielectric material.

In one embodiment of the technology, removing the first dielectric material includes a selective etching process, wherein the selective etching process has a selectivity for the first dielectric material compared to the memory layer.

One embodiment of the technology further comprises forming a second dielectric material between the first and second vertical channel films, including leaving a gap between the first and second vertical channel films.

In one embodiment of the technology, the memory layer over the sidewalls of the first and second stacks form data storage structures between the sidewalls, of the first and second stacks, and the first and second vertical channel films.

In one embodiment of the technology, the first vertical channel film includes a first pad over the first stack on an upper end of the first vertical channel film, and the second vertical channel film includes a second pad over the second stack on an upper end of the second vertical channel film, the first and second vertical channel films being connected at ends distal to the pads to form a current path from the pad over the first stack to the pad over the second stack.

One embodiment of the technology further comprises forming one or more patterned conductor layers over the first and second stacks, including a bit line and a source line, and interlayer connectors connecting the bit line to the first pad over the first stack and connecting the source line to the second pad over the second stack.

One embodiment of the technology further comprises before forming the first and second stacks, forming an insulating layer below the first and second stacks, and wherein the first and second vertical channel films are connected across the insulating layer at the bottom of the stacks.

In one embodiment of the technology, the first and second vertical channel films have thicknesses less than 10 nanometers.

One embodiment of the technology further comprises:

wherein forming first and second stacks of conductive strips further includes forming a third stack of conductive strips, the second and third stack separated by a second trench;

wherein forming one or more layers of dielectric material over the sidewalls of the first and second stacks, further includes forming the one or more layers of dielectric material over the sidewalls of the third stack;

wherein forming the first dielectric material further includes the first dielectric material contacting the inside surface of the layer of semiconductor material and filling the second trench, lined by the memory layer and layer of semiconductor material, between the second and third stacks; and wherein etching the pattern, through the first dielectric material, the layer of semiconductor, and dielectric material layer, further includes forming a honeycomb arrangement of vertical channel structures between the first and second stacks, and second and third stacks, so that each row of vertical channel structures is offset in the row direction from adjacent rows.

Other aspects and advantages of the present invention can be seen on review of the drawings, the detailed description and the claims, which follow.

DETAILED DESCRIPTION

A detailed description of embodiments of the present invention is provided with reference to the FIGS. 1-27.

Figure 1:
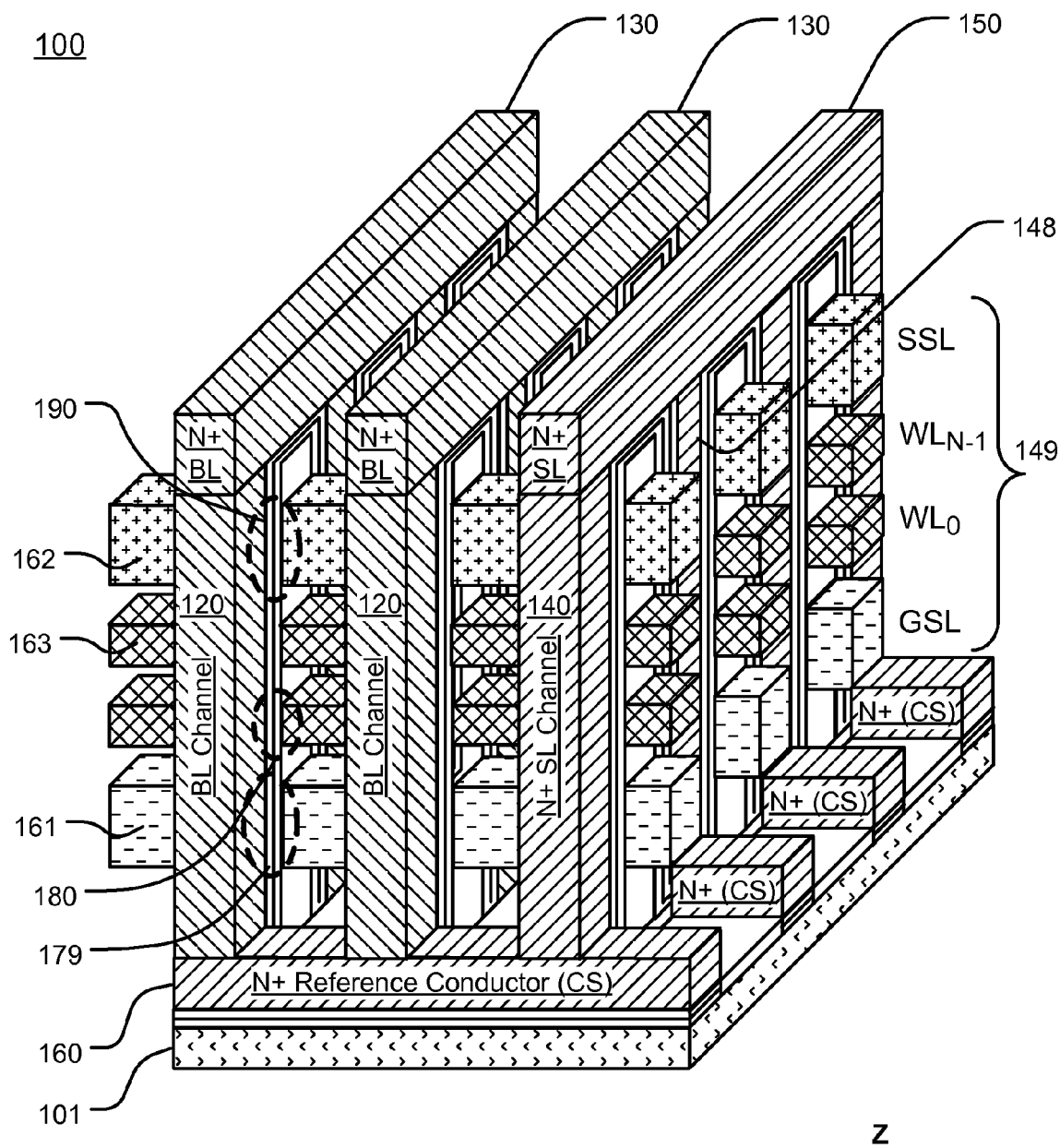
FIG. 1 is a simplified perspective diagram of a 3D memory device including vertical channel structures.

FIG. 1 is a schematic diagram of a three-dimensional 3D memory device 100 having an independent double gate structure according to a 3D vertical channel technology having a structure as described in co-pending U.S. patent application Ser. No. 14/471,788, filed on 28 Aug. 2014, [MXIC 2092-2] which application is incorporated by reference as if fully set forth herein.

The memory device 100 includes an array of NAND strings of memory cells, configured in an independent double gate vertical channel memory array (IDGVC) with two NAND strings per vertical channel, and suitable for multiple-bit-per-cell data storage. The memory device 100 includes an integrated circuit substrate, and a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 1, a stack 149 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on. Adjacent even word lines WLi and odd word lines WLi+1 are connected to separate bias circuits (not shown), so that two charge storage sites at the frustum of each vertical channel structure between the adjacent word lines can be separately accessed and used for data storage. This arrangement of independent word lines can be implemented for example by connecting even word lines to a first bias structure, and odd word lines to a separate bias structure, examples of which are described below.

The conductive strips acting as word lines, string select lines and ground select lines can comprise a variety materials including doped semiconductors, metals, and conductive compounds, including materials comprising Si, Ge, SiGe, SiC, TiN, TaN, W, and Pt.

Vertical channel structures (e.g. 120) are a part of a bit line structure in the memory device, and can comprise semiconductor materials adapted to act as channels for the memory cells, such materials as Si, Ge, SiGe, GaAs, SiC, and graphene.

In the illustrated example, the plurality of bit line structures are arranged orthogonally over, and have surfaces conformal with, the plurality of stacks, including inter-stack semiconductor body elements acting as vertical channel structures 120, between the stacks and linking elements 130 over the stacks connecting the inter-stack vertical channel structures 120. The linking elements 130 in this example comprise a semiconductor, such as polysilicon, having a relatively high doping concentration so that they have higher conductivity than the inter-stack vertical channel structures 120, which are configured to provide channel regions for the cells in the stacks. In alternative implementations, the linking elements can be part of overlying patterned metal layers, connected to the vertical channel structures by interlayer connectors or plugs.

The memory device includes memory layers, such as data storage structures, in interface regions at cross-points 180 between side surfaces of the even and odd conductive strips in the plurality of intermediate planes (WLs) in the stacks and the inter-stack vertical channel structures 120 of the plurality of bit line structures.

The memory layer can include a multilayer data storage structure, known from flash memory technologies, including for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon). In other embodiments, the memory layer can be a dielectric charge trapping structure like that shown in FIG. 25 below, as described in our co-pending, and commonly owned, U.S. patent application Ser. No. 14/309,622, entitled BANDGAP-ENGINEERED MEMORY WITH MULTIPLE CHARGE TRAPPING LAYERS STORING CHARGE, by H. T. Lue, which application is incorporated by reference as if fully set forth herein.

In a representative device, the dielectric layer 115 of memory material can include a bandgap engineered composite tunneling dielectric layer comprising a layer of silicon dioxide less than 2 nm thick, a layer of silicon nitride less than 3 nm thick, and a layer of silicon dioxide less than 4 nm thick. In one embodiment, the composite tunneling dielectric layer consists of an ultrathin silicon oxide layer $O_1$ (e.g. <=15 Å), an ultrathin silicon nitride layer $N_1$ (e.g. <=30 Å) and an ultrathin silicon oxide layer $O_2$ (e.g. <=35 Å), which results in an increase in the valence band energy level of about 2.6 eV at an offset 15 Å or less from the interface with the semiconductor body. The $O_2$ layer separates the $N_1$ layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the $O_2$ layer does not significantly interfere with the electric field assisted hole tunneling, while improving the ability of the engineered tunneling dielectric to block leakage during low fields. These layers can be conformally deposited using for example LPCVD.

A charge trapping layer in the layer 115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 115 of memory material in this embodiment comprises a layer of silicon dioxide having a thickness greater than 50 Å, including for example about 90 Å in this embodiment, and can be formed by LPCVD or other wet conversion from the nitride by a wet furnace oxidation process. Other blocking dielectrics can include high-κ materials like aluminum oxide.

The deposition techniques applied to form these layers of BE-SONOS ONO films and channel material can be carried out by conventional LPCVD processes. On the other hand, tools such as atomic layer deposition ALD tools can be utilized for these films. The gate dielectric layer in the regions of the SSL and GSL layers can have a different composition than the memory layer.

The combination of a vertical channel structure and its data storage structures is referred to herein as an active pillar (e.g., active pillar 148). In the illustrated example, the memory cells in the cross-points 180 are configured in vertical NAND strings. In this configuration, two separate NAND strings are established on the opposing sides of a single inter-stack vertical channel structure. The two separate NAND strings can be operated independently for single-bit-per-cell or multiple-bit-per-cell, read, erase and program operations.

In the illustrated example, a reference conductor 160 is disposed between the bottom plane (GSL) of conductive strips and the integrated circuit substrate (not shown). At least one reference line structure is arranged orthogonally over the plurality of stacks, including inter-stack vertical conductive elements 140 between the stacks in electrical communication with the reference conductor 160, and linking contact pads 150 over the stacks (e.g. 149) connecting the inter-stack vertical conductive elements 140. The inter-stack vertical conductive elements 140 can be formed using the same material as the vertical channel structures 120, or can alternatively be formed using a material that provides a higher conductivity than the inter-stack vertical channel structures 120.

In the structure shown in FIG. 1, a string select line (e.g. 162) is disposed on each side of each active pillar (e.g. 148). Also, word lines (e.g. 163) are disposed on each side of each active pillar (e.g. 148). In addition, ground select lines (e.g. 161) are disposed on each side of each active pillar (e.g. 148).

The memory device includes string select switches 190 at interface regions with the top plane, or an upper level, of conductive strips, and reference select switches 179 at interface regions with the bottom plane (GSL) of conductive strips. The dielectric layers of the data storage structure can act as gate dielectric layers for the switches 179, 190 in some examples.

The memory device includes a first overlying patterned conductor layer (not shown) connected to the plurality of bit line structures, including a plurality of global bit lines coupled to sensing circuits. The memory device also includes a second overlying patterned conductor layer (not shown), which can be patterned, and can be above or below the first patterned conductor layer. The second overlying patterned conductor layer is connected to the at least one reference line structure, such as by contact to the linking contact pad 150. The second patterned conductor layer can connect the at least one reference line structure to a reference voltage source, or to circuitry for providing a reference voltage.

In the example shown in FIG. 1, the linking elements 130 of the bit line structures include N+ doped semiconductor material. The inter-stack vertical channel structures 120 of the bit line structures include undoped or lightly doped semiconductor material suitable for acting as channels. In the example shown in FIG. 1, the reference conductor 160 includes N+ doped semiconductor material, and the linking contact pads 150 of the at least one reference line structure include N+ doped semiconductor material. The inter-stack vertical conductive elements 140 of the at least one reference line structure also include N+ doped semiconductor material. In alternative implementations a metal or metal compound can be used in place of the doped semiconductors.

In one embodiment, in order to reduce the resistance of the reference conductor 160, the memory device can include a bottom gate 101 near the reference conductor 160. During read operations, the bottom gate 101 can be turned on by a suitable pass voltage applied to an underlying doped well or wells in the substrate, or other underlying patterned conductor structures, to increase the conductivity of the reference conductor 160.

Figure 1A:
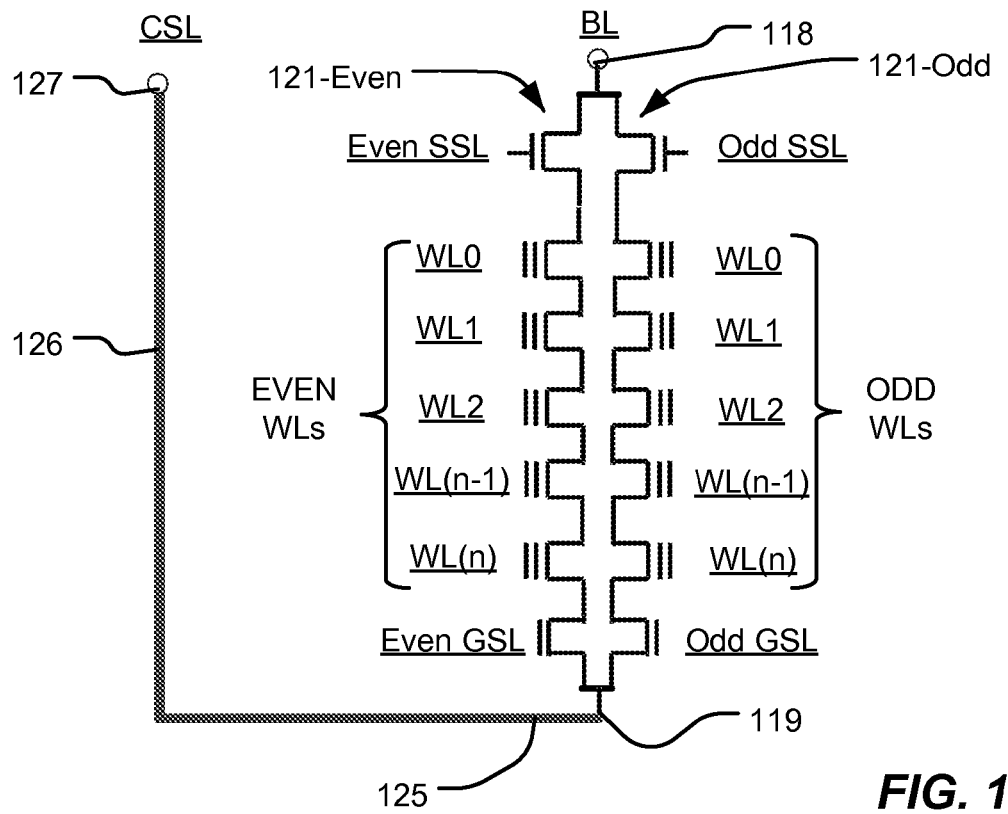
FIG. 1A is a schematic circuit diagram of NAND strings on a single active pillar in the structure of FIG. 1.

FIG. 1A is a circuit schematic of a single active pillar in the structure of FIG. 1, showing NAND strings on each side of the pillar. The active pillar extends from a bit line contact 118 (e.g., a connection to element 130 in FIG. 1) to a source line contact 119 (e.g. a connection to the conductor 160 in FIG. 1). The source line contact 119 connects the active pillar to a reference line 125, corresponding to the conductor 160 in FIG. 1. The reference line 125 is connected to an interlayer conductor 126 to a contact 127 for a patterned conductor which can act as a common source line CSL for the NAND array. As illustrated, the active pillar between contacts 118 and 119 includes an even NAND string 121-Even and an odd NAND string 121-Odd. The pillar is disposed between even and odd stacks of conductors, where an upper level in the even stack includes an even string select line and an upper level in the odd stack includes an odd string select line. Intermediate levels in the stack include even and odd word lines WL0 to WL(n) for respective even and odd NAND strings. A lower level in the stack includes an even ground select line GSL and an odd ground select line GSL.

Figure 2:
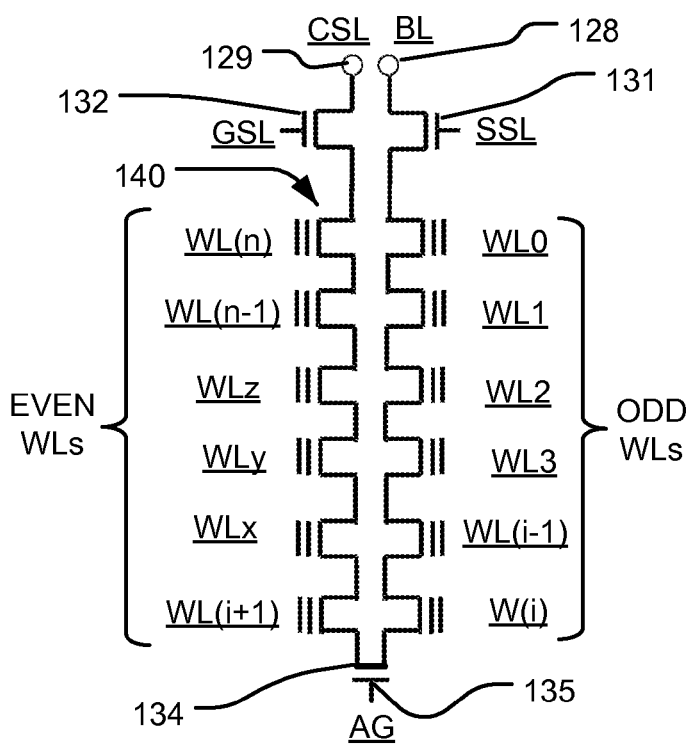
FIG. 2 is a schematic circuit diagram of a U-shaped NAND string on a single active pillar in a structure as described herein.

A memory structure is described herein, in which each active pillar provides thin-channel structures for the memory cells in a U-shaped NAND string. A circuit schematic for a U-shaped NAND string in a single active pillar is shown in FIG. 2. The U-shaped NAND string is connected between a bit line contact 128 and a common source line contact 129. The active pillar is disposed between even and odd stacks of conductors, where an upper level in the odd stack in this example includes a string select line which acts as a gate for a first switch 131 in the NAND string, and an upper level in the even stack includes a ground select line which acts as a gate for a second switch 132 in the same NAND string. Intermediate levels in the stack include even and odd word lines, where the odd word lines include word line WL0 to word line WL(i), and the even word lines include word line WL(i+1) to word line WL(n). At the bottom 134 of the stack, the semiconductor thin-films providing the thin-channel structures are electrically connected, such as being formed by a single continuous thin-film which lines the space between the stacks of conductive strips. In the illustrated embodiment, an assist gate structure 135 is included which is coupled by a gate dielectric to the semiconductor thin-film in the bottom of the stack. The assist gate structure 135 can be used to induce an inversion region that improves the conductivity of the strip between the even and odd sides. This assist gate can be implemented using a doped region in the substrate beneath the active pillars, or using other techniques. The U-shaped strings comprise series connected even memory cells disposed on the side of the even stack and odd memory cells disposed on the side of the odd stack.

Figure 2A:
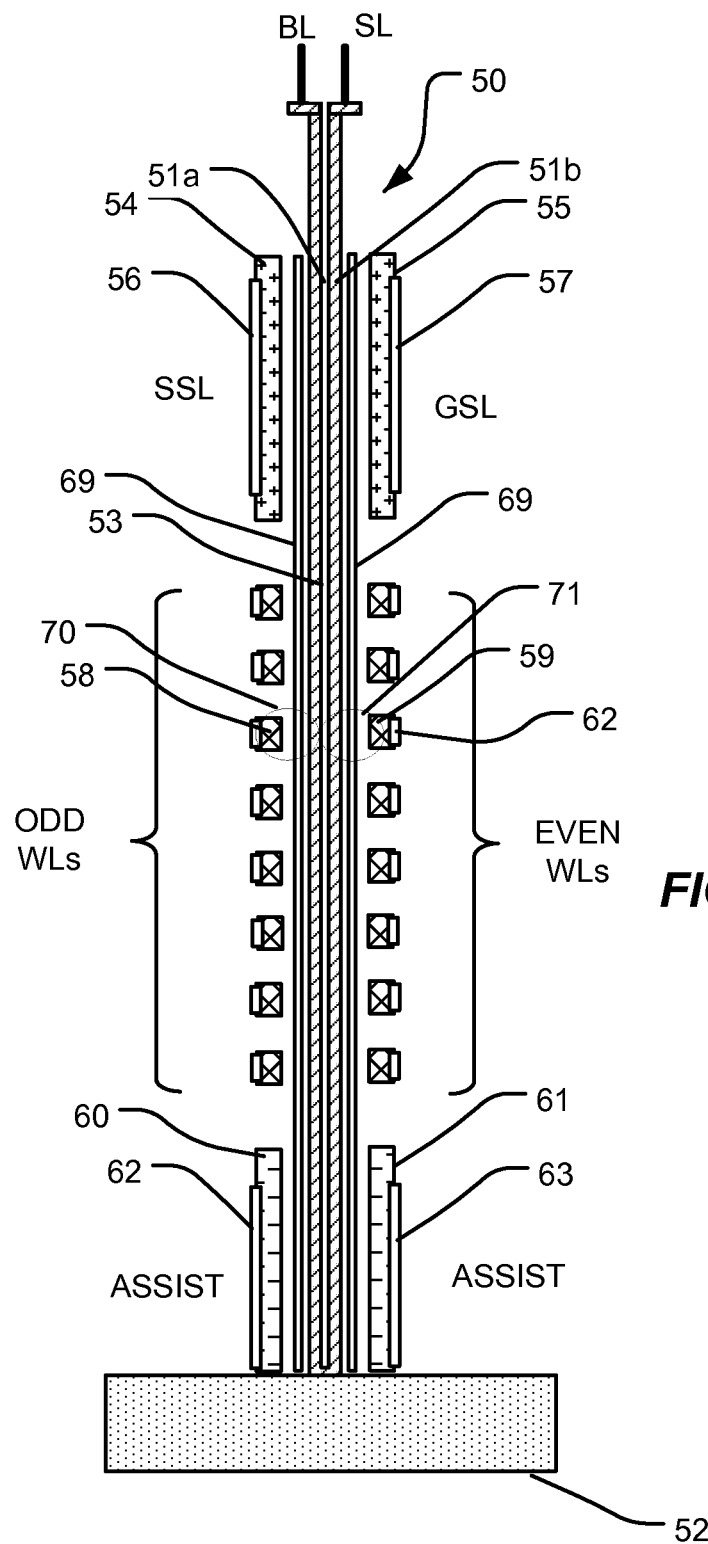
FIG. 2A is a heuristic cross-section of an active pillar with a U-shaped vertical channel film in a 3D memory device.

FIG. 2A is a cross-section of an active pillar which can be used to implement the U-shaped NAND string shown in FIG. 2. The active pillar in FIG. 2A includes a vertical channel structure 50, which includes a vertical polysilicon semiconductor body, including even and odd thin-channel films separated by a seam 53 along the length of the pillar, and is electrically connected at the bottom of the pillar. A charge storage element 69 is disposed on each side of the pillar. The vertical channel structure 50 includes a portion 51a providing a channel body for a string select line transistor on one side and a portion 51b providing a channel body for a ground select line transistor on the other side. Between the portions 51a, 51b and the bottom of the vertical channel structure, the seam 53 is disposed within the vertical channel structure 50 between the even and odd word lines. The seam 53 in some embodiments separates the two separate thin-channel bodies at the frustum of the column (e.g. at the level of word lines 58 and 59) at which the word lines cross. Also the seam 53 divides the vertical channel structure into separate thin vertical channels which extend through the SSL and GSL gates.

FIG. 2A illustrates conductive strips 54 and 55 configured as a string select line and a ground select line, respectively, both in the upper level of the stacks of conductive strips. The select line conductive strips 54 and 55 can include a more highly conductive film 56, 57 on the outside surfaces, such as a film of a metal silicide.

FIG. 2A also illustrates assist gate lines 60 and 61 which can be implemented as conductive strips in the stacks including the word lines. The assist gate lines 60, 61 can include more highly conductive films 62, 63 on the outside surfaces, such as a film of metal silicide.

Likewise, conductive strips are disposed as even and odd word lines on opposing sides of the vertical channel structure 50. Thus, an even word line 59 is disposed opposite an odd word line 58 in the structure. Eight word line layers are illustrated in this example. Of course, a larger number of word line layers, such as 16, 32, or more can be utilized.

As illustrated in FIG. 2A, word lines may also include silicide films or other more highly conductive films (e.g. 62) on the outside surfaces.

In other embodiments, all or some of the string select lines, word lines and ground select lines are implemented using metal, or other conductive material, rather than polysilicon.

The structure illustrated in FIG. 2A provides memory cells 70, 71 having independent charge storage sites on the odd and even sides of the vertical channel structure 50. Also, the structure supports operating a single U-shaped NAND string extending along the opposing sides of the vertical channel structure 50.

In the illustration of FIG. 2A, the thickness in the vertical dimension of the word lines, the string select lines and the ground select lines determines the channel lengths of the string select transistor, the memory cells, and the ground select transistors.

The string and ground select line conductive strips 54, 55 in the structure of FIG. 2A have substantially greater thickness than the word line conductive strips, such as more than four times the thickness. This greater channel length facilitates operating the string select transistor using a bias voltage on one side of the vertical channel structure which is sufficient to turn off the transistor, even when the bias voltage on the opposite side might otherwise be sufficient to turn it on.

The assist gate lines 60, 61 in the structure illustrated in FIG. 2A also have substantially greater thickness than the word lines. This facilitates conductivity of the NAND string in the region of the U-turn. The assist gate lines 60, 61 shown in FIG. 3 extend over an insulating layer 52 of a substrate.

A reference line structure, such as a line in a patterned metal layer, can be arranged orthogonally over the even and odd stacks of conductive strips and connected to the active pillar at the contact SL. A bit line structure, such as a line in a patterned metal layer, can be arranged orthogonally over the even and odd stacks of conductive strips and connected to the active pillar at the contact BL. The bit line structure and the reference line structure can be disposed in the same patterned conductor layer or different patterned conductor layers.

The active pillar comprises a vertical channel structure including a seam at the intermediate levels, and at the upper level where the string and ground select transistors are disposed. The channels in the memory cells 70 and 71 are respective thin-films of semiconductor material separated by a gap which acts as an insulating structure, or as part of an insulating structure between the thin-films. The gap encloses gas, such as gas from the atmosphere in the chamber during formation, which can be called "air" for the purposes of this description.

Figure 3:
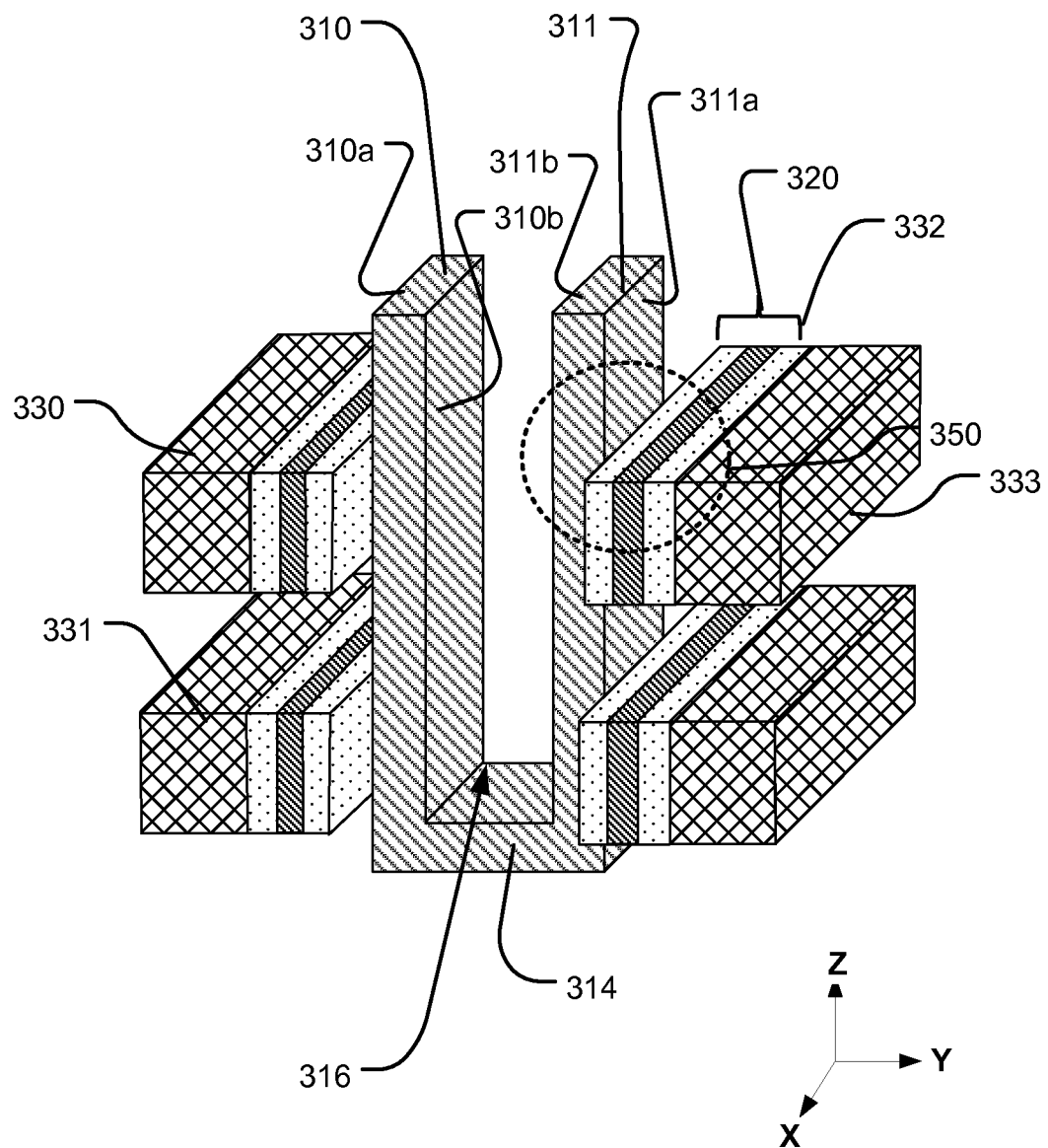
FIG. 3 is a perspective view of a lower section of a U-shaped vertical channel film in a 3D memory device.

FIG. 3 illustrates aspects of one embodiment of a memory structure as described herein. The embodiment illustrated in FIG. 13 includes a vertical channel structure comprising a semiconductor film 310 and a semiconductor film 311 having outside surfaces 310a, 311a and inside surfaces 310b, 311b and connected in region 314 across the bottom of the pillar to form a U-shaped film. The outside surfaces 310a, 311a are disposed on data storage structures (e.g. 320) on the sidewalls of corresponding stacks of semiconductor strips. Thus, an even side stack of semiconductor strips includes strip 330 and strip 331 in this illustration, which can be configured as word lines. An odd side stack of semiconductor strips includes strip 332 and strip 333 in this illustration which can be configured as word lines. Memory cells (e.g. 350) in the structure reside at the cross-points of the semiconductor films 310, 311 and the semiconductor strips 330, 331, 332, 333.

The semiconductor films 310, 311 are separated by a gap 316, or other type of insulating structure, at least in the regions of the memory cells.

The semiconductor films are preferably thin-films, having thicknesses in the regions of the memory cells 10 nm or less.

Figure 4:
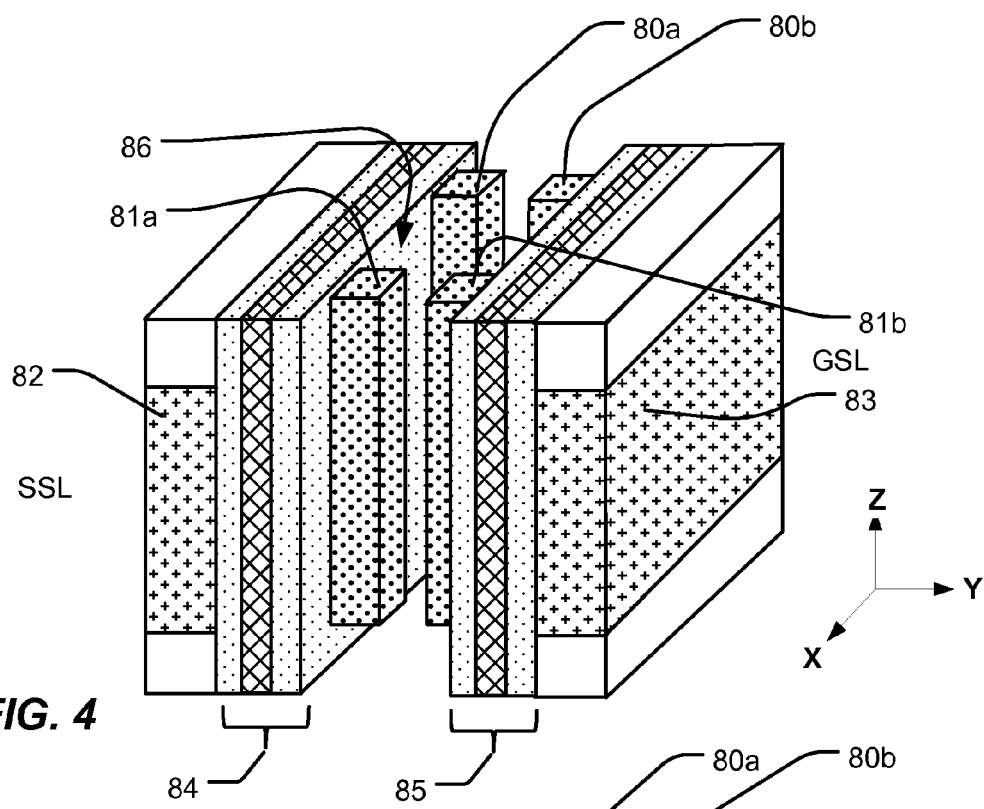
FIG. 4 is a perspective view of a string select transistor structure for an active pillar in a 3D memory device, like that of FIG. 2.

FIG. 4 illustrates a top section of an active pillar in the region of the string select line 82 and ground select line 83. In the illustration, an active pillar including vertical channel films 80a/80b and an active pillar including vertical channel films 81a/81b are shown. Data storage structures 84 and 85, formed on opposing sides, extend between a left side (odd) string select line 82 and a right side (even) ground select line 83 and acting as gate dielectric layers. In the frustum of each active pillar that is between the string select line and the ground select line, a string select transistor and a ground select transistor are implemented.

In this illustration, gap 86 is implemented between the active pillar including vertical channel films 80a/80b and the active pillar including vertical channel films 81a/81b. This can reduce capacitive coupling between the vertical channel films in the active pillars. In other embodiments, the gap 86 can be filled with a solid insulator, such as silicon oxide, low-K dielectric materials or other suitable insulators.

Figure 5:
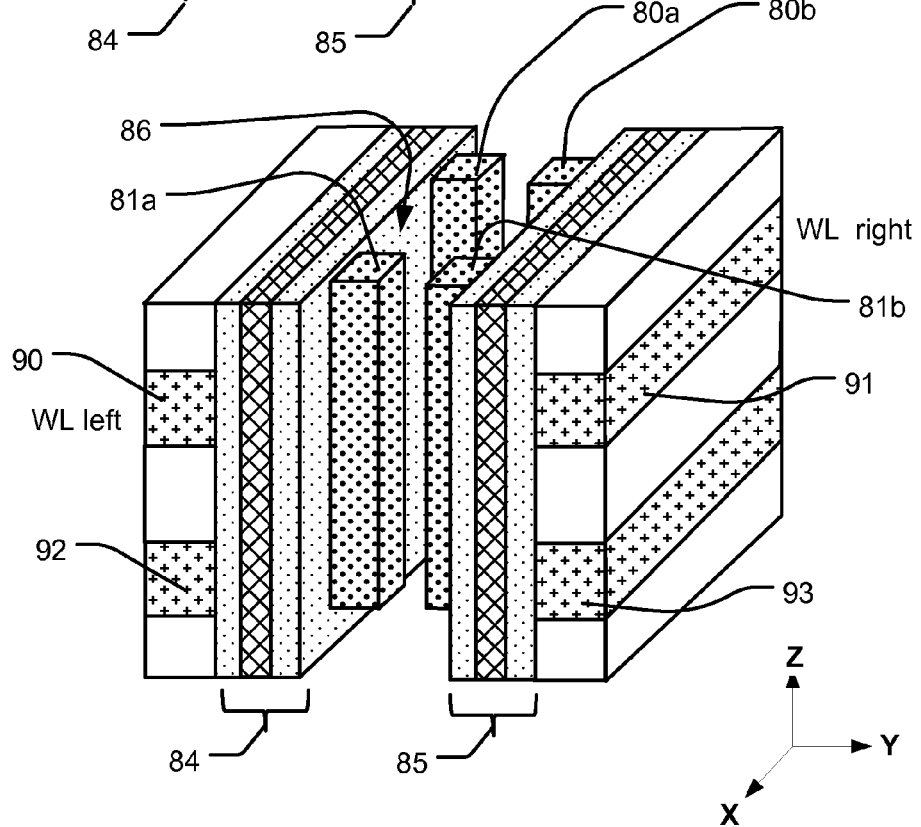
FIG. 5 is a perspective view of two frustums of an active pillar having thin-channel film structures separated by a gap, with memory cells for an active pillar in a 3D memory device.

FIG. 5 illustrates an intermediate section of an active pillar including vertical channel films 80a/80b, and an active pillar including vertical channel films 81a/81b, shown in the region of the word lines. In the illustration, the active pillars have vertical channel structures including even and odd thin-channel films split by a gap as discussed above, resulting in a first active pillar portion (vertical channel film 80a) formed of thin semiconductor film, and a second active pillar portion (vertical channel film 80b) formed of a thin semiconductor film and first active pillar portion (vertical channel film 81a) and a second active pillar portion (vertical channel film 81b), both of which are formed of a thin semiconductor film. The data storage structures 84, 85 line sides of the word lines, including even word lines 90, 92 on the left and odd word lines 91, 93 on the right.

Although not illustrated in FIGS. 4 and 5, in the region of the assist gates (e.g. lines 60, 61 of FIG. 2a), the gap in the vertical channel structures can merge into a single body, or can continue to separate the vertical channel films through the assist gates.

Figure 6:
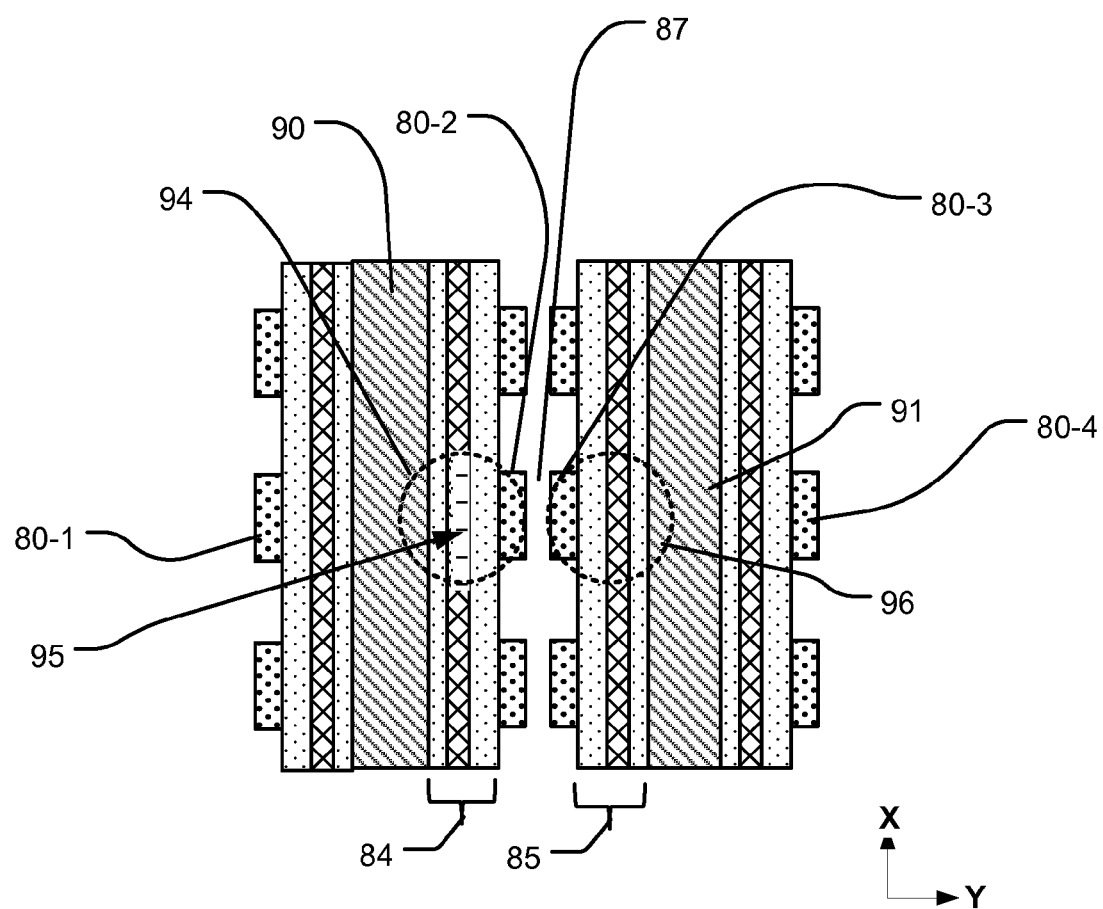
FIG. 6 is a top view of a frustum of an active pillar including memory cells with thin-channel film structures on even and odd sides.

FIG. 6 is a top view taken at the level of word lines 90, 91, which are conductive strips in first and second stacks of conductive strips. FIG. 6 illustrates the memory cell structure at each frustum of the active pillars. The word line 90 is a conductive strip in a stack of conductive strips. The stack of conductive strips has a first side and a second side on which data storage structures (e.g. 84) are disposed. The data storage structures (e.g. 84) are on the sidewalls of the conductive strips in the stack, on both the first and second sides. Referring to the word line 90, a first thin-film semiconductor strip 80-1 is disposed vertically in contact with the data storage structure on the first side. Likewise, a second thin-film semiconductor strip 80-2 is disposed vertically in contact with the data storage structure 84 on the second side of the word line 90. Memory cells in the plurality of memory cells have channels in the thin-film semiconductor strips (80-1, 80-2) and gates in the conductive strips that make up the word lines (90).

Also shown in FIG. 6 is a word line 91, which is a conductive strip in a second stack of conductive strips. The second stack of conductive strips has a first side and a second side on which data storage structures (e.g. 85) are disposed. The data storage structures (e.g. 85) are on the sidewalls of the conductive strips in the stack, on both the first and second sides.

Referring to the word line 91, a third thin-film semiconductor strip 80-3 is disposed vertically in contact with the data storage structure on the first side of the word line 91. A fourth thin-film semiconductor strip 80-4 is disposed vertically in contact with the data storage structure on the second side of the word line 91. An insulating structure, which in this illustration comprises a gap 87, separates the second thin-film semiconductor strip 80-2 and the third thin-film semiconductor strip 80-3. In some embodiments, the insulating structure can comprise a solid insulator, such as silicon dioxide, or a combination of a solid insulator and a gap.

In the embodiment illustrated in FIG. 6, an active pillar between two stacks of conductive strips (including word lines 90, 91) consists of the second and third thin-film semiconductor strips in this illustration. In the region of the memory cells (94, 96), the thin-film semiconductor strips are separated into separate semiconductor bodies in which the channels of the memory cells are formed.

In order to independently program each side of the active pillar, programming bias voltages can be applied independently to word line 90 and word line 91. In order to program the cell 94 on the left side, gate program voltages are applied to the left word line 90, while inhibit voltages are applied to the right word line 91. The vertical channel structures in the active pillars are biased at a suitable level so that the difference between the gate program voltage and the voltage on the vertical channel is sufficient to induce charge trapping in the region 95 of the cell 94, while inhibiting transfer of charge out of the dielectric charge trapping structure in the adjacent cell 96.

Figure 7:
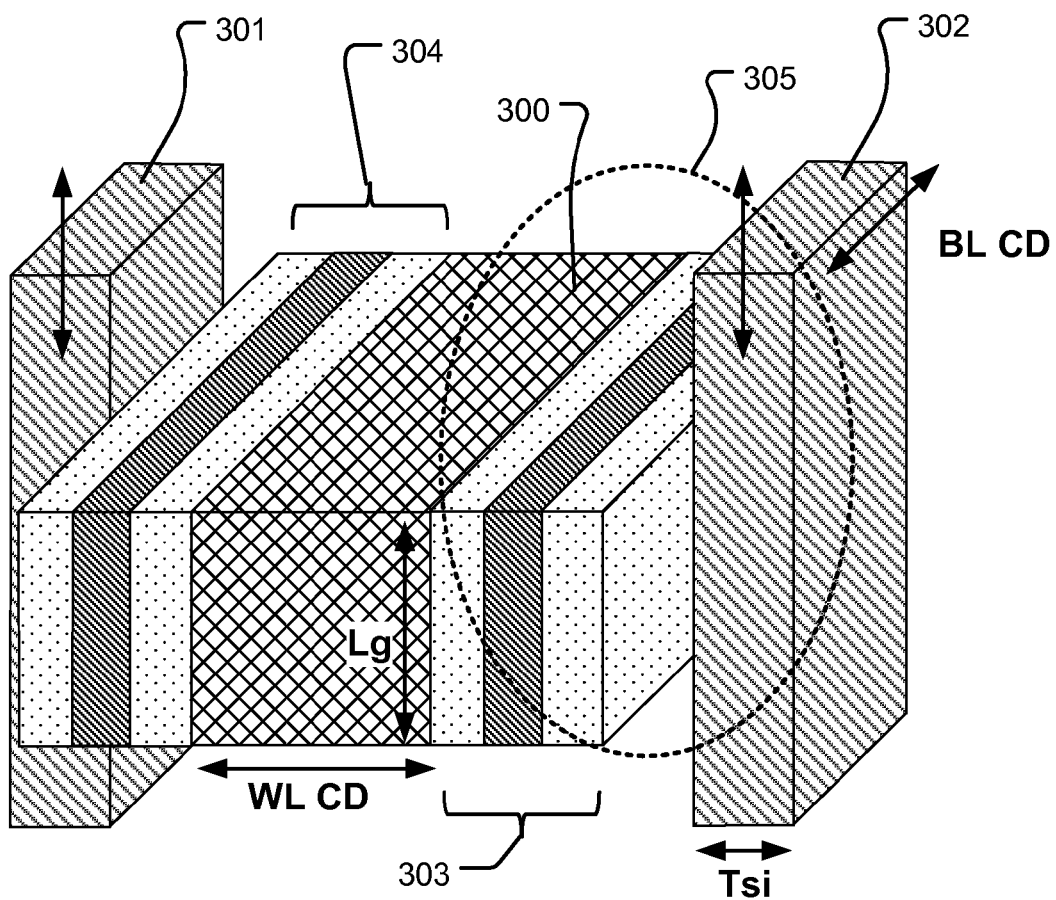
FIG. 7 is a perspective view of thin-film vertical channel structures which can be used to form a 3D array as described herein.

FIG. 7 illustrates the structure implementing two vertical channel flash memory cells with a shared word line implemented by a horizontal conductive strip 300. Data storage structure 304 is disposed on the left side of the horizontal conductive strip 300. Data storage structure 303 is disposed on the right side of the horizontal conductive strip 300. A thin-film semiconductor strip configured as a first vertical channel film 301 is disposed over the data storage structure 304 on the left side of the conductive strip 300. A thin-film semiconductor strip 302 configured as a second vertical channel film is disposed over the data storage structure 303 on the right side of the conductive strip 300.

As result of the structure, memory cell 305 is formed on the right side. A similar memory cell structure is formed on the left side. The gate of the memory cell 305 is disposed in the strip 300, and the channel of the memory cell 305 is disposed in the vertical thin-film semiconductor strip 302. Thus, the vertical arrows on the thin-film semiconductor strips represent the direction of current flow in the memory structure.

The horizontal conductive strip 300 has a width labeled WL CD in the figure, for word line critical dimension. This width is "critical" for the purposes of determining the area, or density, of the layout of an array of cells. The WL CD can be determined in some manufacturing processes by an etching pattern used to form a plurality of stacks of conductive strips as described below. The vertical channel film (strip 302) has a width labeled BL CD in the figure, for bit line critical dimension. This width is "critical" also for the purposes of determining the area, or density, of the layout of an array of cells. The BL CD can also be determined in some manufacturing processes by an etching pattern used to form the plurality of thin-film semiconductor strips.

The horizontal conductive strip 300 also has a dimension labeled Lg, for length of gate. The length of the gate, or gate length, is an important parameter for determining performance of a flash memory cell. The Lg can be determined in some manufacturing processes with good uniformity by a thickness of a deposited layer of conductive material used to form the conductive strips.

The vertical channel film (strip 302) has a dimension labeled Tsi, for thickness of silicon. This label assumes that the semiconductor material used to form the thin-film strip is silicon Si. Other semiconductor materials can be utilized. In embodiments of the technology described herein dimension Tsi can be determined with good uniformity by the thickness of a deposited layer of the material.

The dimension Tsi in the structure can be 10 nm or less. For the purposes of this description, a vertical thin-channel structure is formed using a thin-film semiconductor strip having a thickness in the Tsi dimension 10 nm or less, at least in the regions of the memory cells.

FIGS. 8 through 18 illustrate an example process flow for a vertical thin-channel film structure.

Figure 8:
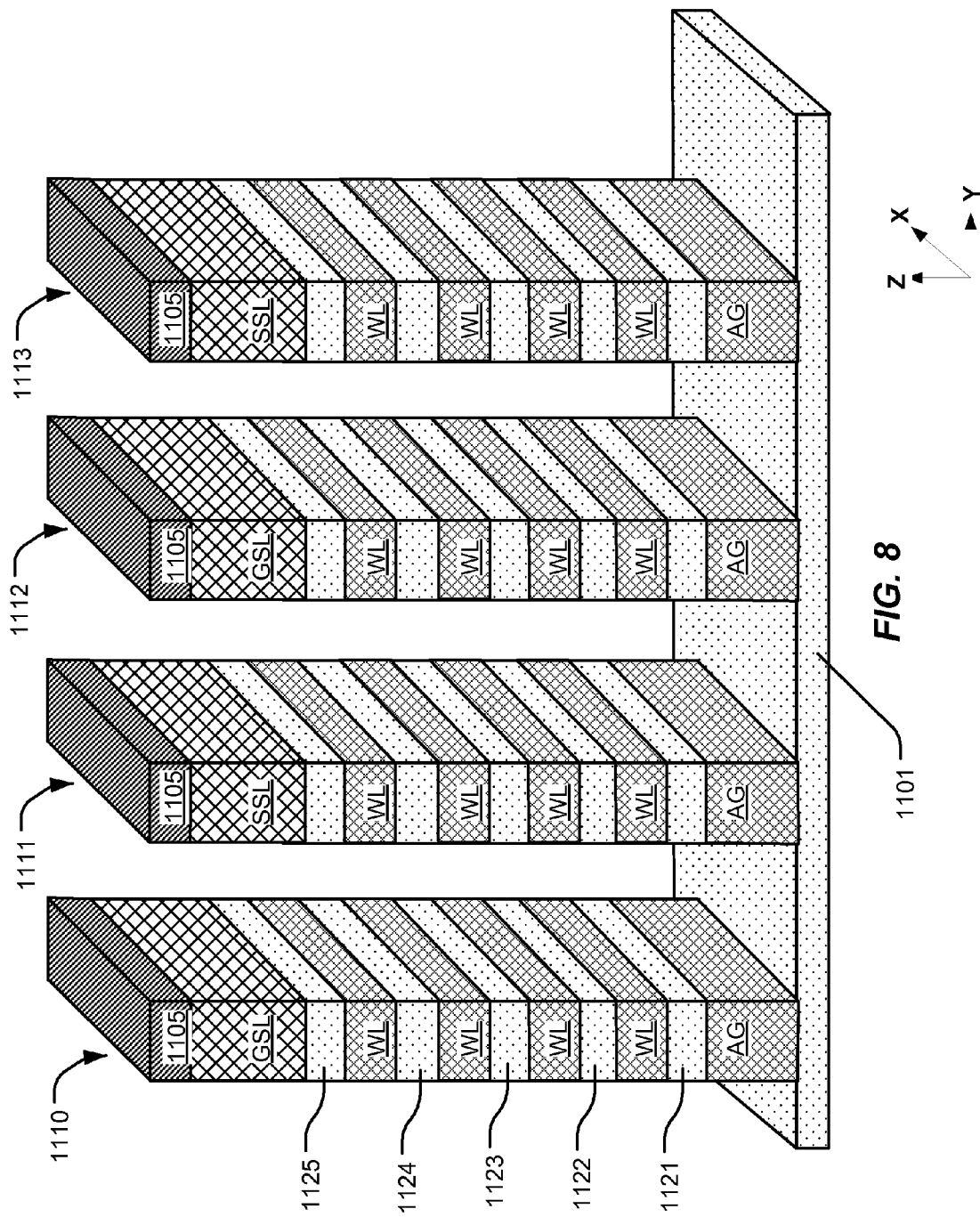
FIGS. 8-10, 11A-11E, 12A, 12B, and 13-18 illustrate structures during manufacturing stages for a 3D NAND as described herein.

FIG. 8 illustrates a stage of the process flow after forming an insulating layer 1101 which can comprise a silicon oxide or other dielectric on a semiconductor substrate.

To form the structure shown in FIG. 8, a plurality of layers of a first conductive material, such as doped polysilicon, or other material suitable for use as word lines, separated by layers of insulating material, are disposed over the insulating layer 1101. In embodiments described herein, the conductive material can be a heavily p-type doped polysilicon (P+ polysilicon) or other material selected for compatibility with the data storage structure. A layer of silicon nitride which can be used to provide tensile stress, is deposited over a top layer, in this example. This layer can improve the uniformity of the stacks and reduce bending, when they are etched with high aspect ratios and narrow lines. The layers of insulating material can comprise silicon dioxide deposited in a variety of ways as known in the art. Also, the layers of insulating material can comprise other insulating materials, and combinations of insulating materials. In this example, all of the insulating layers, with the exception of the top layer 1105, consist of the same material. In other examples, different materials can be used in different layers as suits a particular design goal. After the plurality of layers is formed, a patterned etch is applied to form a plurality of stacks of conductive strips.

FIG. 8 illustrates a stage of the process after etching the plurality of layers, and stopping at the insulating layer 1101, to define a plurality of stacks of conductive strips, including stacks 1110, 1111, 1112 and 1113. The stacks 1110, 1111, 1112 and 1113 include at least a bottom plane (AG) of conductive strips, a plurality of intermediate planes (WLs) of conductive strips, and a top plane of conductive strips (SSL/GLS). The plurality of intermediate planes can include N planes, ranging from 0 to N−1 for the stack. A top layer 1105 of silicon nitride is disposed on each stack. Although not shown, the conductive strips are linked by pads which can be defined in the pattern used for etching the stacks. The stacks 1110, 1111, 1112 and 1113 include layers of insulating material 1120, 1121, 1122, 1123, 1124, 1125 as labeled in stack 1110, separating the conductive strips from one another.

Figure 9:
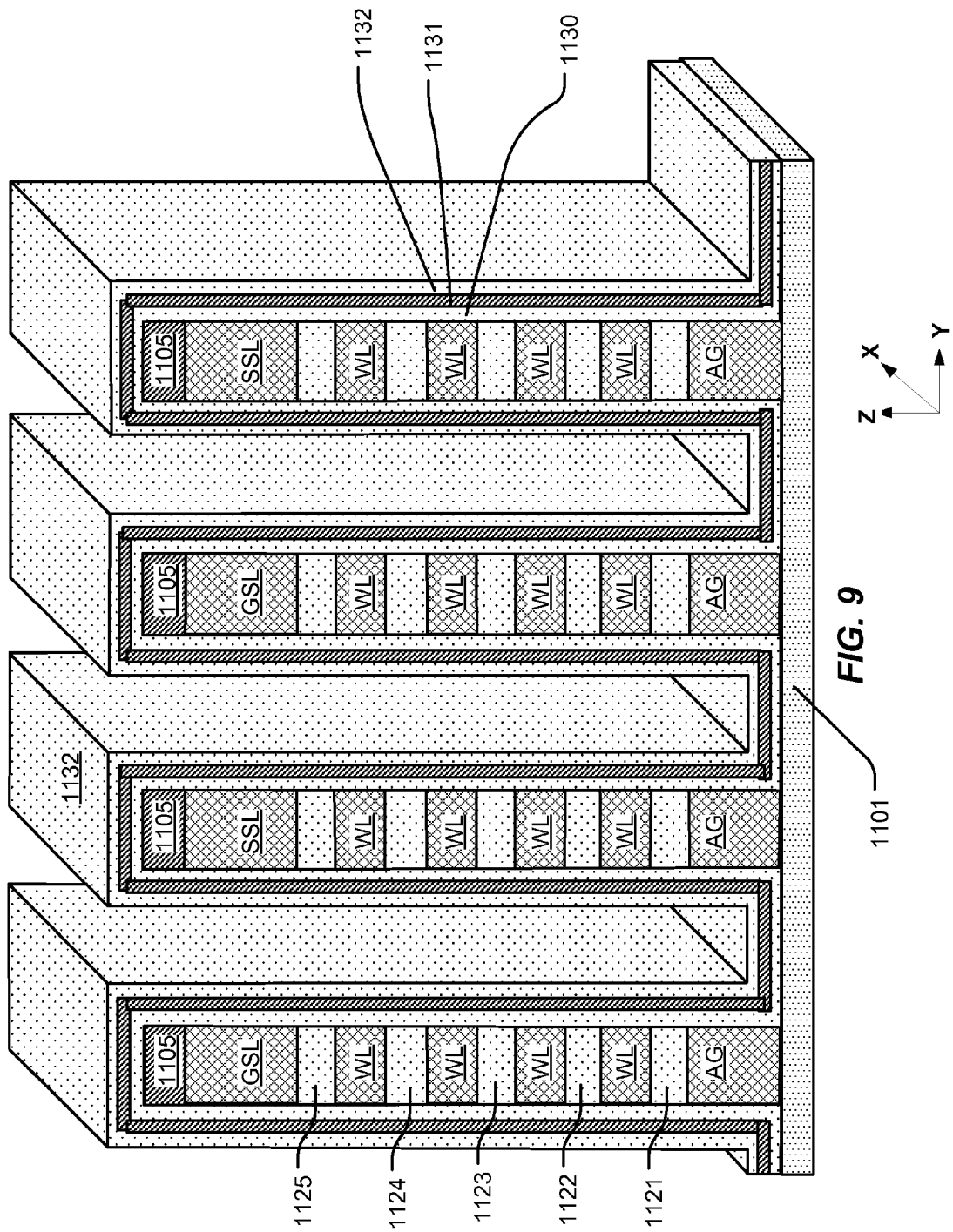

FIG. 9 illustrates a stage of the process flow after forming a memory layer over and on sides of conductive strips in the plurality of stacks. The memory layer includes an outside surface disposed on the plurality of stacks and an inside surface opposite the outside surface. The memory layer contacts side surfaces of the plurality of conductive strips, as shown in FIG. 9. The memory layer can comprise a multilayer data storage structure, as illustrated including a tunneling layer 1132, a charge storage layer 1131, and a blocking layer 1130, examples of which are discussed above. In one preferred example, the memory layer is implemented as illustrated below with reference to FIG. 25.

Figure 10:
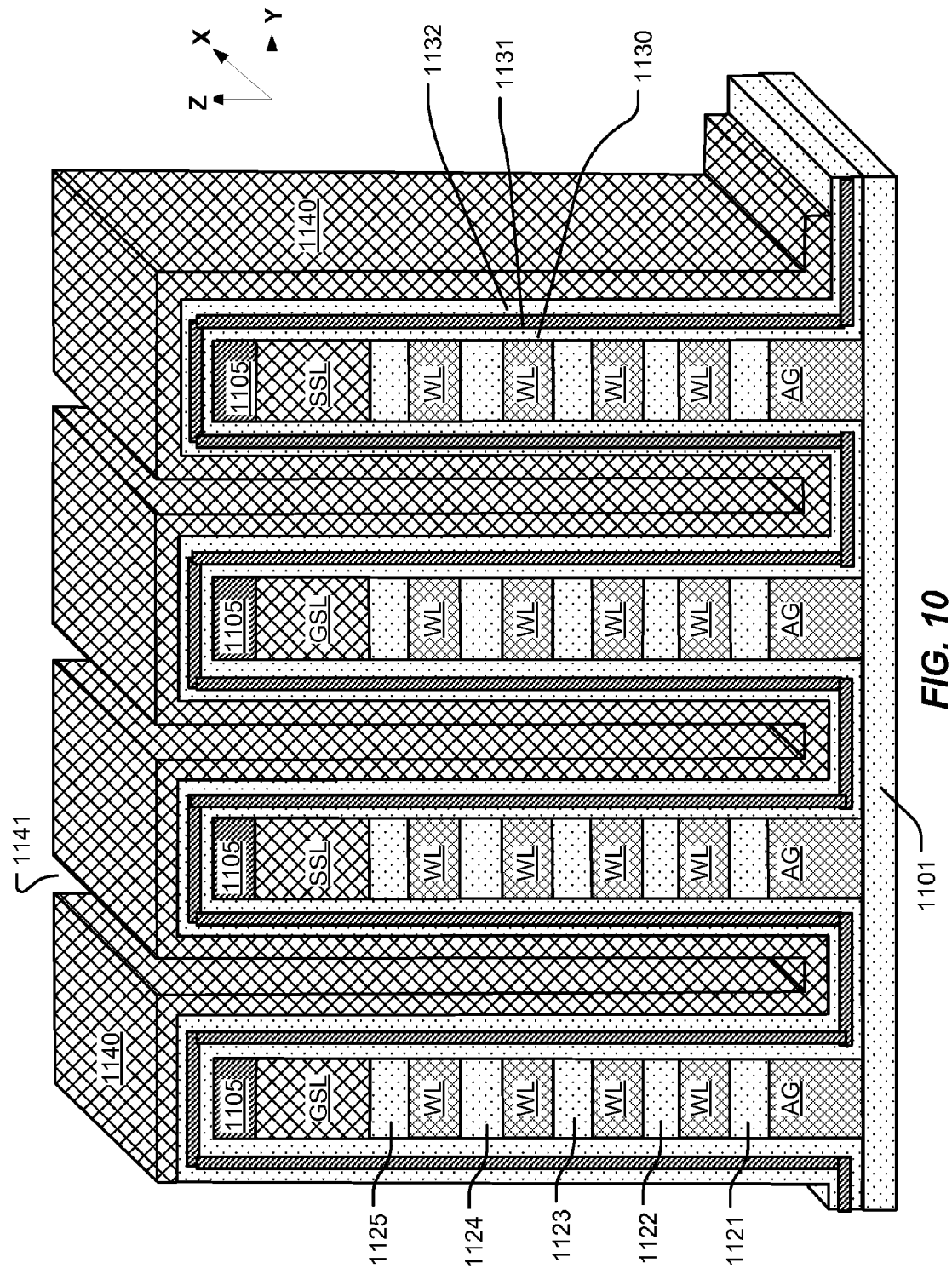

FIG. 10 illustrates a stage of the process flow after forming a thin layer 1140 of a semiconductor material over, and having a surface conformal with, the memory layer on the plurality of stacks. In the dielectric charge storage embodiment, the thin layer 1140 contacts the tunneling layer 1132, of the memory layer, at least in the regions in which memory cells are being formed. The semiconductor material in layer 1140 comprises a semiconductor adapted by choice of material, e.g. silicon, and doping concentrations (e.g. undoped or lightly doped) to act as channel regions for vertical strings of memory cells, at least in the regions between the stacks. The thin layer 1140 can have a thickness of about 10 nanometers or less. As illustrated, in the regions 1141 between the stacks, the thin layer 1140 extends to the bottom of the trenches between the stacks, and overlies the insulating layer 1101. A thin layer of oxide can be formed by a short oxidation of the layer 1140.

Figure 11A:
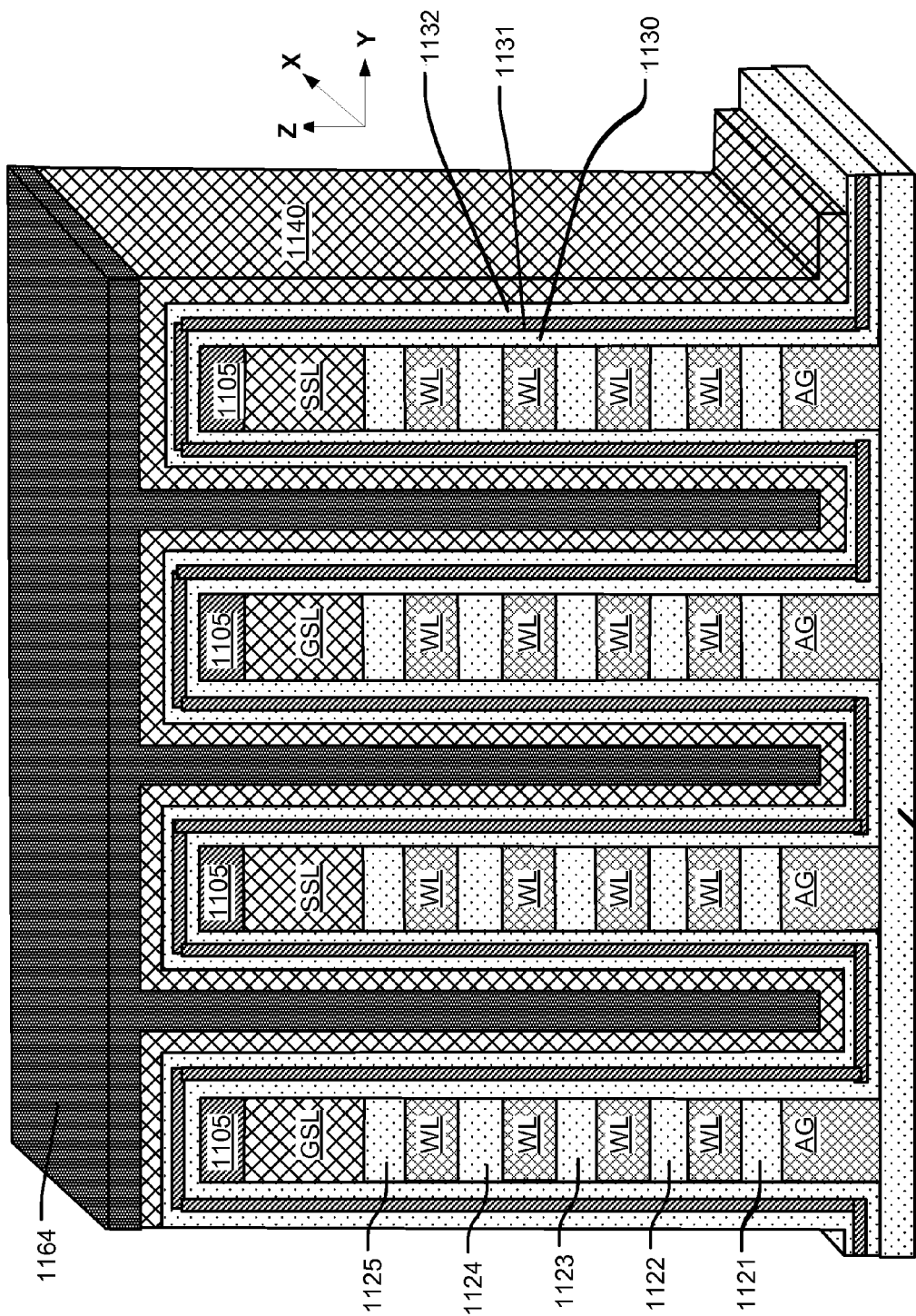

FIG. 11A illustrates a stage in the process flow after covering the inside surfaces of the thin-film semiconductor layer 1140 with a flowable dielectric material 1164. As illustrated, the flowable dielectric material 1164 fills between the stacks. In embodiments, the flowable dielectric material is applied with a spinning-on process including, spreading and flowing the flowable dielectric material onto the partially formed device, and spinning the partially formed device. Once the flowable dielectric material fills in and covers the partially formed device it is cured. In the example shown, the flowable dielectric material is a spin-on glass material. Spin-on glass material has excellent fill-in capability, resulting in no gaps forming between the stacks. The excellent fill-in properties allow for deep holes of uniform depth to be etched through the spin-on glass in later steps.

Figure 11B:
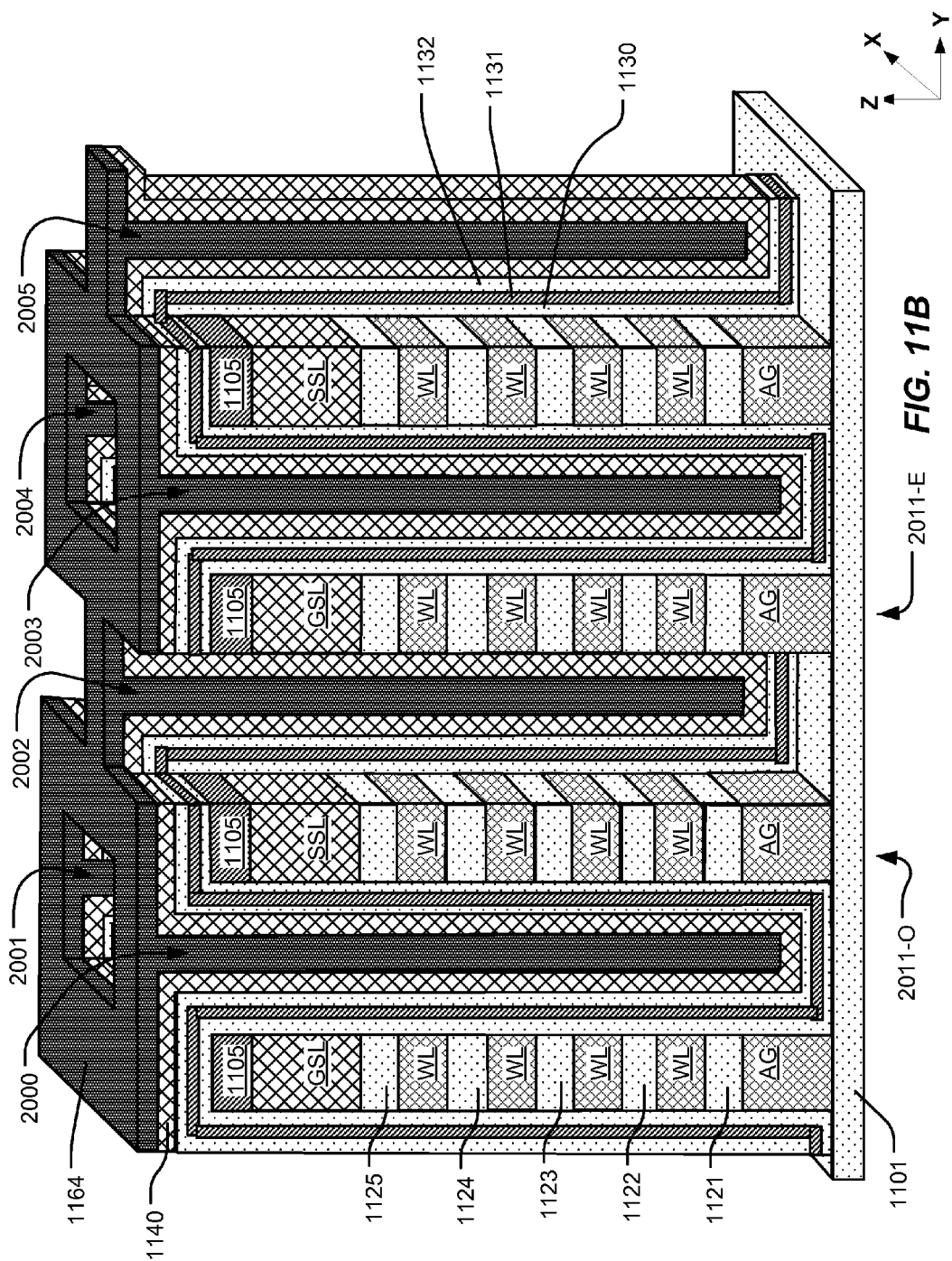

FIG. 11B illustrates a stage in the process flow after performing a vertical channel film cut etching process which includes etching holes between the stacks through the thin-film semiconductor layer, the memory layer, and the spin-on glass. The holes extend in this example to expose the insulating layer 1101. As a result of the holes, vertical columns of spin-on glass (2000, 2001, 2002, 2003, 2004, 2005) remain, which are disposed between the even stacks (e.g. 2011-E) and odd stacks (e.g. 2011-O). As illustrated in FIG. 11B, the vertical columns of spin-on glass (2000, 2001, 2002, 2003, 2004, 2005), are laid out in a honeycomb arrangement, so that each row of vertical column of spin-on glass is offset in the row direction from adjacent rows. The honeycomb arrangement of this structure facilitates formation of overlying bit lines with a tighter pitch, as shown in FIGS. 16-19. On either side of the vertical columns of spin-on glass vertical channel films are formed. The vertical channel films having outside surfaces and inside surfaces. The outside surfaces are disposed on and contact the data storage structures, formed in the memory layer on the sidewalls of the corresponding even and odd stacks forming a 3D array of memory cells. As noted above, this etching process results in a uniform holes, with consistent depth and electrochemical deposition (ECD) when the film condition is fixed, due to the excellent fill-in properties of the spin-on glass.

Figure 11C:
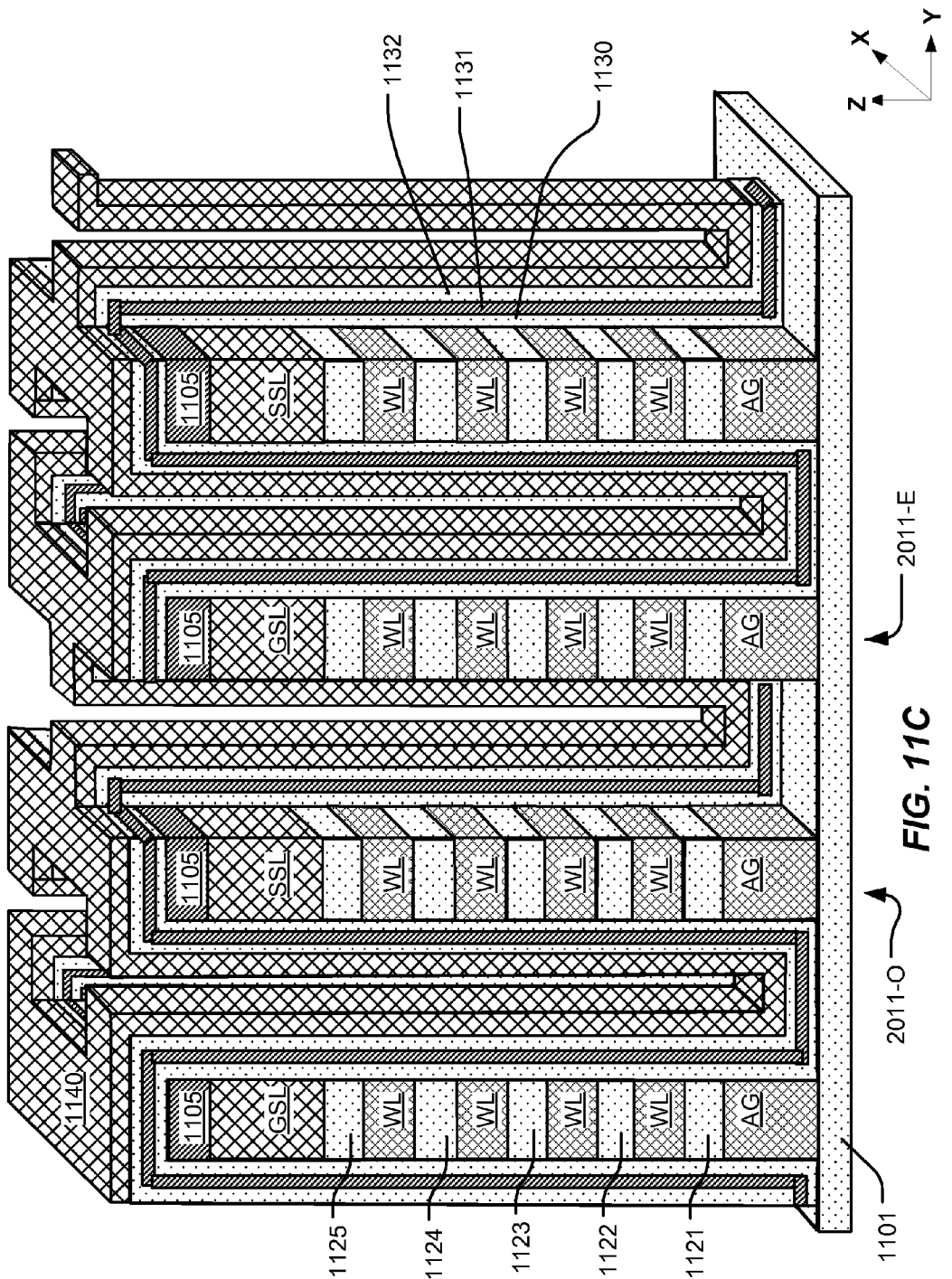
Figure 11D:
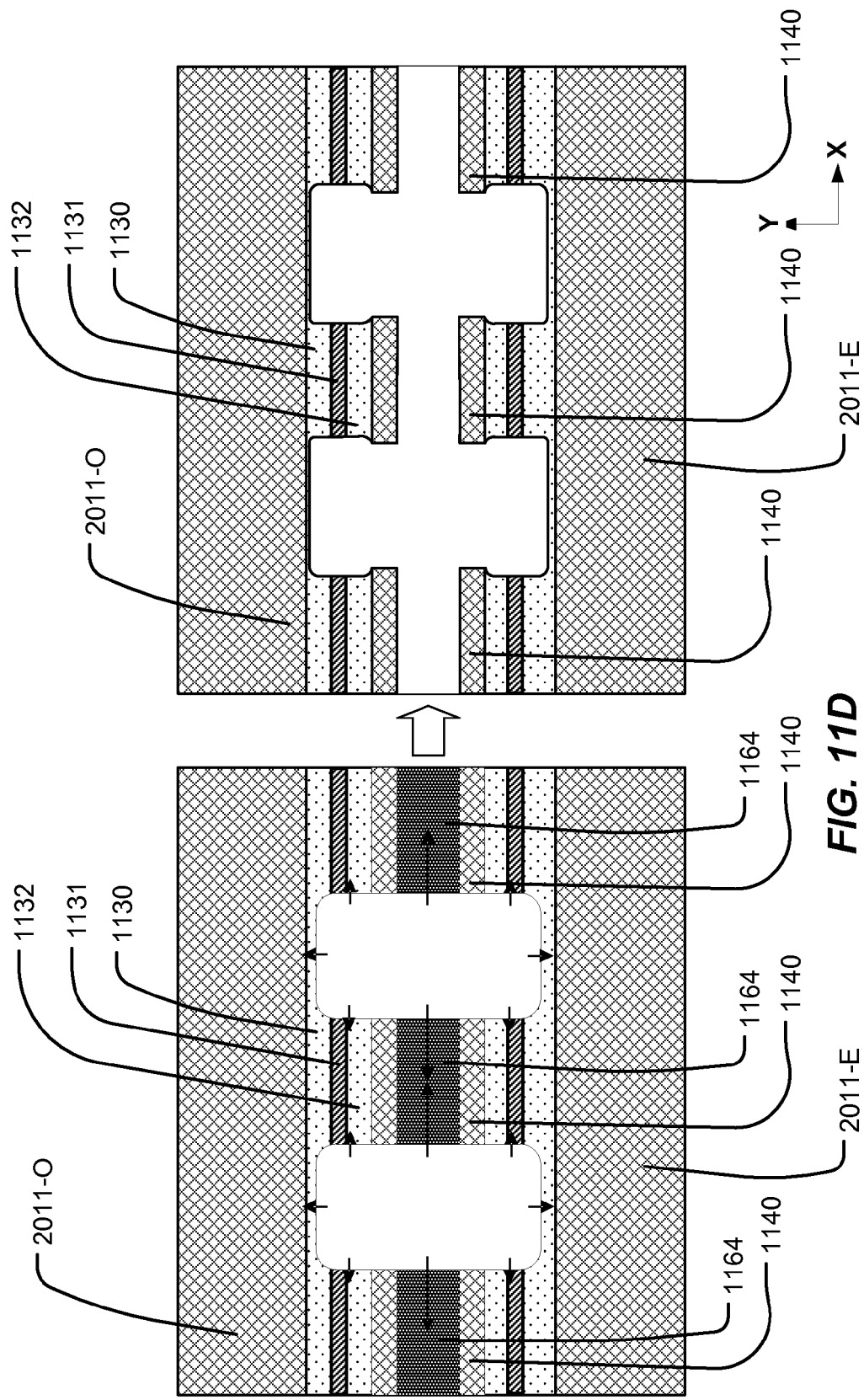

FIG. 11C illustrates a stage in the process flow after performing an etching process that removes the spin-on glass remaining after the previous step of patterning and etching the deep holes. The removed spin-on glass includes the vertical columns formed during the vertical channel film cut etching process. The etching process used in this step is highly selective between spin-on glass and thermal oxide, for example greater than 20 times more selective, in order to remove the spin on glass while removing very little thermal oxide of the layers of the memory layer including the tunneling layer 1132, the charge storage layer 1131, and the blocking layer 1130. FIG. 11D show an illustrative cross-sectional view of the process flow before and after performing the selective etching process that removes the vertical columns of spin-on glass remaining after the vertical channel film cut etching process. The solid black arrows on the right side of FIG. 11D indicate the direction and approximate amount of material that will be etched away during the process. As shown, during this selective etching process a very minimal amount of the oxide of the memory layer the including a tunneling layer 1132, the charge storage layer 1131, and the blocking layer 1130, is removed.

In an example selective etching process, a device may include a pitch of 100 nm between the centers of the holes between the active pillars. In this example, the holes and the active pillars have approximately the same width. Therefore, there is about 50 nm of SOG in the vertical columns between each hole. The selective etching must therefore remove 25 nm of SOG in each direction from the holes in order to remove all of the SOG. In embodiments, to ensure complete removal of the SOG an operation error, for example 50%, may be factored in when determining the properties of the selective etch process. The following equation may be used to determine the amount of thermal oxide that will be removed.

$$1 \text{SOG to Remove} \times (1 + \text{OperationError}) / \text{Selectivity} = \text{ThermalOxideRemoved} \quad \text{Equation 1:}$$

For example, with an operation error of 50% and an etching selectivity of 20, to remove 25 nm of SOG about 1.875 nm of thermal oxide will be removed.

Figure 11E:
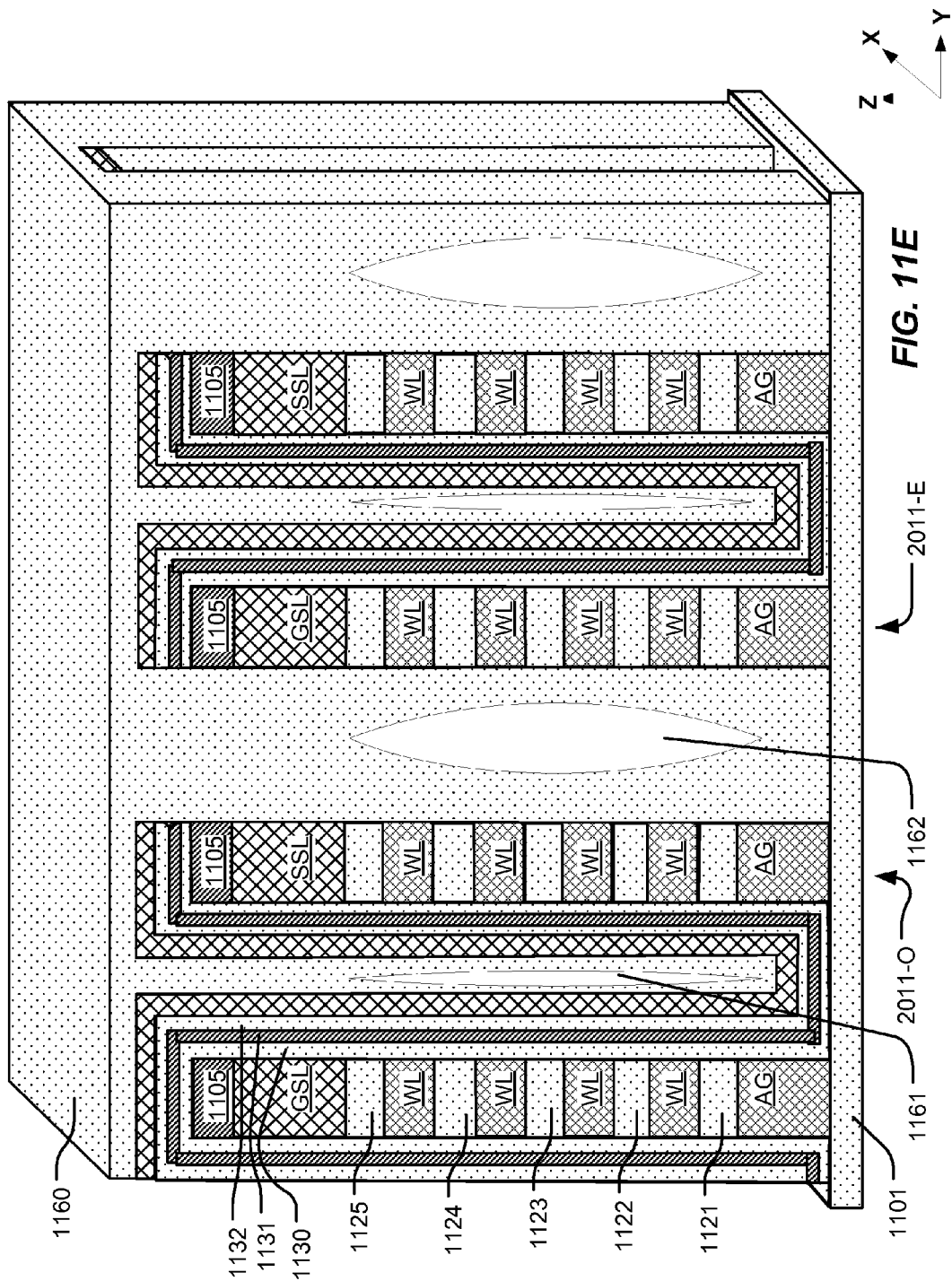

FIG. 11E illustrates a stage in the process flow after performing a depositing step of an insulating material, for example TEOS. In the illustrated example, the insulating material fill 1160 includes gaps (e.g. 1161) between the regions adjacent the intermediate layers of conductive strips, these regions correspond to the vertical channel structures (2100, 2101, 2102, 2103, 2104, 2105) shown in FIGS. 12 and 13. In single gate vertical channel 3D NAND flash, this gap formation is beneficial to suppress interference between back-to-back channels in the U-turn architecture. Further, in embodiments the insulating material fill 1160 includes gaps (e.g. 1162) between portions of stacks that do not contain memory cells.

Figure 12A:
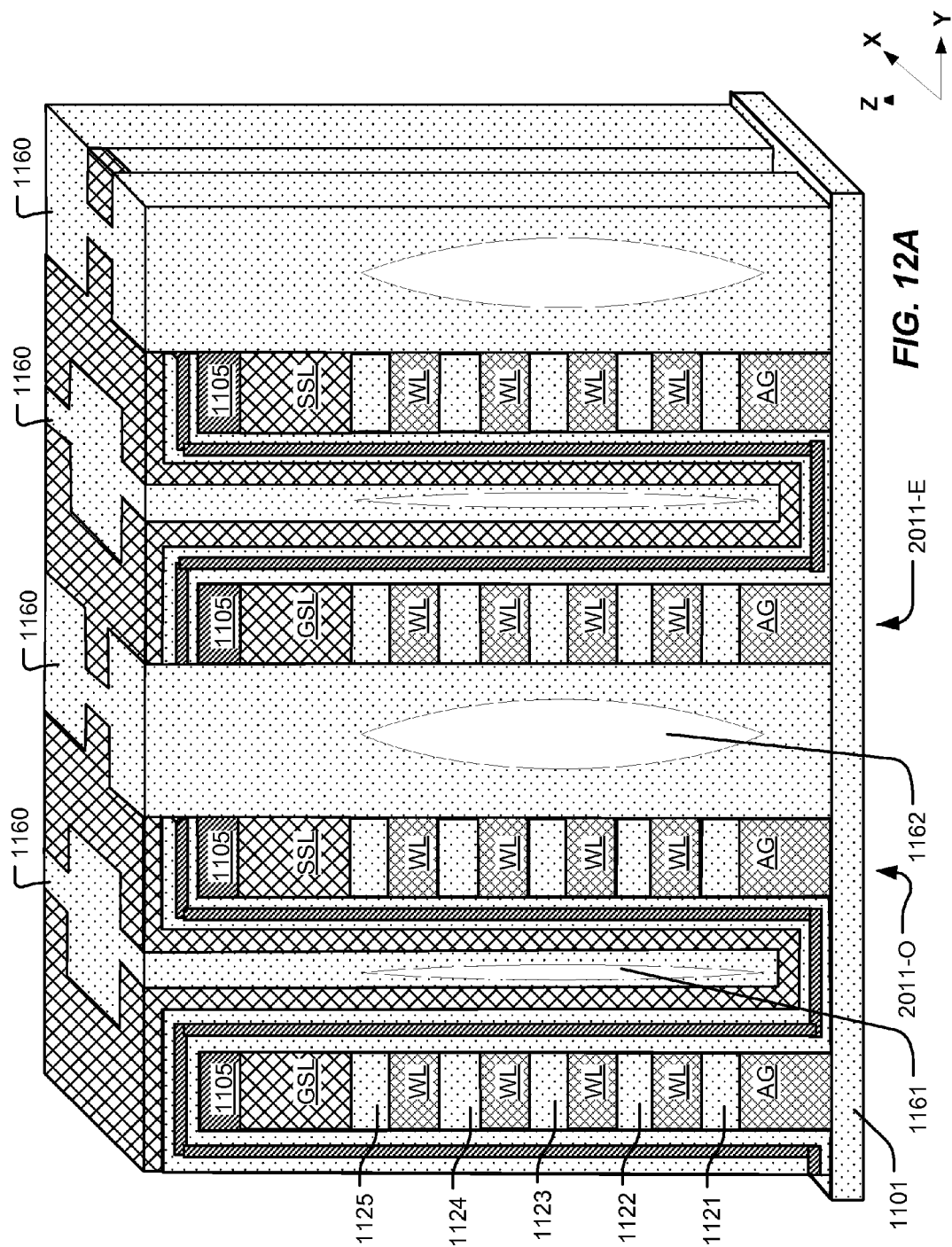

After the insulating material fill step, an etch back or planarizing step such as chemical mechanical polishing can be applied to expose the top surface of the thin-film semiconductor layer 1140, as shown in FIG. 12A.

While the process of using a flowable dielectric material, such as spin-on glass, as a sacrificial material used for creating etched deep holes has been described above in the fabrication process of single gate vertical channel 3D NAND flash, it may also be used in the fabrication process of other types of memory and semiconductor devices where it is desirable to have a patterned fill that includes gaps.

Figure 12B:
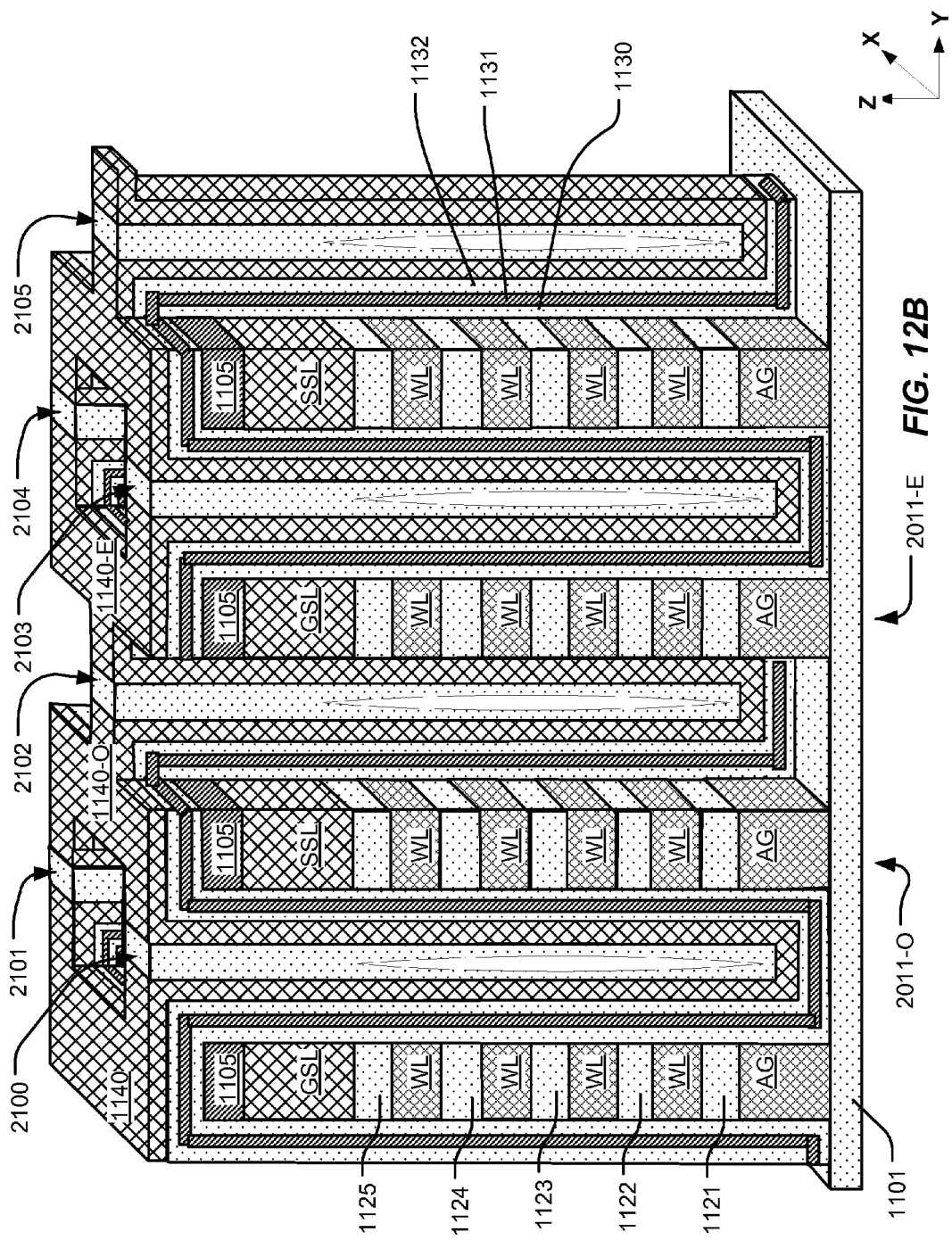
Figure 20:
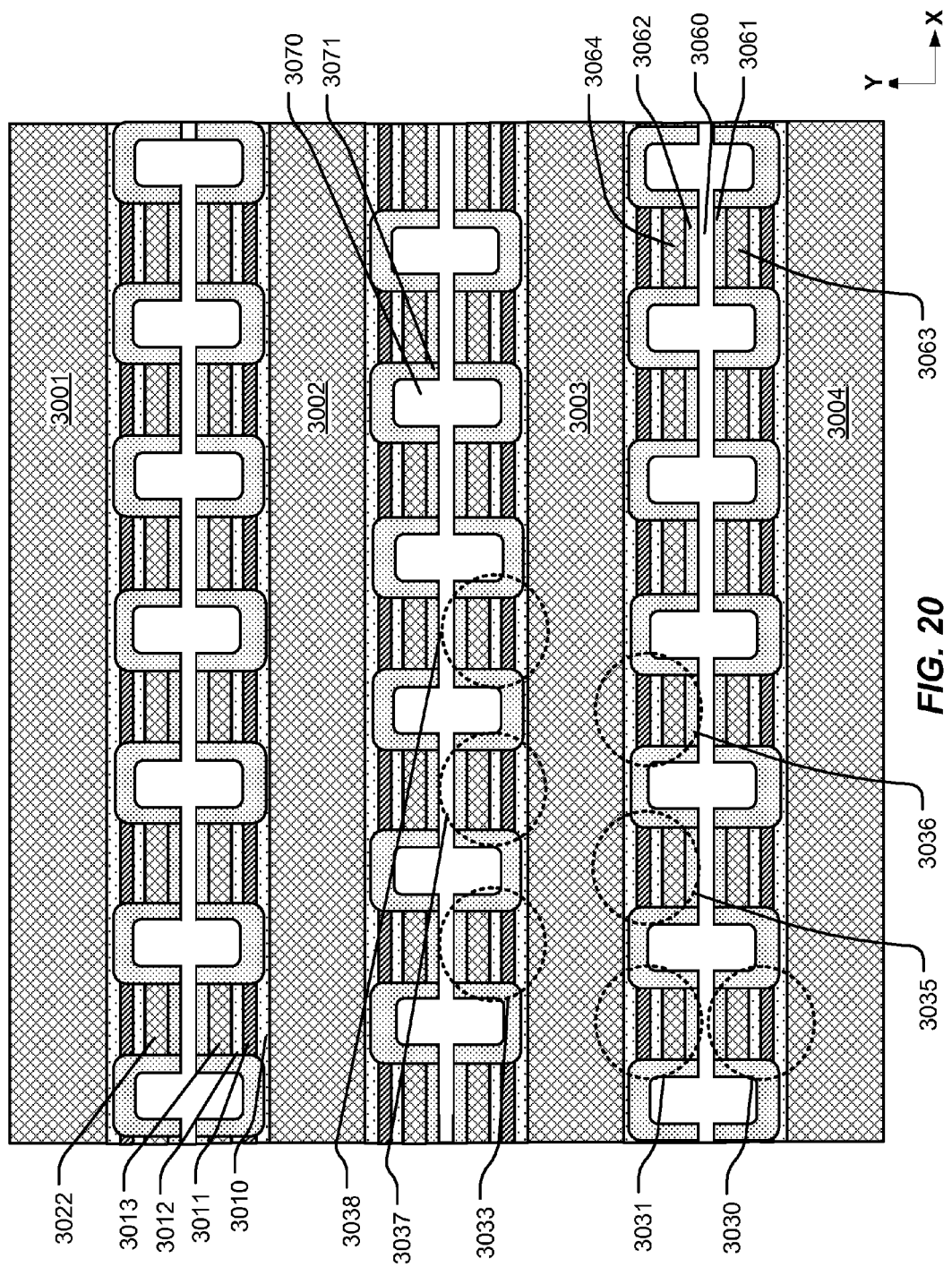
FIG. 20 illustrates in layout view another embodiment of a thin-channel film 3D NAND having gaps that separate opposing vertical channel films.
Figure 21:
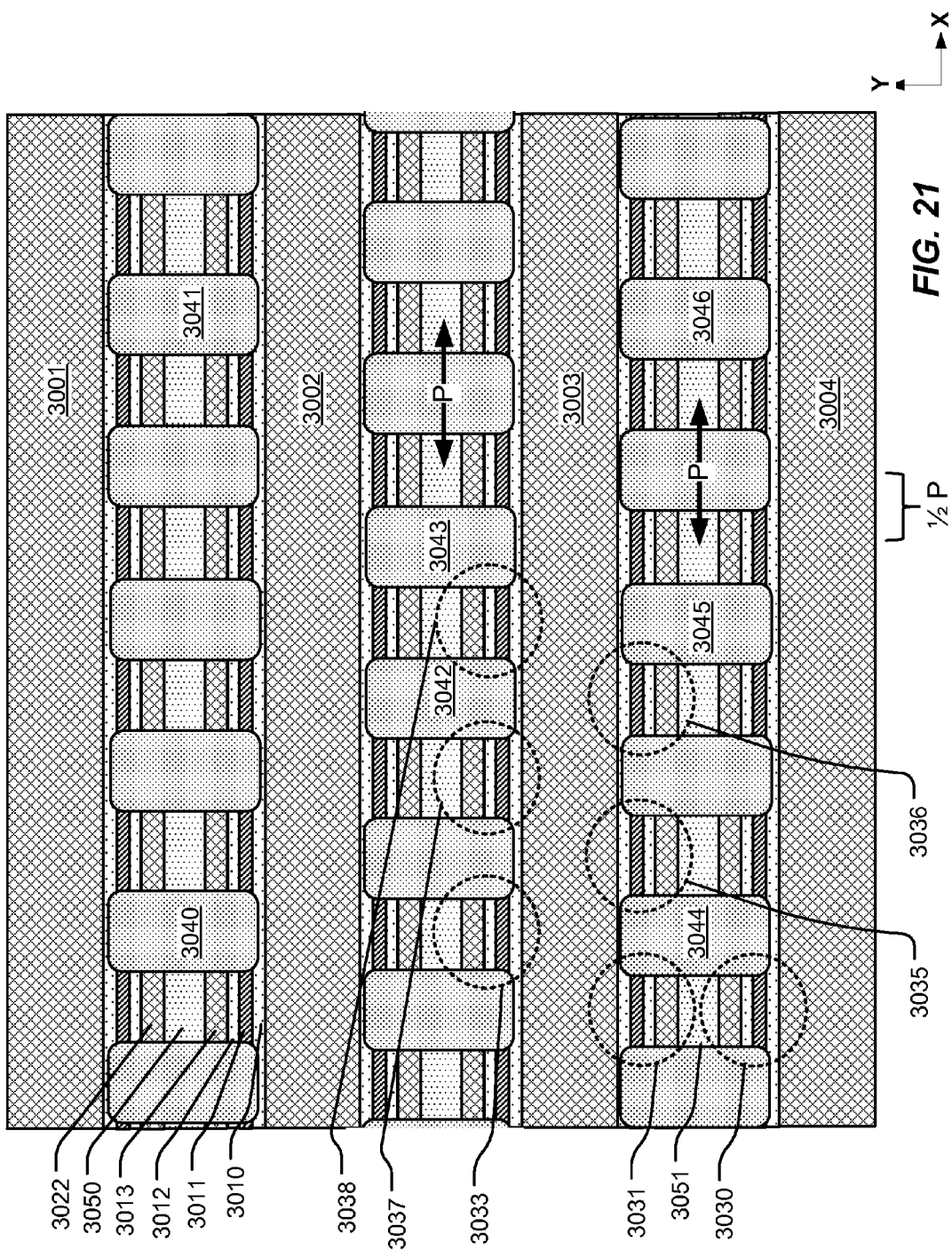
FIG. 21 illustrates in layout view one embodiment of a thin-channel film 3D NAND structure.

FIG. 12B is a simplified version of FIG. 12A. In FIG. 12B, as well a FIGS. 13-18, portions of the insulating fill 1160 between portions of stacks without vertical channel structures are not shown in order to more clearly show the vertical channel structures 2100-2105. FIGS. 20 and 21 below illustrate alternative layout views, from the point of view of cross-sections taken in the XY plane at a word line layer.

After the vertical channel film cut etch, the thin-film semiconductor layer 1140 adopts the pattern of the array of holes on a top surface, resulting in a continuous semiconductor film over the tops of the stacks and connecting to the vertical channel films of the active pillars. In FIG. 12B, a portion 1140-O of the thin-film semiconductor layer 1140 overlies the odd stack 2011-0. The portion 1140-E of the thin-film semiconductor layer 1140 overlies the even stack 2011-E and is continuous along the top of the stack 2011-E connecting the vertical channel films on the right side of the active pillar comprising vertical channel structure 2102, the vertical channel films on the left side of the active pillar comprising vertical channel structure 2103 and the vertical channel film on the left side of the active pillar comprising vertical channel structure 2104 in this illustration.

Figure 13:
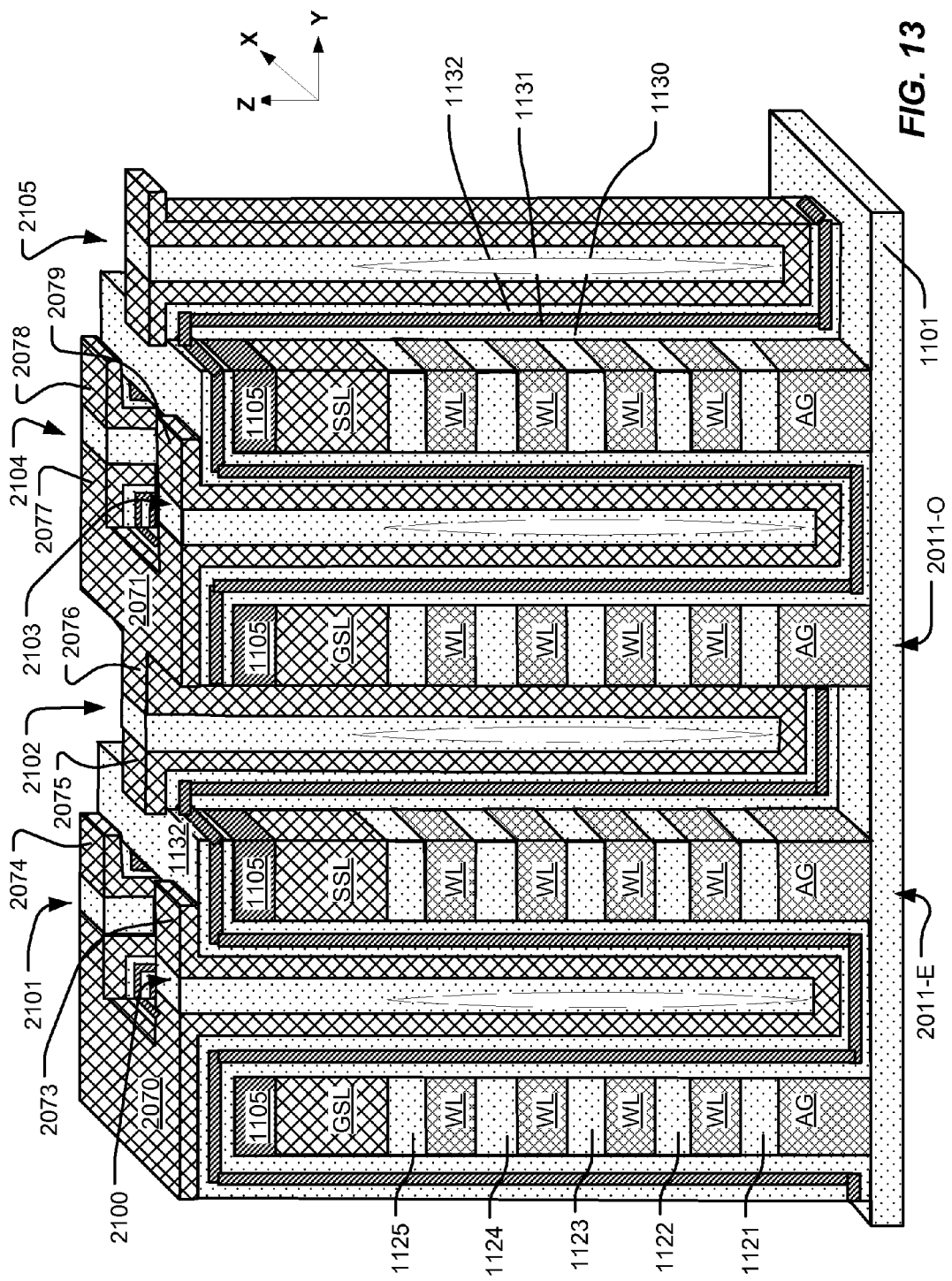

FIG. 13 shows the structure after doing a patterned etch to divide the thin-film semiconductor layer 1140 remaining over the stacks for the purposes of forming array connections. After the patterned edge, the thin-film semiconductor layer 1140 is divided into portions 2070 in 2071 which overlie the odd stacks, and portions 2073, 2074, 2075, 2078 and 2079 which overlie the even stacks. The portions 2070 and 2071 connect the active pillars (e.g. 2071 connects to portions 2076, 2077) on the common source side of the NAND strings together and provide landing areas for interlayer connectors for connection to a common source line. The portions 2073, 2074, 2075, 2078 and 2079 are separated and provide landing areas for interlayer connectors making independent connection to bit lines. In the illustration, the active pillar comprising vertical channel structure 2005 shows the pattern of the pad on the top of the vertical channel film on the SSL side of the NAND string, but on the GSL side of the NAND string, the illustration is incomplete.

Figure 14:
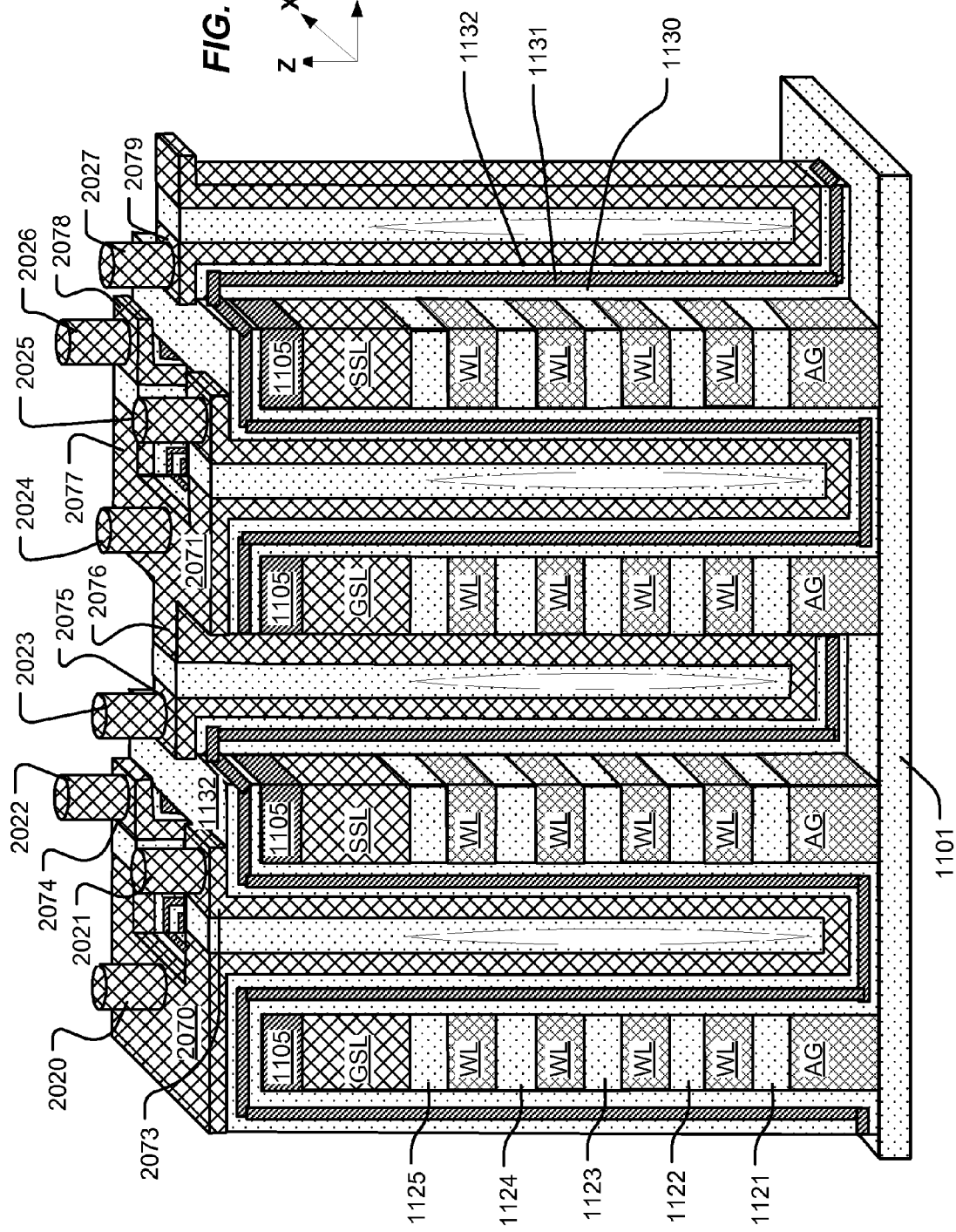

FIG. 14 illustrates a following stage after formation of an array of contact plugs (2020, 2021, 2022, 2023, 2024, 2025, 2026, 2027) through an interlayer dielectric (not shown), landing on corresponding portions of the thin-film semiconductor layer. The process can include formation of a layer of interlayer dielectric such as silicon oxide on top of the array, which can be for example about 100 nm to 500 nm thick, followed by formation of vias through the interlayer dielectric exposing the landing areas on the portions of the thin-film semiconductor layer. The contacts can comprise a polysilicon plug, or other material which is compatible with the conductive material used at the upper surfaces of the vertical channel structures. The contacts 2020, 2024 provide for electrical connection to portions 2070 and 2071 which are continuous with thin-channel films on the GSL sides of the active pillars. The contacts 2021, 2022, 2023, 2025, 2026, 2027 provide for electrical connection to portions 2073, 2074, 2075, 2078, 2079, and to the unlabeled portion on the SSL side of active pillar comprising vertical channel structure 2005, respectively, which are continuous with the thin-channel films on the SSL sides of the active pillars.

Figure 15:
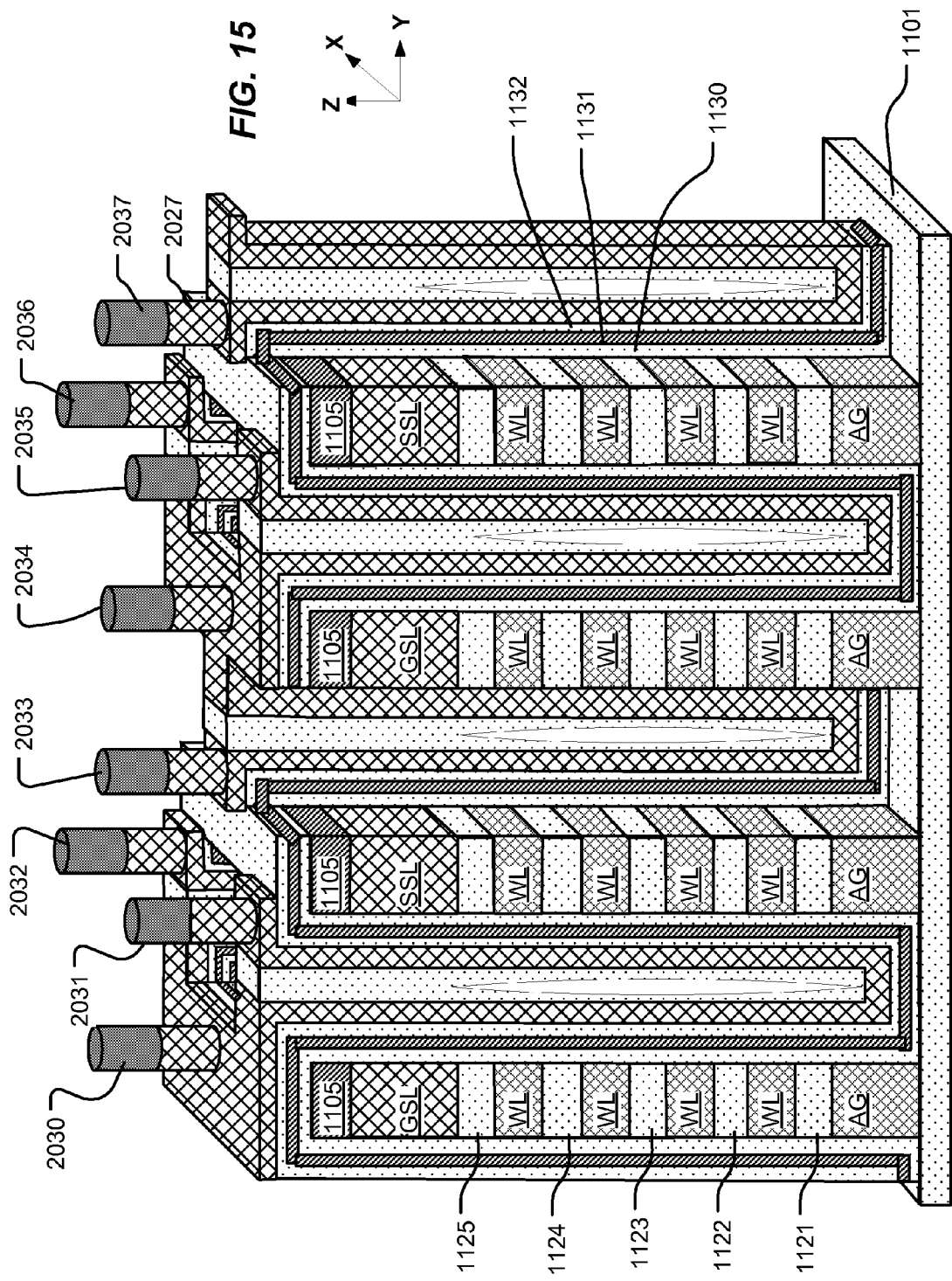

FIG. 15 illustrates the structure after a following stage that includes formation of interlayer connectors (2030, 2031, 2032, 2033, 2034, 2035, 2036, 2037) which can comprise tungsten plugs or other metal materials in an interlayer dielectric which overlies an interlayer dielectric (not shown). The interlayer connectors 2030-2037 are aligned over and make electrical contact with the polysilicon plug contacts (e.g. 2027) in this example. The alignment can be carried out using a borderless silicon nitride process or other technique which provides for good electrical connection to the underlying polysilicon plugs in this embodiment.

In other embodiments, interlayer connection can be made using other combinations of materials, or using a single interconnection plug.

Figure 16:
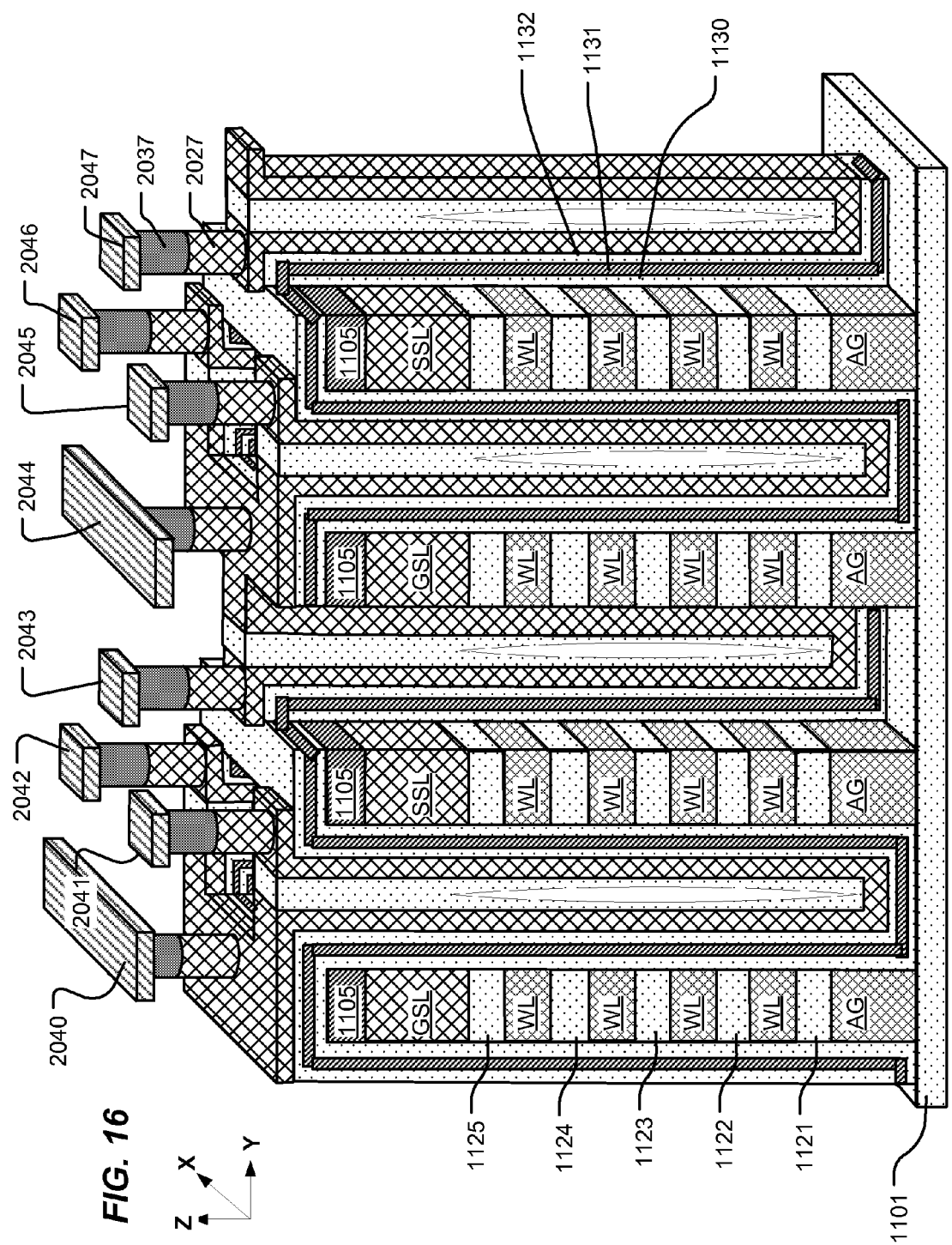

FIG. 16 illustrates the structure after a following stage that includes formation of a first patterned conductor layer including conductor lines 2040, 2044 and posts 2041, 2042, 2043, 2045, 2046, 2047 in contact with the interlayer connectors (e.g. 2037). The patterned conductor lines 2040 and 2044 are connected to the GSL sides of the NAND strings and can be operated as common source lines in some array configurations. The posts 2041, 2042, 2043, 2045, 2046, 2047 provide for interconnection of the SSL sides of the NAND strings through the first patterned conductor layer to overlying patterned conductor layers as described below.

Figure 17:
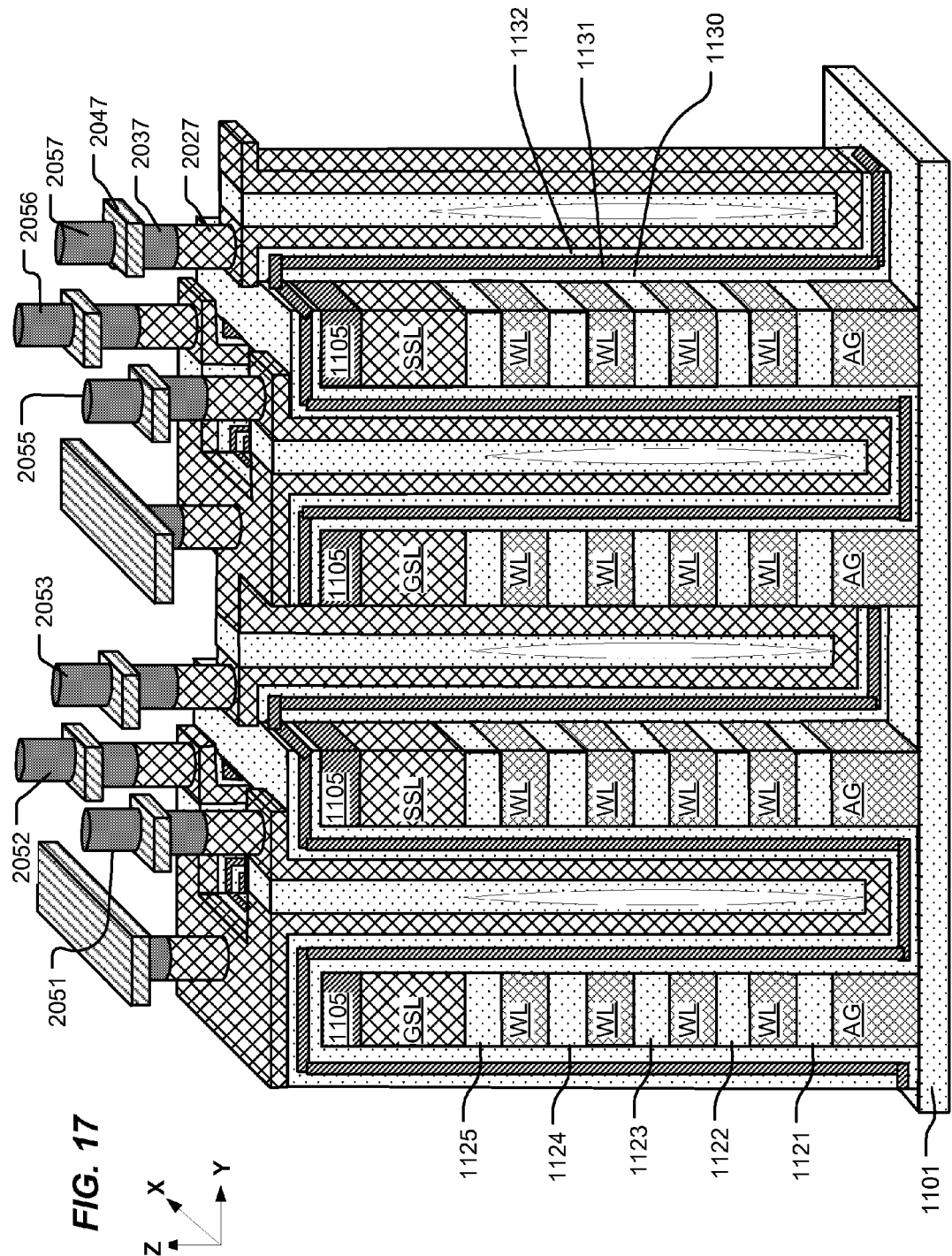

FIG. 17 illustrates the structure after a stage which includes forming of interlayer connectors 2051, 2052, 2053, 2055, 2056, 2057 for making connection of the SSL sides of the NAND strings to overlying patterned conductors via the posts (e.g. 2047) which are formed as described with reference to FIG. 16. The interlayer connectors 2051 can have an oval or elongated shape with a more narrow width (e.g. about 20 nm) in the X dimension to facilitate connection to a dense pattern of overlying bit lines.

Figure 18:
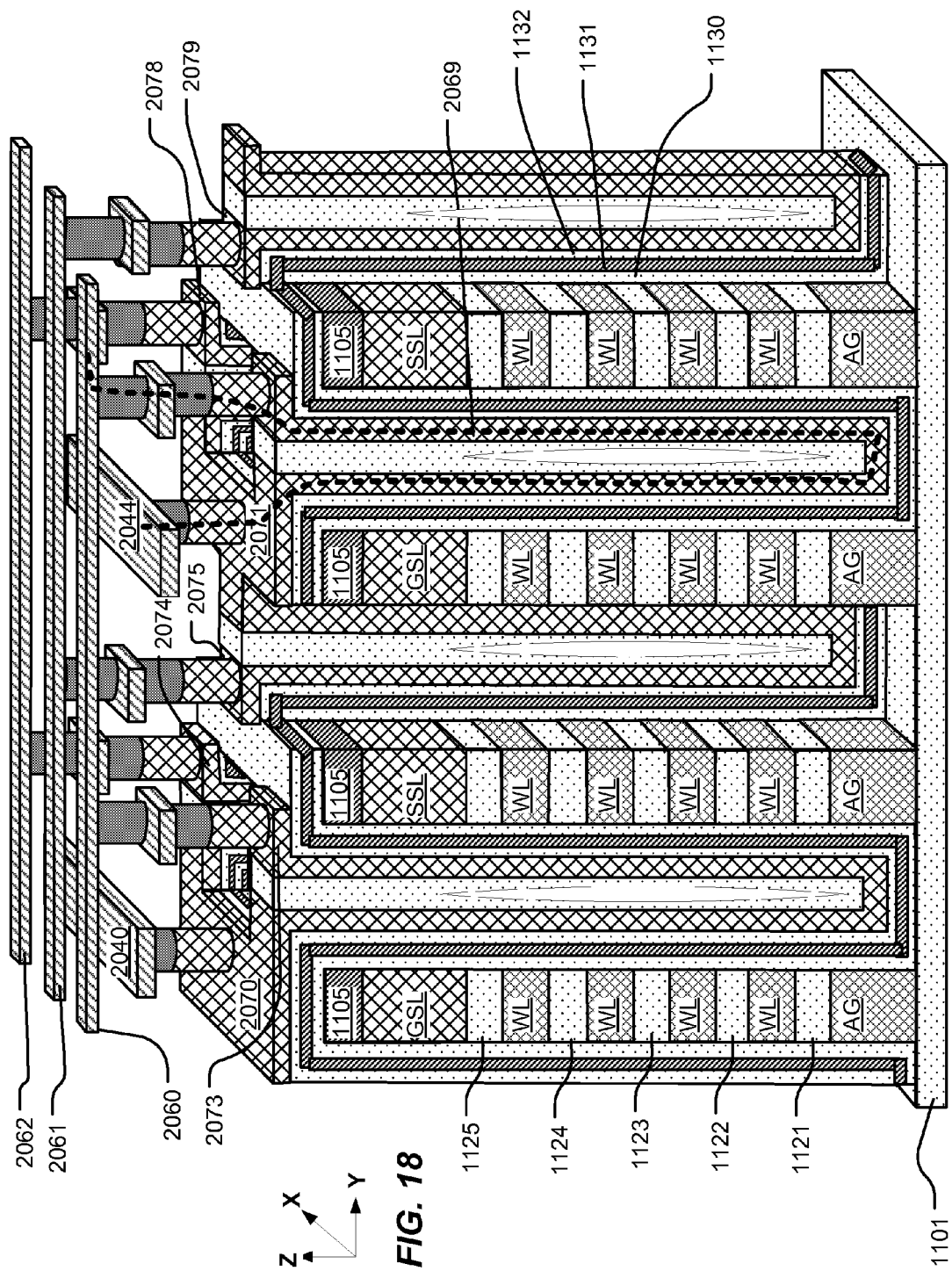

FIG. 18 illustrates the structure after applying a second patterned conductor layer, such as a metal layer in a process flow, over the interlayer connectors 2051, 2052, 2053, 2055, 2056, 2057. The second patterned conductor layer includes bit lines 2060, 2061, 2062 in this example. The bit lines can be patterned using a self-aligned double patterning SADP process to achieve a narrow pitch. As illustrated in FIG. 18, the portion 2070 of the thin-film semiconductor layer which is connected to the vertical channel films on the GSL sides of NAND strings in active pillars along a row is connected by interlayer connectors to conductor line 2040 in the first patterned conductor layer, which acts as a source reference line. Likewise, the portion 2071 of the thin-film semiconductor layer which is connected to the vertical channel films on the GSL sides of NAND strings in active pillars along a row is connected by interlayer connectors to conductor line 2044 in the first patterned conductor layer, which acts as a source reference line. The portions 2073 and 2079 of the thin-film semiconductor layer which are connected to SSL sides of NAND strings in active pillars along a first column in the array are connected by interlayer connectors to a first bit line 2060. The portions 2075 and 2079 of the thin-film semiconductor layer which are connected to SSL sides of NAND strings in active pillars along a column in the array are connected by interlayer connectors to a second bit line 2061. The portions 2074 and 2078 of the thin-film semiconductor layer which are connected to SSL sides of NAND strings in active pillars along a column in the array are connected by interlayer connectors to a third bit line 2062.

A circuit path 2069 is shown in FIG. 18 illustrating the current flow for a U-shaped NAND string which is connected between the source reference conductor line 2044 in the bit line 2060. The structure shows a plurality of active pillars between corresponding even and odd stacks of conductive strips. The active pillars comprise semiconductor films having outside surfaces and inside surfaces. The outside surfaces are disposed on the data storage structures on the sidewalls of the corresponding even and odd stacks forming a 3D array of memory cells. The memory cells are connected to form a current path from an upper and to a lower end of the even vertical channel film, and from a lower end to an upper end of the odd vertical channel film.

FIG. 18 shows a memory device in which stacks of conductive strips are separated by trenches. Referring to the conductive strips in first and second stacks, a configuration for interconnection to the U-shaped NAND strings can be described. The first and second stacks of conductive strips have sidewalls on first and second sides of the trench separating the stacks. Data storage structures are formed on the sidewalls of the strips in the trenches. Vertical channel structures are disposed in the trenches between the first and second stacks. Each vertical channel structure includes a first semiconductor film and a second semiconductor film disposed vertically in contact with the data storage structures on opposing sides of the trench, which are electrically connected at the bottom of the trench. An upper strip in a first stack is configured as a gate of a first switch, e.g. an SSL switch, having a channel in the first semiconductor film, and an upper strip of a second stack is configured as a gate of a second switch, e.g. a GSL switch having a channel in the second semiconductor film. Intermediate strips in the first and second stacks are configured as word lines. Bottom strips in the first and second stacks are configured as assist gates. A patterned conductor layer or layers overlie the stacks. A first interlayer connector connects a first conductor (e.g. bit line 2060) to a top surface of the first semiconductor film in an active pillar. A second interlayer connector connects a second conductor (e.g. source reference conductor line 2040) to a top surface of the second semiconductor film in a vertical channel structure. Also, additional vertical channel structures disposed between the same first and second stacks are configured so that the second semiconductor films on the second side of the trench are all electrically connected, and can share connection to the same source reference line. Furthermore, the additional vertical channel structures between the same first and second stacks are configured so that the first semiconductor films on the first side of the trench are electrically separated, and can be individually connected to separate bit lines using individual interlayer connectors (e.g. third interlayer connectors).

A vertical channel structure between the third stack and the second stack includes a first semiconductor film along the first side of the trench on the sidewall of the second stack between the third and second stacks, and a second semiconductor film along a second side of the trench between the third and second stacks. The first semiconductor film of the vertical channel structure between the third stack and the second stack can be electrically connected (by portion 2071) to the second semiconductor film of the vertical channel structure between the first stack and the second stack.

For the U-shaped NAND strings shown in FIG. 18, one bias arrangement that can be applied to program a selected cell is provided in TABLE 1. Particular bias arrangements can be adapted to given implementations by empirical testing, by simulation, or by both.

TABLE 1

| PROGRAM BIAS | |
|---|---|
| SELECTED WL | Vpgm (e.g. ISPP~+15 V stepping to~+24 V) |
| OTHER WLs: | Vpass, pgm (e.g.~+9 V) |
| ALL GSL's | ~0 V or −1 V |
| SELECTED SSL: | Vdd (e.g.~+3 V) |
| UNSELECTED SSL | Vinh. Read (e.g.~0,~−1 V) |
| IGs: | Vpass, pgm (e.g.~+9 V) |
| SELECTED BLs: | Vsense (e.g.~0 V) |
| UNSELECTED BLs: | Vinh (e.g.~+Vdd) |
| SLs: | Vref (e.g.~+3 V) |

For the U-shaped NAND strings shown in FIG. 18, one bias arrangement that can be applied to erase a selected cell is provided in TABLE 2. Particular bias arrangements can be adapted to given implementations by empirical testing, by simulation, or by both.

TABLE 2

| ERASE BIAS | |
|---|---|
| ALL WLs | ~0 V |
| ALL GSLs | Floated, or ~+7 V |
| IGs: | Floated |
| ALL BLs: | ~+20 V |
| ALL SLs: | Floated, or ~+7 V |

For the U-shaped NAND strings shown in FIG. 18, one bias arrangement that can be applied to read a selected cell is provided in TABLE 3. Particular bias arrangements can be adapted to given implementations by empirical testing, by simulation, or by both.

TABLE 3

| READ BIAS | |
|---|---|
| SELECTED WL:: | Vref (Vref1, Vref2, Vref3 for multiple bit per cell) |
| OTHER WLs: | Vpass, read (e.g. ~+7 V) |
| SELECTED GSL/SSL: | Vsel, read (e.g. ~+5) |
| UNSELECTED SSL | Vinh. Read (e.g. 0, −1 V) |
| IGs: | Vpass, read (e.g. ~+7 V) |
| SELECTED BLs: | Vsense (e.g. +0.7 V) |
| SLs: | Vref (e.g. 0 V) |

Figure 19:
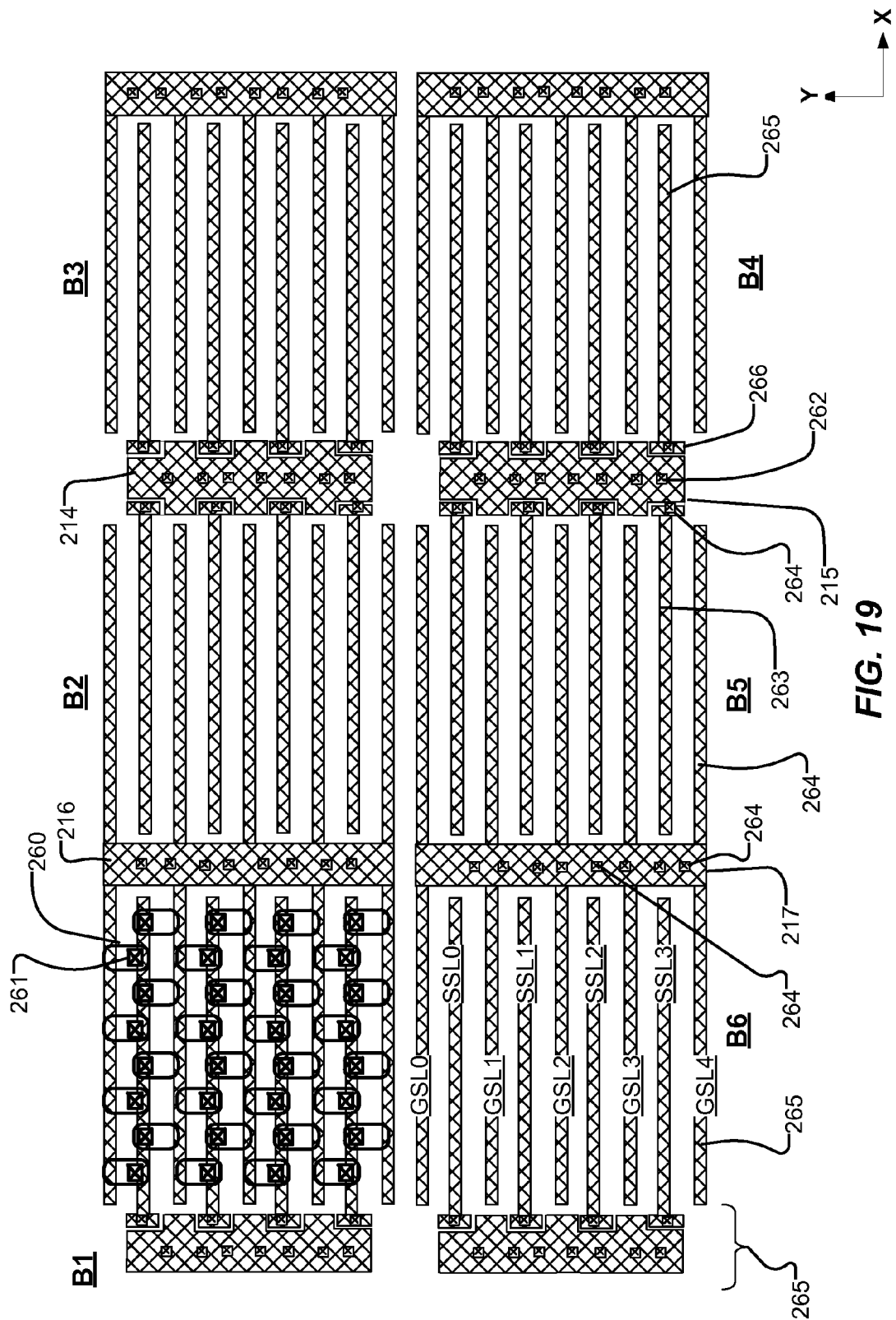
FIG. 19 illustrates a layout view of word line, SSL and GSL structures for a 3D NAND as described herein.

FIG. 19 illustrates a layout view of a plurality of 3D blocks of a memory array comprising U-shaped NAND strings as described above. In the layout illustrated, there are six blocks B1-B6 arranged into rows. Along the rows, they are laid out in a mirror image format. The pattern of an upper layer in the plurality of stacks of conductive strips is illustrated, where the conductive strips extend from a landing pad area shared in common with other conductive strips in the block. The intermediate and lower layers in the plurality of stacks have the same layout and can be formed in the same patterning step, with the exception that the conductive strips configured as SSL lines are cut to provide for individual contacts. Each block includes strips extending from a first landing area (e.g. areas 214 and 215) configured for SSL lines, and underlying even word lines, and strips extending from a second landing area (e.g. areas 216 and 217) configured for GSL lines and underlying odd word lines. The landing areas can support strips in adjacent blocks. Thus, the landing area 216 is used for conductive strips laid out in mirror image in blocks B1 and B2. The landing area 214 is used for conductive strips laid out in mirror image in blocks B2 and B3.

The SSL lines in the upper layer of the stacks are separated into individual landing areas. Thus, for example, an SSL line 263 in a block B5 connects to the landing pad area 264 and an SSL line 265 in block B4 connects to the landing pad area 266. Interlayer conductors, represented by the symbol 262, are connected to the respective SSL landing areas (e.g. 264, 266). Also, the diagram schematically illustrates interlayer connectors which go through the upper layer of the stack to make individual connection to each of the underlying layers in a stairstep fashion, for example. Thus, the GSL pads (e.g. on landing area 216) include eight interlayer connectors, one for a top layer, six for intermediate layers which include the odd word lines, and one for the bottom layer which can include the assist gate or another word line, for example. The SSL pads (e.g. on landing area 215) include the separate interlayer connectors for each of the SSL landing areas (e.g. 266), and seven interlayer connectors for connection to underlying layers, including six for the intermediate layers which include the even word lines, and one for the bottom layer which can include the assist gate or another word line, for example.

The conductive strips extending from the GSL areas (e.g. 217) are laid out in an interdigitated fashion with the conductive strips extending from the SSL areas (e.g. 215). As illustrated by the labeling block B6, the upper layer of the stack includes five GSL lines GSL0-GSL4 and four SSL lines SSL0-SSL3. In this layout, all of the GSL lines GSL4-GSL4 are connected in common to a landing area on the top layer of a GSL stack such as the stack on GSL area 217.

The structure supports formation of an array of active pillars laid out as illustrated by the labeling of block B1. In block B1, an active pillar is represented by the symbol 260 and its interlayer conductor for connection to the bit line is indicated by the symbol 261. The interlayer conductor for connection to the source reference line is not illustrated to reduce crowding in the figure. A row of four active pillars is arrayed along the upper side of each SSL line and four active pillars are arrayed along a lower side of each SSL line offset in the horizontal direction from the active pillars on the upper side of the SSL line, by the bit line pitch. This results in eight active pillars on each SSL line, four on each side. The number of word lines in this layout with eight layers of conductive strips, one of which provides GSL and SSL lines, and one of which provides assist Gates, allows for six layers of word lines. This results in a U-shaped NAND string in each active pillar that includes 12 memory cells arranged in series. The number of layers of conductive strips is a factor which determines the number of memory cells in the U-shaped NAND strings. The number of active pillars on each SSL line determines the number of bits which can be connected to bit lines simultaneously from a single block in this configuration.

FIG. 20 is a cross-section taken in the XY plane through an intermediate layer in the 3D block, intersecting conductive strips configured as word lines. The cross-section illustrates a layout view with the insulating structures within an active pillar comprising a gap. For example, the insulating structure in the active pillar between conductive strips 3003 and 3004, and that includes the thin-channel film 3063 and the thin-channel film 3064, also includes an insulating structure that comprises a series of gaps including the gap 3060, and thin insulator layers 3061 and 3062 on the inside surfaces of the thin-channel films 3063, 3064. When the thin-channel films 3063, 3064 comprise silicon, such as polysilicon, the thin insulator layers 3061 and 3062 can comprise silicon oxide. Further, the insulator structures between the vertical active pillars comprise gaps (e.g. 3070) with thin insulator liners 3071. The gaps (e.g. 3060) in the insulator structure between the vertical active pillars and the gaps (e.g. 3070) in the insulator structure between the thin-channel films may be contiguous as is shown in FIG. 20.

In the layout shown in FIG. 20, the conductive strips 3001, 3002, 3003, 3004 are illustrated. Each of the conductive strips is disposed in a separate stack of conductive strips. Active pillars are disposed between the conductive strips. Active pillars in this example include a dielectric charge trapping structure represented by the multiple dielectric layers 3010-3012. Representative types of dielectric charge trapping structures are discussed above. The dielectric layer 3010 can be a blocking dielectric which includes one or more layers of dielectric contacting the conductive strip 3002. The dielectric layer 3011 can be a charge storage layer which includes one or more layers of dielectric contacting the blocking dielectric layer 3010. The dielectric layer 3012 can be a tunneling layer implemented using one or more layers of dielectric contacting layer 3011 and the outside surface of the thin-film semiconductor layer 3013 which acts as a vertical channel film. The thin-film semiconductor layer 3022 is the vertical channel film for the memory cell on the opposing side wall of the stack, and coupled with the conductive strip 3001.

There are two cells in a frustum of an active pillar at corresponding layers of conductive strips. Thus, the active pillar adjacent to the insulating structure includes a cell 3030 contacting the conductive strip 3004, and a cell 3031 contacting the conductive strip 3003. The insulating structure with the gap separates the cells 3030 and 3031. The memory cells in the layer illustrated in FIG. 20 include cells disposed on a first side of the conductive strip, such as cell 3031 on a first side of the conductive strip 3003, and cells disposed on a second side of the same conductive strip, such as cell 3033 disposed on a second side of the conductive strip 3003. The cells along a first side of a conductive strip (e.g. cells 3031, 3035 3036) are arranged with a uniform pitch P in the X direction along the first side of the conductive strip 3003. Also, the cells along an opposing side of the same conductive strip (e.g. cells 3033, 3037, 3038) are arranged with a uniform pitch P in the X direction along the second side of the conductive strip 3003. In this embodiment, the cells on the first side of the conductive strip are offset in the X direction by one half of the uniform pitch (½ P) from the cells on the second side of the conductive strip. This results in a layout allowing a tighter pitch for overlying bit lines. The length of the pitch P is selected to meet manufacturing requirements for the formation of the stacks of conductive strips, and the structures on the sidewalls of the stacks as described above. In some examples, the pitch can be on the order of 60 to 100 nm.

FIG. 21, like FIG. 20, is a cross-section taken in the XY plane through an intermediate layer in the 3D block, intersecting conductive strips configured as word lines. The reference numbers applied in FIG. 20 for corresponding structures are used again in FIG. 21, and not described again. The cross-section through a layer in the block illustrates a layout view with an insulating fill between the vertical channel structures providing the insulating structure (e.g. insulators 3040, 3041, 3042, 3043, 3044, 3045, 3046) isolating the channels of adjacent cells along a conductive strip. Also, the layout shown in FIG. 21 illustrates an embodiment in which the insulating structure between the thin-channel films within the active pillars is a solid insulator. The solid insulator can be implemented using a dielectric such as silicon dioxide. In the layout, the conductive strips 3001, 3002, 3003, 3004 are illustrated.

In a representative structure, the width of the channel for a memory cell is determined by the width in the X direction of the thin-channel films 3063, 3064 and can be on the order of 30 to 50 nm. The length of the channel for the memory cell is determined by the thickness of the horizontal conductive strips 3003, 3004 in the Z direction and can be on the order of 30 to 50 nm. The thickness of the thin-channel films in the Y direction is determined by the thickness of the semiconductor film used to form the structures, and can be thin enough, e.g. less than or equal to 10 nm, to provide performance improvement such as reducing short channel effects.

The spacing between the conductive strips 3003, 3004 is selected according to the manufacturing processes. In an example as described herein with multiple layers deposited, polysilicon spacer etching which opens the bottom of the trenches, and an air gap in the insulating structure within the active pillars which reduces back-to-back channel coupling, the spacing between the conductive strips 3003, 3004 can be on the order of 120 to 160 nm. The widths of the conductive strips in the Y direction for a representative example can be on the order of 30 to 50 nm.

As mentioned above, a vertical channel film cut pattern and etch is executed to separate the active pillars between the stacks of conductive strips. In the layout view shown in FIG. 20 and FIG. 21, the hole cuts through the dielectric charge trapping structure can expose the sidewalls of the conductive strips in the stacks of conductive strips or, as illustrated in FIGS. 20 and 21, leave only a small portion of the blocking dielectric layer of the dielectric charge trapping structure. The pattern of hole cuts of FIGS. 20 and 21 results in the width of the thin-channel strip being about the same as the width of the dielectric charge trapping structure in each active pillar.

Figure 22A:
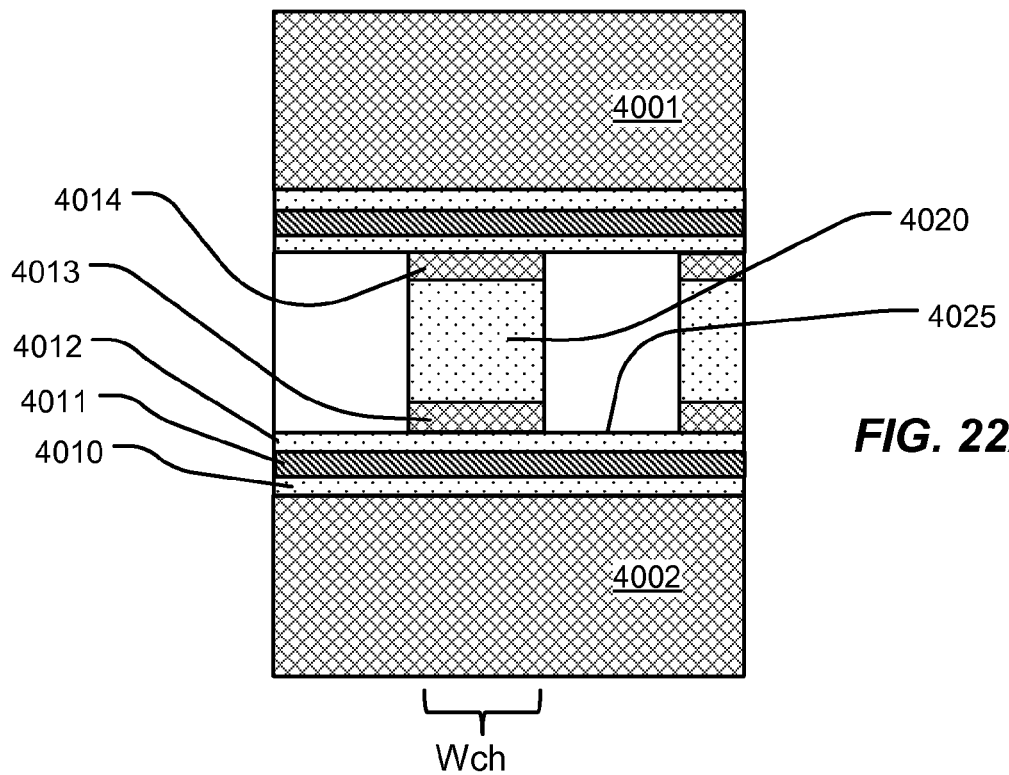
FIGS. 22A-22B illustrate alternative embodiments of active pillars for a 3D NAND structure as described herein.
Figure 22B:
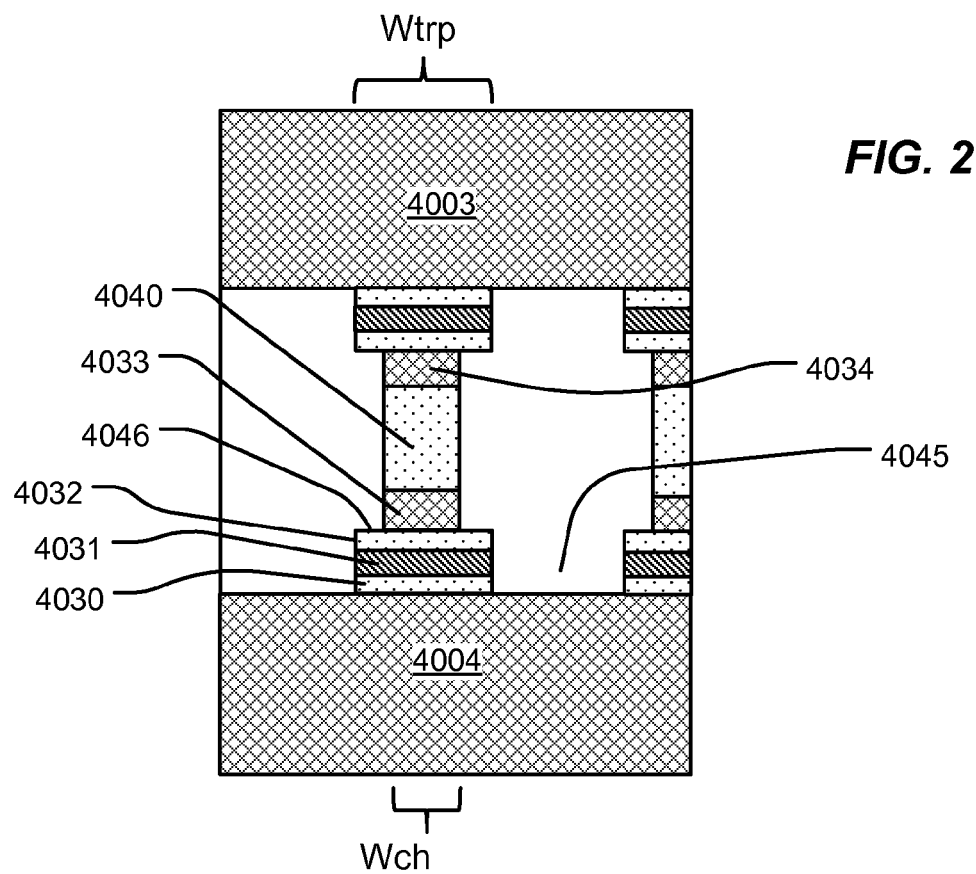

FIGS. 22A and 22B illustrate alternative hole cut patterns for formation of the insulating structures between the active pillars. In FIG. 22A, the patterned hole etch does not remove the dielectric charge trapping structure between the active pillars. Thus, the multilayer dielectric structure used as the dielectric charge trapping structure for each active pillar includes a tunneling layer 4012, a charge trapping layer 4011, and a blocking layer 4010 which is continuous along the conductive strips 4001, 4002. As illustrated, an insulating structure 4020 separates the thin-channel films 4013, 4014. The dielectric charge trapping structure extends in the region 4025 between the adjacent active pillars. The thin-channel films 4013, 4014 have a channel width Wch which is determined by the hole etch.

In FIG. 22B, the structure is illustrated which results from the patterned hole etch like that used to form the structure of FIGS. 20 and 21, followed by a slight lateral recess etch of the thin-film semiconductor acting as the thin-channel films. Thus, the dielectric charge trapping structure includes a segment 4046 for each active pillar including a tunneling layer 4032, a charge trapping layer 4031, and a blocking layer 4030 along the conductive strip 4004. A mirror image charge trapping structure is disposed on the conductive strip 4003. The dielectric charge trapping structure has a width Wtrp determined by the hole etch, such that gaps (e.g. 4045) separate multiple dielectric layers used for charge trapping structures along the conductive strips. The thin-channel films 4033, 4034 have widths Wch which are less than the width Wtrp slightly. As illustrated, an insulating structure 4040 separates the thin-channel films 4033, 4034. The charge trapping structure and recessed thin-channel film results in a memory cell having better device windows.

Figure 23:
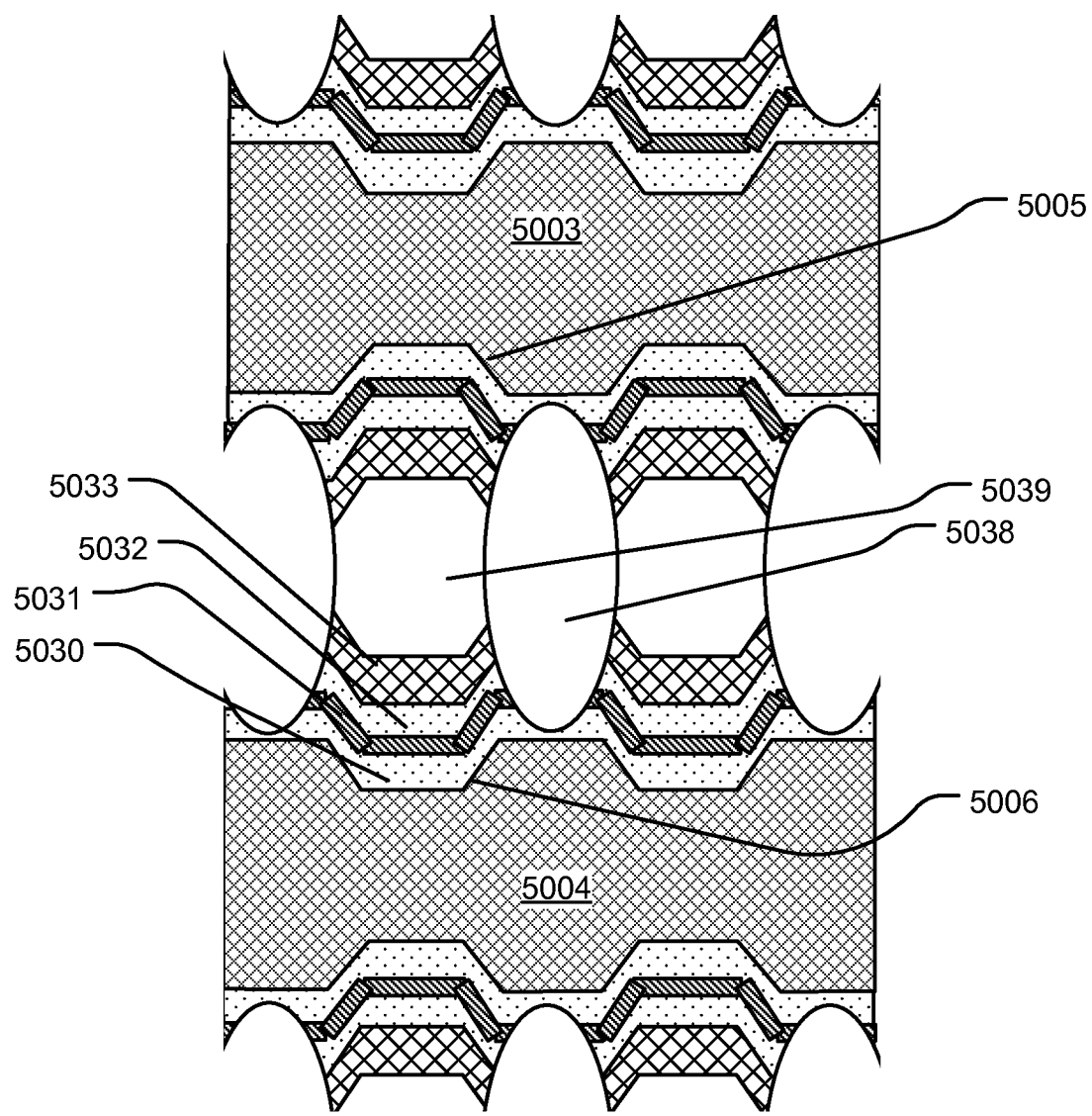
FIG. 23 illustrates yet another alternative embodiment of an active pillar for a 3D NAND structure.

FIG. 23 illustrates an alternative layout pattern, in which the conductive strips 5003, 5004 have crenellated sidewalls 5005, 5006. This crenellated effect can be created for example by replacing the patterned line etch used to create the structure of FIG. 8 with a pair of patterned hole etches, including a first pattern of larger diameter holes, combined in any order with a second pattern of smaller diameter holes. The deposition of the dielectric layers to form the dielectric charge trapping structure on crenellated sidewalls 5005, 5006 results in a curved layout including a blocking layer 5030, a charge trapping layer 5031, and a tunneling layer 5032 contacting a curved thin-channel film 5033. The curvature of the thin-channel film 5033 in the dielectric charge trapping structure can produce a mild field enhancement effect for the charge trapping memory cell. In the illustrated embodiment, air gaps 5039 provide insulating structures within the active pillars, separating the thin-channel films, and air gaps 5038 provide slated structures between the active pillars.

Figure 24:
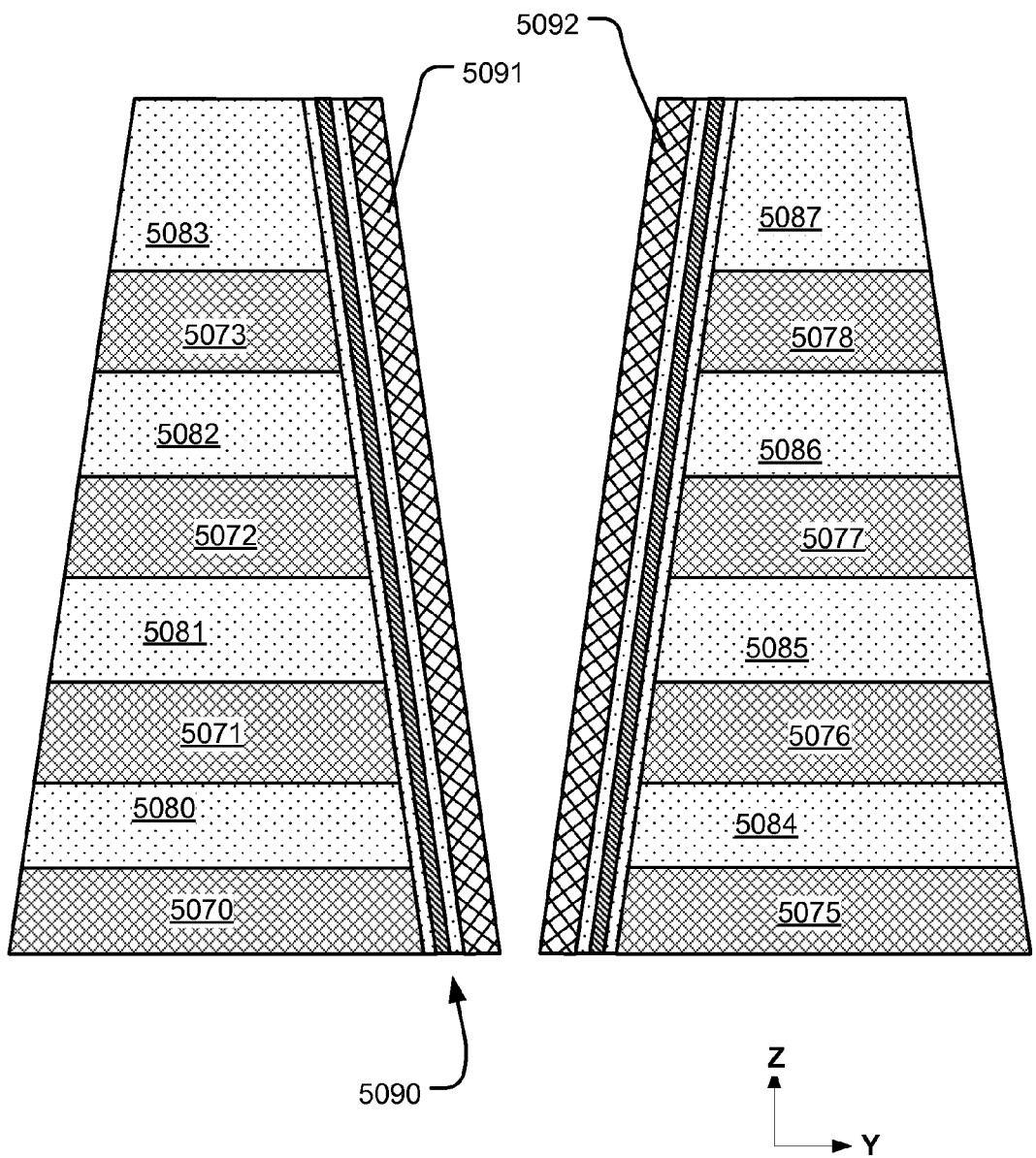
FIG. 24 illustrates aspects of a thin-channel film on sidewalls of a stack of conductive strips as described herein.

FIG. 24 illustrates the uniformity of the thin-channel films which can be achieved using the thin-film deposition process discussed above with respect to FIG. 10. In FIG. 24 a first stack of conductive strips including conductive strips 5070, 5071, 5072, 5073, with alternating insulating layers 5080, 5081, 5082, 5083 is illustrated adjacent a second stack of conductive strips including conductive strips 5075, 5076, 5077, 5078, with alternating insulating layers 5084, 5085, 5086, 5087. The stacks are illustrated with sides having an exaggerated slope, representing a result of a deep etch, which may not have perfectly vertical sidewalls. Using a thin-film process, as opposed to a fill process, the thickness of the thin-film layers 5091, 5092 on the sidewalls of the stacks, over the dielectric charge trapping layers (e.g. 5090) can be very uniform over the entire depth of the stack. This uniformity and the thickness of the thin-films, used to form the vertical thin-channels can improve uniformity of operation of the memory cells in the 3D array.

Figure 25:
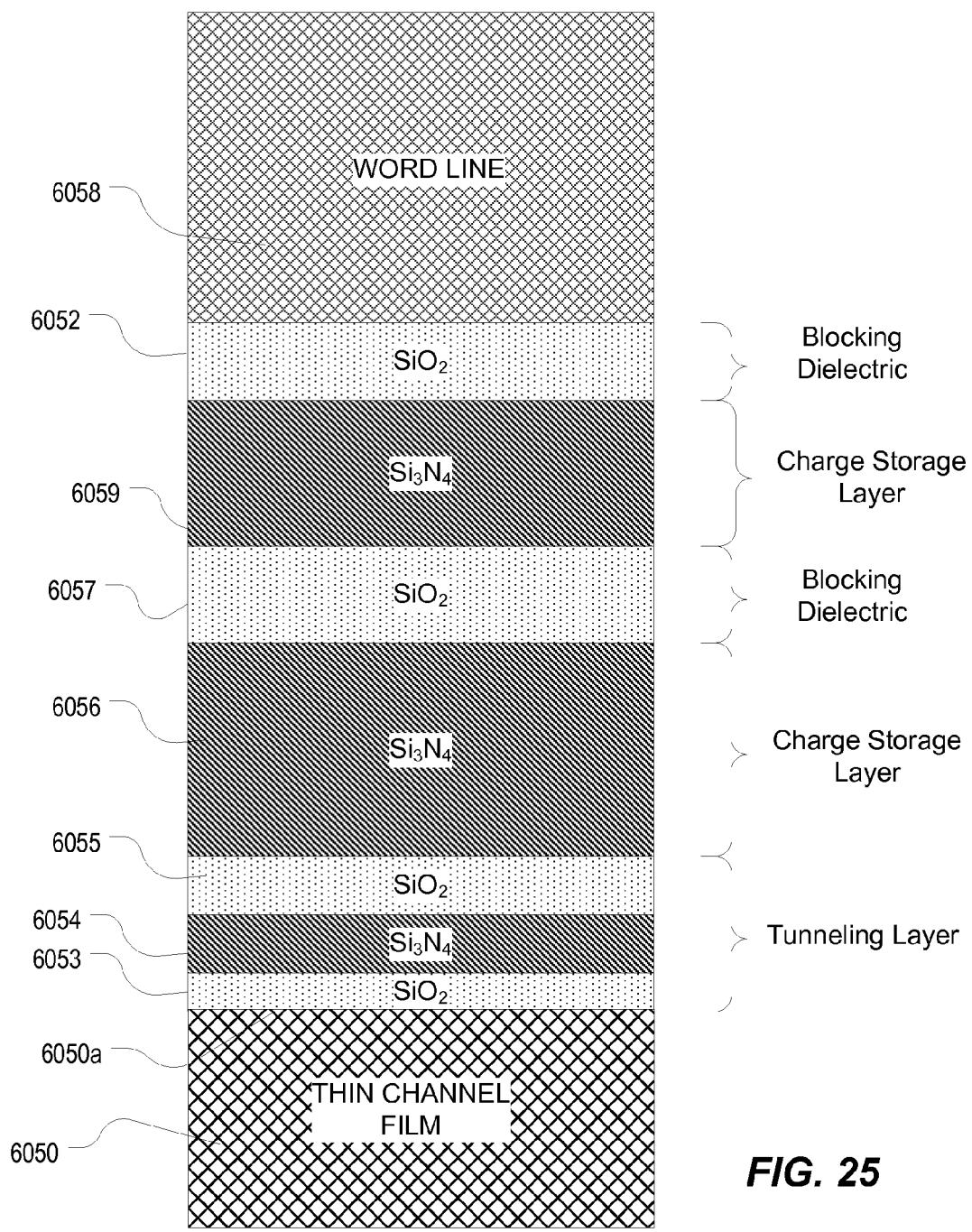
FIG. 25 illustrates one type of data storage structure which can be utilized in 3D NAND memory as described herein.

FIG. 25 is a simplified diagram of an improved BE-SONOS dielectric charge storage layer that can be utilized in the structure described herein.

The dielectric charge trapping structure includes a tunneling layer in contact with the vertical channel structure 6050, comprises a composite of materials, includes multiple layers, including a first tunneling layer 6053 of silicon oxide, a tunneling layer 6054 of silicon nitride, and a second tunneling layer 6055 of silicon oxide.

The first tunneling layer 6053 of silicon dioxide on the surface 6050a of the channel structure 6050 is formed for example using in-situ steam generation ISSG with optional nitridation by either a post deposition NO anneal or by addition of NO to the ambient during deposition. The thickness of the first tunneling layer 6053 of silicon dioxide is less than 20 Å, and preferably 7-15 Å. The first tunneling layer 6053 can be engineered with alternatives such as nitrided oxide for improved endurance, and/or fluorine treatments for improved interface state quality.

The tunneling layer of silicon nitride 6054, also referred to as a tunneling nitride layer, lies on the first tunneling layer 6053 of silicon oxide formed for example using low-pressure chemical vapor deposition LPCVD, using for example dichlorosilane DCS and $NH_3$ precursors at 680 degrees C. In alternative processes, the tunneling nitride layer comprises silicon oxynitride, made using a similar process with an $N_2O$ precursor. The thickness of the layer 6054 of silicon nitride is less than 30 Å, and preferably 10-30 Å, including for example 20 Å. Because of its thinness, layer 6054 is poor at storing charge.

Layer 6054 provides a low hole barrier height to facilitate hole injection for —FN erasing. However, layer 6054 has a low trapping efficiency. Various materials for layer 6054, along with their valence band offsets with silicon are: $SiO_2$ 4.4 eV, $Si_3N_4$ 1.8 eV, $Ta_2O_5$ 3.0 eV, $BaTiO_3$ 2.3 eV, $BaZrO_3$ 3.4 eV, $ZrO_2$ 3.3 eV, $HfO_2$ 3.4 eV, $Al_2O_3$ 4.9 eV, $Y_2O_3$ 3.6 eV, $ZrSiO_4$ 3.4 eV. $Si_3N_4$ has the lowest hole barrier height with 1.8 eV, although other materials are possible.

The second tunneling layer 6055 of silicon dioxide lies on the tunneling layer 6054 of silicon nitride and is formed for example using LPCVD high temperature oxide HTO deposition. The thickness of the second tunneling layer 6055 of silicon dioxide is less than 45 Å, and preferably 15-45 Å, for example 30 Å. The second tunneling layer 6055 provides sufficient barrier thickness to block charge loss for improved charge retention. The second tunneling layer 6055 blocks direct tunneling leakage. Other low leakage oxides such as $Al_2O_3$ are possible.

A first charge storage layer 6056 in this embodiment comprises silicon nitride having a thickness greater than 45 Å, and preferably 45-80 Å, including for example about 55 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006, now U.S. Pat. No. 7,612,403. High charge trapping efficiency alternatives are oxynitride, silicon-rich nitride, embedded nanoparticles, and $HfO_2$.

A first blocking layer 6057 of silicon dioxide lies on the first charge storage layer 6056 and is formed for example using LPCVD high temperature oxide HTO deposition. The thickness of the first blocking layer 6057 of silicon dioxide is less than 70 Å, including for example a range of 55-70 Å, including for example 50 Å. The first blocking layer 6057 provides sufficient barrier thickness to block charge mixing and charge transport between the charge storage layers 6056 and 6059. Other low leakage oxides such as $Al_2O_3$ are possible.

A second charge storage layer 6059 in this embodiment comprises silicon nitride having a thickness greater than 30 Å, including for example a range of 30-60 Å, including for example about 40 Å in this embodiment formed for example using LPCVD. Other embodiments are similar to the first charge trapping layer. The second charge storage layer 6059 traps electrons during —FN erasing to stop gate electron injection, allowing continuous erase of first charge storage layer 6056 by channel hole injection. High charge trapping efficiency alternatives are oxynitride, silicon-rich nitride, embedded nanoparticles, and $HfO_2$.

A second blocking layer 6052 of silicon dioxide lies on the second charge storage layer 6059 and is formed for example using LPCVD high temperature oxide HTO deposition. The thickness of the second blocking layer 6052 of silicon dioxide is less than 60 Å, including for example a range of 30-60 Å, including for example 35 Å.

Finally, a layer 6058 of gate material, such as a thin-film semiconductor layer configured as a vertical channel film, is formed on the second blocking layer 6052.

Figure 26:
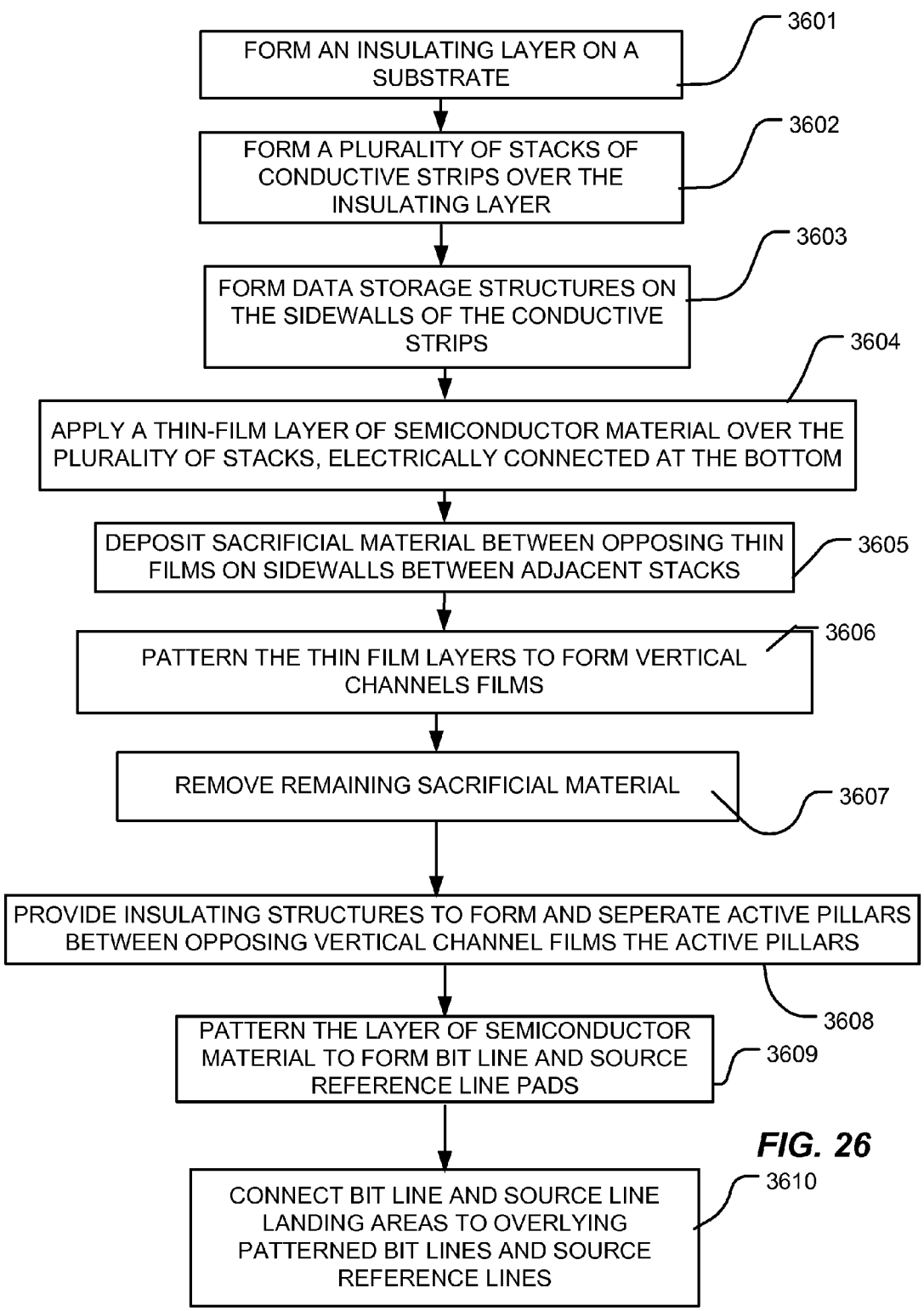
FIG. 26 is a flow chart illustrating a method for manufacturing a double gate vertical channel structure.

FIG. 26 is a flow chart illustrating a method for manufacturing a memory device. The method includes identifying areas on a substrate for formation of 3D memory blocks having a structure like that of FIG. 19. For each area, the method includes forming an insulating layer on the substrate by, for example, depositing a layer of silicon dioxide, or other dielectric material or combination of materials on the substrate (3601). Over the insulating layer (e.g., 1101 in FIG. 18), the process includes forming a plurality of layers of a first conductive material, suitable to act as word lines, separated by insulating material, and etching the plurality of layers to define a plurality of stacks (1111, 1112, etc.) of conductive strips (3602). The stacks can include at least a bottom plane (assist gates) of conductive strips, a plurality of intermediate planes (WLs) of conductive strips, and a top plane of conductive strips (SSLs and GSLs).

The method includes forming a memory layer on side surfaces of conductive strips in the plurality of stacks to provide data storage structures (3603). The memory layer can comprise a dielectric charge trapping structure as discussed above with reference to FIGS. 9 and 25. The memory layer contacts side surfaces of the plurality of conductive strips.

The method includes forming a thin-film layer (e.g. 1140 in FIG. 10) of a semiconductor material over and having a surface conformal with the memory layer on the plurality of stacks. The thin-film extends down the sidewalls of the trenches between the stacks, and over the bottom of the trenches (3604).

A sacrificial material is deposited between the opposing thin-films on the sidewalls of adjacent stacks as discussed with reference to FIG. 11 (3605)

The structures between the plurality of stacks of conductive strips, including the sacrificial material, are etched using a pattern of holes to define thin vertical channel films in the regions of the memory cells as discussed with reference to FIG. 12 (3606). The remaining sacrificial material is removed, for example using a selective etching process which etches away the sacrificial material and leaves the vertical channel films intact (3607).

An insulating structure (e.g. fill 1160 in FIG. 11) is provided between the opposing vertical channel films to form active pillars, and further the insulating structure is provided between these formed active pillars (3608). In some embodiments, the insulating structure includes a gap at least in the regions of the memory cells being formed.

The layer of semiconductor material overlying the stacks is patterned to define bit line pads and source reference line pads (3609). The active pillars include one vertical channel film connected to a bit line pad (e.g. portion 2073), and one vertical channel film connected to a source reference line pad (e.g. portion 2070). More than one active pillar can share a source reference line pad. However, each active pillar is connected to a single bit line pad.

The method can further include forming a first overlying patterned conductor layer with interlayer connectors connected to the plurality of bit line pads, including a plurality of global bit lines coupled to sensing circuits, and forming a second overlying patterned conductor layer connected to the source reference line pads, coupled to a reference voltage source as discussed with reference to FIG. 18 (3610). Also, the same or additional patterned conductor layers can include conductors coupled to the SSL strips, to the GSL strips and to the word line pads in the stacks of conductive strips.

As a result of forming the active pillars, memory cells are formed at each frustum of the pillars in interface regions at cross-points on opposing side surfaces of the conductive strips in the plurality of intermediate planes (WLs) with the thin vertical channel films of the plurality of bit line structures. Also, string select switches are disposed at interface regions with the top plane of conductive strips (SSLs) in even stacks, and reference select switches are disposed at interface regions with the top plane (GSL) of conductive strips in odd stacks. The memory layer can comprise dielectric layers that can act as the gate dielectric layers for the string select switches and reference select switches.

With reference to FIG. 26 and other disclosure herein, several aspects of the manufacturing process can be understood. In one aspect, a manufacturing method is described which includes forming first and second stacks of conductive strips having sidewalls, forming data storage structures on the sidewalls of the first and second stacks, and forming first and second opposing vertical channel films on the data storage structures, leaving a gap between the first and second opposing vertical channel films. The first and second opposing vertical channel films are connected to form a U-shaped current path which can be configured as a U-shaped NAND string. Also, a first pad is formed over the first stack connected to a first vertical channel film, and a second pad is formed over the second stack connected to the second vertical channel film. The first pad can be connected to a bit line, and the second pad can be connected to a source reference line. As a result of the structure formed, a current path from the pad over the first stack to the pad over the second stack is provided through the semiconductor film, which can be operated as a U-shaped NAND string.

Figure 27:
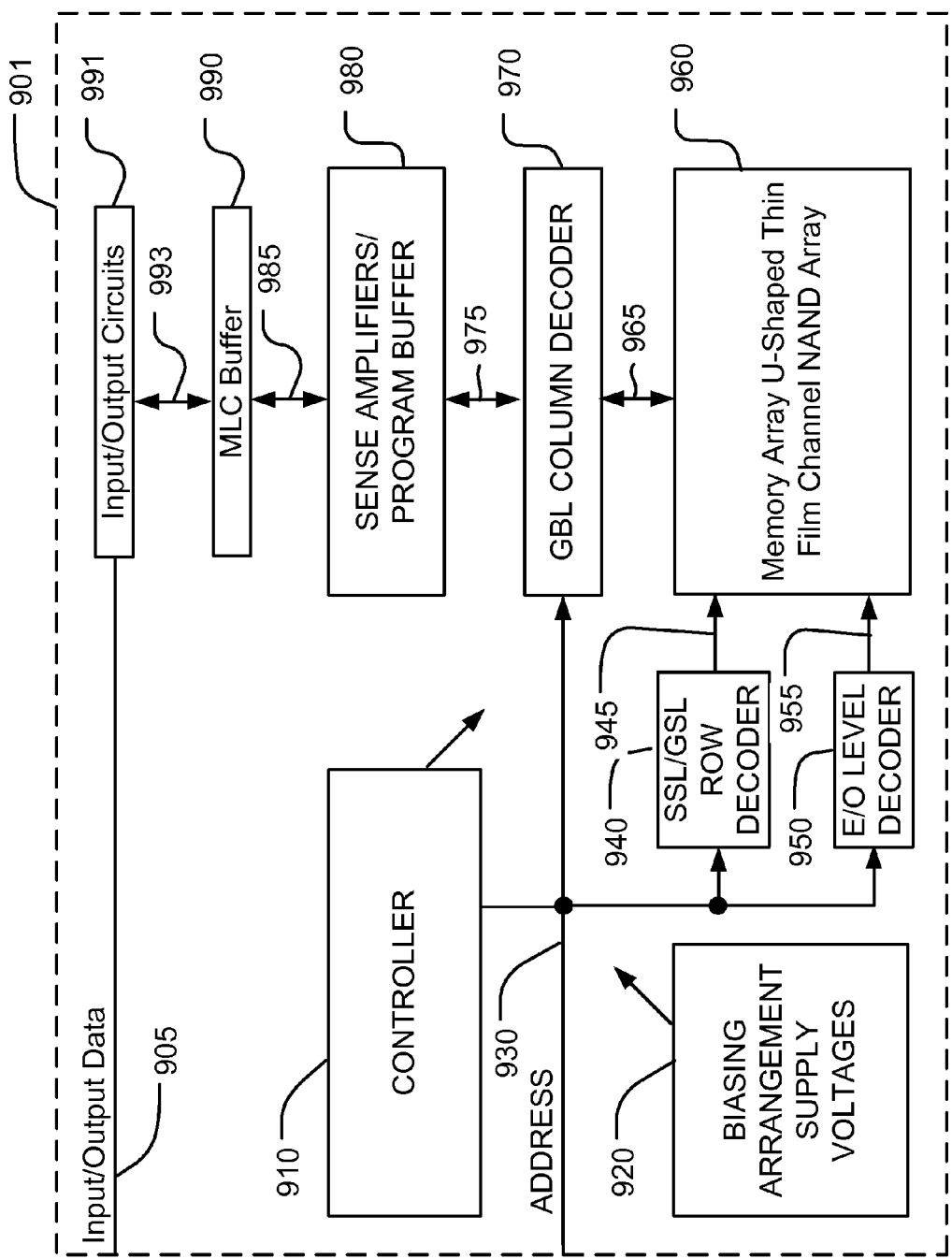
FIG. 27 is a block diagram of an integrated circuit memory including a 3D memory array having thin-channel film structures.

FIG. 27 is a simplified chip block diagram of an integrated circuit 901 including a 3D, vertical thin-channel film NAND array. The integrated circuit 901 includes a memory array 960 including one or more memory blocks as described herein with U-shaped NAND strings comprising vertical channel cells on an integrated circuit substrate.

An SSL/GSL decoder 940 is coupled to a plurality of SSL/GSL lines 945, arranged in the memory array 960. An even/odd level decoder 950 is coupled to a plurality of even/odd word lines 955. A global bit line column decoder 970 is coupled to a plurality of global bit lines 965 arranged along columns in the memory array 960 for reading data from and writing data to the memory array 960. Addresses are supplied on bus 930 from control logic 910 to decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits are supplied via second data lines 985 to multi-level data buffer 990, which is in turn coupled to input/output circuits 991 via a data path 993. Also, input data is applied in this example to the multi-level data buffer 990 for use in support of multiple-level program operations for each of the independent sides of the independent double gate cells in the array.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 27, control logic 910, using a bias arrangement state machine, controls the application of supply voltages generated or provided through the voltage supply or supplies in block 920, such as read, erase, verify and program bias voltages. The control logic 910 is coupled to the multi-level data buffer 990 and the memory array 960. The control logic 910 includes logic to control multiple-level program operations. In embodiments supporting the U-shaped vertical NAND structures described herein, the logic is configured to perform the method of:

selecting a layer of memory cells in the array, such as using a word line layer decoder;

selecting a side of the vertical channel structures in the selected layer such as by selecting an even or odd side word line structure;

selecting vertical channel structures in a selected row in the array such as by using SSL switches and GSL switches on the rows of vertical channel structures; and storing charge in charge trapping sites in the selected layer on the selected side of vertical channel structures in one or more selected columns in the array, to represent data using bit line circuitry like page buffers on global bit lines coupled to the selected row of vertical channel structures.

In some embodiments, the logic is configured to select a layer and select a side by selecting one of even and odd interdigitated word line structures in the selected layer of the array, such as by controlling even and odd word line layer decoders.

In some embodiments, the logic is configured to store multiple levels of charge to represent more than one bit of data in the charge trapping sites in the selected layer on the selected side. In this manner, a selected cell in a selected frustum of a vertical channel structure in the array stores more than two bits, including more than one bit on each side of the cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 960 can comprise charge trapping memory cells configured to store multiple bits per cell, by the establishment of multiple program levels that correspond to amounts of charge stored, which in turn establish memory cell threshold voltages $V_T$. As mentioned above, single-bit-per-cell embodiments can include the structures described herein.

Figure 28:
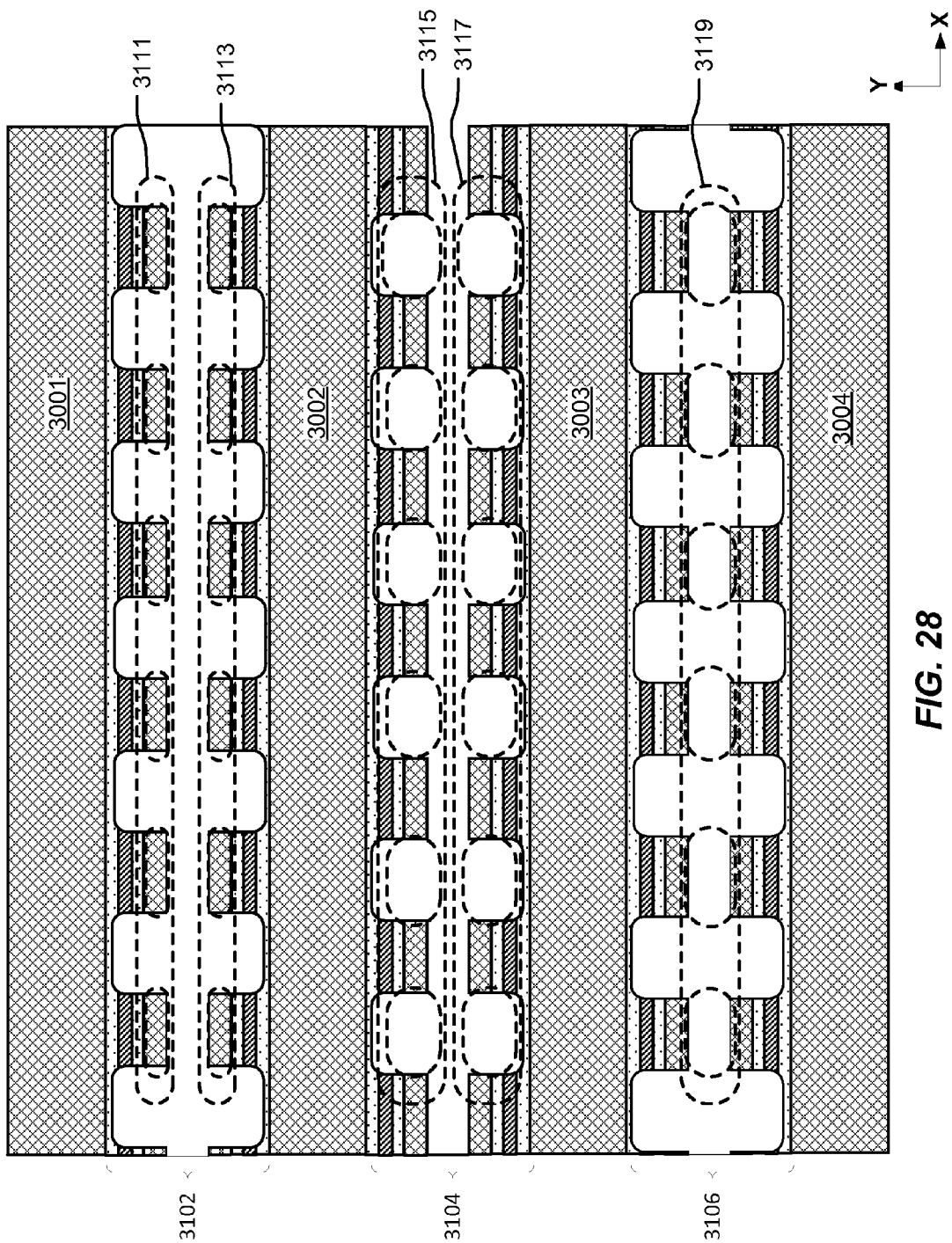
FIG. 28 illustrates in layout view another view of the thin-channel film 3D NAND having gaps that separate opposing vertical channel films shown in FIG. 20.

FIG. 28 illustrates in layout view another view of the thin-channel film 3D NAND having gaps that separate opposing vertical channel films shown in FIG. 20. The description from FIG. 20 generally applies to FIG. 28. The covering insulating liner 3071 from FIG. 20 is removed in FIG. 28 for ease of emphasizing certain parts of the FIG. 28. Various embodiments can remove the insulating liner 3071, include the insulating liner 3071, or partially include the insulating liner 3071.

Trenches 3102, 3104, and 3106 are defined by adjacent stacks of conductive strips 3001, 3002, 3003, and 3004. Trench 3102 is defined by adjacent stacks 3001 and 3002. Trench 3104 is defined by adjacent stacks 3002 and 3003. Trench 3106 is defined by adjacent stacks 3003 and 3004.

First series of vertical channel films 3111 are on the data storage structures on sidewalls of stack 3001. Second series of vertical channel films 3113 are on the data storage structures on sidewalls of stack 3002. Corresponding series of vertical channel films are also in trenches 3104 and 3106.

First series of air gaps 3115 separate adjacent ones of the first series of vertical channel films 3111. Second series of air gaps 3117 separate adjacent ones of the second series of vertical channel films 3113. Corresponding series of air gaps are also in trenches 3102 and 3106.

Third series of air gaps 3119 separate the first series of vertical channel films 3111 from the second series of vertical channel films 3113. Corresponding series of air gaps are also in trenches 3102 and 3104, In an embodiment with the insulating liner 3071 of FIG. 20, respective series of air gaps 3115, 3117, and 3119 shrink according to the volumes of the insulating liner 307. In one embodiment, the series of air gaps 3115, 3117, and 3119 are contiguous within each trench. In another embodiment, the series of air gaps 3115, 3117, and 3119 are contiguous within some but not all trenches.

The vertical channel films in one trench are staggered with respect to the vertical channel films in another trench. For example, the first series of vertical channel films 3111 and the second series of vertical channel films 3113 in trench 3102 are at least partly aligned with the first series of air gaps 3115 and the second series of air gaps 3117 in trench 3104. In another example, the first series of air gaps 3115 and the second series of air gaps 3117 in trench 3104 are at least partly aligned with the third series of air gaps 3119.

In one embodiment, the stacks define alternating even and odd trenches, with the even trenches characterized by the trenches 3102 and 3106, and the odd trenches characterized by trench 3104.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A manufacturing method, comprising:
    forming first and second stacks of conductive strips having sidewalls, the stacks including a plurality of layers of conductive material separated by layers of insulating material, and the first and second stack separated by a trench;
    forming a memory layer over the sidewalls of the first and second stacks and having an outside surface disposed on the first and second stacks and an inside surface opposite the outside surface;
    forming a layer of semiconductor material over the memory layer, the layer of semiconductor material having an outside surface disposed on the inside surface of the memory layer and an inside surface opposite the outside surface of the layer of semiconductor material;
    forming a first flowable dielectric material, the first dielectric material contacting the inside surface of the layer of semiconductor material and filling the trench, lined by the memory layer and the layer of semiconductor material, between the first and second stacks;
    after forming the first and the second stacks of conductive strips, the memory layer, the layer of semiconductor material, and the first dielectric material:
        etching a first pattern through the first dielectric material, the layer of semiconductor material, and the memory layer, wherein (i) the first pattern defines a first vertical channel film from a first portion of the layer of semiconductor material adjacent to a first portion of the memory layer contacting the first stack by removing parts of the first portion of the layer of semiconductor material on opposite sides of the first vertical channel film, (ii) the first pattern defines a second vertical channel film from a second portion of the layer of semiconductor material adjacent to a second portion of the memory layer contacting the second stack by removing parts of the second portion of the layer of semiconductor material on opposite sides of the second vertical channel film, and (iii) the first pattern leaves the first dielectric material in between the first vertical channel film and the second vertical channel film; and
    after etching the first pattern, removing the first dielectric material in between the first vertical channel film and the second vertical channel film.

2. The method of claim 1, further comprising removing the first dielectric material after said etching the pattern, wherein the first dielectric material is a flowable dielectric material.

3. The method of claim 2, wherein removing the first dielectric material includes a selective etching process, wherein the selective etching process has a selectivity for the first dielectric material compared to the memory layer.

4. The method of claim 2, further comprising forming a second dielectric material between the first and second vertical channel films, including leaving a gap between the first and second vertical channel films.

5. The method of claim 1, wherein the memory layer over the sidewalls of the first and second stacks form data storage structures between the sidewalls, of the first and second stacks, and the first and second vertical channel films.

6. The method of claim 1, wherein the first vertical channel film includes a first pad over the first stack on an upper end of the first vertical channel film, and the second vertical channel film includes a second pad over the second stack on an upper end of the second vertical channel film, the first and second vertical channel films being connected at ends distal to the pads to form a current path from the pad over the first stack to the pad over the second stack.

7. The method of claim 6, including forming one or more patterned conductor layers over the first and second stacks, including a bit line and a source line, and interlayer connectors connecting the bit line to the first pad over the first stack and connecting the source line to the second pad over the second stack.

8. The method of claim 1, including before forming the first and second stacks, forming an insulating layer below the first and second stacks, and wherein the first and second vertical channel films are connected across the insulating layer at the bottom of the stacks.

9. The method of claim 1, wherein the first and second vertical channel films have thicknesses less than 10 nanometers.

10. The method of claim 1, further comprising:
wherein forming first and second stacks of conductive strips further includes forming a third stack of conductive strips, the second and third stack separated by a second trench;
wherein forming one or more layers of dielectric material over the sidewalls of the first and second stacks, further includes forming the one or more layers of dielectric material over the sidewalls of the third stack;
wherein forming the first dielectric material further includes the first dielectric material contacting the inside surface of the layer of semiconductor material and filling the second trench, lined by the memory layer and layer of semiconductor material, between the second and third stacks; and
wherein etching the pattern, through the first dielectric material, the layer of semiconductor, and dielectric material layer, further includes forming a honeycomb arrangement of vertical channel structures between the first and second stacks, and second and third stacks, so that each row of vertical channel structures is offset in the row direction from adjacent rows.

11. A memory device including a plurality of memory cells, comprising:
a plurality of stacks of conductive strips having sidewalls, the first plurality of stacks including a plurality of layers of conductive material separated by layers of insulating material, the plurality of stacks defining a first trench and a second trench, each of the first trench and the second trench positioned between opposite sidewalls of adjacent stacks of the plurality of stacks,
wherein the first trench and the second trench each includes:
data storage structures on both of the opposite sidewalls of the conductive strips in the adjacent stacks;
a first series of vertical channel films on the data storage structures on a first one of the opposite sidewalls, wherein adjacent ones of the first series of vertical channel films are separated by a first series of air gaps; and
a second series of vertical channel films on the data storage structures on a second one of the opposite sidewalls, wherein adjacent first series of the second series of vertical channel films are separated by a second series of air gaps,
wherein a third series of air gaps separate the first series of vertical channel films and the second series of vertical channel films, and
wherein the first series of air gaps, the second series of air gaps, and the third series of air gaps are contiguous, and
wherein the first series and the second series of vertical channel films in the first trench are staggered with respect to the first series and the second series of vertical channel films in the second trench.

12. The device of claim 11, wherein the first series and the second series of vertical channel films in the first trench are staggered with respect to the first series and the second series of vertical channel films in the second trench, such that the first series and the second series of vertical channel films in the first trench are at least partly aligned with the first series of air gaps and the second series of air gaps in the second trench.

13. The device of claim 11, wherein the first series and the second series of vertical channel films in the first trench are staggered with respect to the first series and the second series of vertical channel films in the second trench, such that the third series of air gaps in the first trench are at least partly aligned with the first series of air gaps and the second series of air gaps in the second trench.

14. The device of claim 11, wherein the plurality of stacks define alternating even and odd trenches, the even trenches characterized by the first trench, and the odd trenches characterized by the second trench.

15. The device of claim 11, wherein the vertical channel films have upper ends with pads, and distal ends connected to an adjacent one of the vertical channel films to form current paths one of the upper ends of a one of the vertical channel films to another of the upper ends of the adjacent one of the vertical channel films.

16. The device of claim 15 further including, one or more patterned conductor layers over the plurality of stacks, including a bit line and a source line, and interlayer connectors connecting the bit line to a first pad over a first stack of the plurality of stacks, and connecting the source line to a second pad over a second stack of the plurality of stacks.

17. The device of claim 11 further including an insulating layer below the plurality of stacks, wherein the vertical channel films are connected above the insulating layer at the bottom of the plurality of stacks.

18. The device of claim 11, wherein the vertical channel films have thicknesses less than 10 nanometers.

19. The device of claim 11, wherein the vertical channel films are channels of respective NAND strings with NAND device word lines in respective stacks of conductive strips.

* * * * *